(12) United States Patent
Kim et al.

(10) Patent No.: US 12,289,973 B2
(45) Date of Patent: Apr. 29, 2025

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: Subin Kim, Paju-si (KR); Youngin Jang, Paju-si (KR); Kyungyun Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/052,833

(22) Filed: Nov. 4, 2022

(65) Prior Publication Data

US 2023/0209934 A1 Jun. 29, 2023

(30) Foreign Application Priority Data

Dec. 23, 2021 (KR) ........................ 10-2021-0186120

(51) Int. Cl.
*H10K 59/131* (2023.01)
*G09G 3/20* (2006.01)
(Continued)

(52) U.S. Cl.
CPC ......... *H10K 59/131* (2023.02); *G09G 3/2096* (2013.01); *G09G 3/3233* (2013.01);
(Continued)

(58) Field of Classification Search
CPC .. H10K 59/131; H10K 50/844; G09G 3/2096; G09G 3/3233; G09G 2300/026; G09G 2300/0426; G09G 2310/0286; G09G 2330/12; G09G 5/10; G09G 3/30; H01L 51/52; H01L 23/60; H01L 27/32; H01L 51/56; G06F 3/041
See application file for complete search history.

(56) References Cited

U.S. PATENT DOCUMENTS 11,227,843 B2 1/2022 Park et al.
2013/0050292 A1* 2/2013 Mizukoshi ........... G09G 3/3233
345/77
(Continued)

FOREIGN PATENT DOCUMENTS

CN 110518147 A 11/2019
EP 3419065 A1 12/2018
(Continued)

*Primary Examiner* — Michael A Faragalla
(74) *Attorney, Agent, or Firm* — Seed IP Law Group LLP

(57) ABSTRACT

A light emitting display apparatus includes a display portion including a plurality of pixel driving lines disposed over a substrate and a plurality of pixels selectively connected to the plurality of pixel driving lines, a light emitting device layer disposed at the display portion, a dam portion including at least one dam having a metal line, a plurality of switching circuit portions disposed to overlap the at least one dam and selectively connected to the plurality of pixel driving lines, and a front pad portion including a plurality of front pads electrically coupled to the plurality of pixel driving lines and the metal line of the at least one dam, each of the plurality of switching circuit portions includes first and second switching circuits each including a gate electrode electrically coupled to the metal line of the at least one dam.

25 Claims, 19 Drawing Sheets

(51) Int. Cl.
  *G09G 3/3233* (2016.01)
  *G09G 3/3275* (2016.01)
  *H10K 50/844* (2023.01)

(52) U.S. Cl.
  CPC ......... *G09G 3/3275* (2013.01); *H10K 50/844* (2023.02); *G09G 2300/026* (2013.01); *G09G 2300/0426* (2013.01); *G09G 2310/0286* (2013.01); *G09G 2330/12* (2013.01)

(56) References Cited

U.S. PATENT DOCUMENTS

| | | | |
|---|---|---|---|
| 2016/0098958 | A1 | 4/2016 | Kang |
| 2016/0180812 | A1* | 6/2016 | Choi ................. G06F 3/1446 |
| | | | 345/204 |
| 2017/0059897 | A1* | 3/2017 | Xu ........................ G09G 3/36 |
| 2020/0194534 | A1 | 6/2020 | Park et al. |
| 2020/0321292 | A1* | 10/2020 | Park ..................... H10K 59/38 |
| 2021/0036028 | A1* | 2/2021 | Kim .................... H01L 27/1225 |
| 2021/0202675 | A1 | 7/2021 | Jang et al. |
| 2021/0242283 | A1 | 8/2021 | Lee et al. |

FOREIGN PATENT DOCUMENTS

| | | |
|---|---|---|
| KR | 20160039735 A | 4/2016 |
| KR | 102028504 B1 | 10/2019 |
| KR | 102047830 B1 | 12/2019 |
| KR | 20200033028 A | 3/2020 |
| KR | 102104254 B1 | 4/2020 |
| KR | 20200118316 A | 10/2020 |
| KR | 102211928 B1 | 2/2021 |

\* cited by examiner

LIGHT EMITTING DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2021-0186120 filed on Dec. 23, 2021, which is hereby incorporated by reference as if fully set forth herein.

BACKGROUND

Technical Field

The present disclosure relates to a light emitting display apparatus and a multi-screen display apparatus including the same.

Description of the Related Art

Light emitting display apparatuses which are self-emitting light emitting display apparatuses, do not need a separate light source unlike liquid crystal display (LCD) apparatuses, and thus, they may be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation display apparatuses.

Light emitting display apparatuses display an image based on the light emission of a light emitting device layer including a light emitting device interposed between two electrodes. In this case, light emitted by the light emitting device is discharged to the outside through an electrode and a substrate.

Light emitting display apparatuses include a display panel which is implemented to display an image. The display panel may include a display portion which includes a plurality of pixels for displaying an image, and a bezel area which surrounds the display portion.

A light emitting display apparatus of the related art may need a bezel (or a mechanism) for occluding a bezel area disposed at an edge (or a periphery portion) of a display panel, and due to a width of the bezel area, a bezel width may increase.

Recently, multi-screen display apparatuses have been commercialized where a large screen is implemented by arranging the light emitting display apparatuses as a lattice type.

However, in a multi-screen display apparatus of the related art, a boundary portion such as a seam is formed between adjacent light emitting display apparatuses due to a bezel area or a bezel of each of a plurality of light emitting display apparatuses. The boundary portion may cause a sense of disconnection (or discontinuity) of an image when one image is being displayed on a total screen of the multi-screen display apparatus, and due to this, the immersion of a viewer watching the image may be reduced.

BRIEF SUMMARY

Accordingly, the present disclosure is directed to providing a light emitting display apparatus and a multi-screen display apparatus including the same that substantially obviate one or more problems due to limitations and disadvantages of the related art.

An aspect of the present disclosure is directed to providing a light emitting display apparatus having a zero-bezel width and a multi-screen display apparatus including the same.

An aspect of the present disclosure is directed to providing a light emitting display apparatus and a multi-screen display apparatus including the same, which may have a zero-bezel width and may minimize or reduce a reduction in reliability of a self-emitting device caused by the penetration of water (or moisture).

Another aspect of the present disclosure is directed to providing a light emitting display apparatus and a multi-screen display apparatus including the same, which may detect an electrical short circuit between routing lines connecting front pads to rear pads.

Another aspect of the present disclosure is directed to providing a light emitting display apparatus and a multi-screen display apparatus including the same, which may minimize or reduce a reduction in image quality caused by a resistance deviation between routing lines connecting front pads to rear pads.

Another aspect of the present disclosure is directed to providing a light emitting display apparatus and a multi-screen display apparatus including the same, which may have a zero-bezel width and may protect a pixel circuit from static electricity.

The technical benefits of the present disclosure are not limited to the aforesaid, but other technical benefits not described herein will be clearly understood by those skilled in the art from descriptions below.

Additional features and aspects will be set forth in part in the description that follows, and in part will become apparent from the description, or may be learned by practice of the disclosed concepts provided herein. Other features and aspects of the disclosed concepts may be realized and attained by the structure particularly pointed out in the written description, or derivable therefrom, and the claims hereof as well as the appended drawings.

To achieve these and other aspects of the disclosed concepts, as embodied and broadly described herein, a light emitting display apparatus comprises a substrate; a display portion including a plurality of pixel driving lines disposed over the substrate and a plurality of pixels connected to the plurality of pixel driving lines; a light emitting device layer including a self-emitting device disposed at the display portion; a dam portion disposed along a periphery portion of the substrate, the dam portion including at least one dam including a metal line; an encapsulation layer disposed to cover the light emitting device layer, the encapsulation layer including an organic encapsulation layer surrounded on at least four sides by the dam portion; a plurality of switching circuit portions disposed to overlap the at least one dam and connected to the plurality of pixel driving lines; and a front pad portion including a plurality of front pads disposed at the periphery portion of the substrate and electrically coupled to the plurality of pixel driving lines and the metal line of the at least one dam, each of the plurality of switching circuit portions comprises first and second switching circuits each including a gate electrode electrically coupled to the metal line of the at least one dam.

In another aspect of the present disclosure, a multi-screen display apparatus comprises a plurality of display apparatuses disposed along at least one direction of a first direction and a second direction crossing the first direction, each of the plurality of display apparatuses includes a light emitting display apparatus, the light emitting display apparatus comprises a substrate; a display portion including a plurality of pixel driving lines disposed over the substrate and a plurality of pixels connected to the plurality of pixel driving lines; a light emitting device layer including a self-emitting device disposed at the display portion; a dam portion disposed along a periphery portion of the substrate, the dam portion including at least one dam including a metal line; an encapsulation layer disposed to cover the light emitting device layer, the encapsulation layer including an organic encapsulation layer surrounded by the dam portion on at least four sides; a plurality of switching circuit portions disposed to overlap the at least one dam and connected to the plurality of pixel driving lines; and a front pad portion including a plurality of front pads disposed at the periphery portion of the substrate and electrically coupled to the plurality of pixel driving lines and the metal line of the at least one dam, each of the plurality of switching circuit portions comprises first and second switching circuits each including a gate electrode electrically coupled to the metal line of the at least one dam.

In another aspect of the present disclosure, a light emitting display apparatus includes a display portion including a plurality of pixel driving lines disposed over a substrate and a plurality of pixels connected to the plurality of pixel driving lines, a light emitting device layer disposed at the display portion, a dam portion including at least one dam having a metal line, a plurality of switching circuit portions disposed to overlap the at least one dam and connected to the plurality of pixel driving lines, and a front pad portion including a plurality of front pads electrically coupled to the plurality of pixel driving lines and the metal line of the at least one dam, each of the plurality of switching circuit portions includes first and second switching circuits each including a gate electrode electrically coupled to the metal line of the at least one dam.

Specific details according to various examples of the present specification other than the means for solving the above-mentioned problems are included in the description and drawings below.

According to an embodiment of the present disclosure, a light emitting display apparatus and a multi-screen display apparatus including the same, which have a zero-bezel width, may be provided.

According to an embodiment of the present disclosure, a light emitting display apparatus and a multi-screen display apparatus including the same, which may have a zero-bezel width and may minimize or reduce a reduction in reliability of a self-emitting device caused by the penetration of water (or moisture), may be provided.

According to an embodiment of the present disclosure, a light emitting display apparatus and a multi-screen display apparatus including the same, which may detect electrical short circuit between routing lines connecting front pads to rear pads, may be provided.

According to an embodiment of the present disclosure, a light emitting display apparatus and a multi-screen display apparatus including the same, which may minimize or reduce a reduction in image quality caused by a resistance deviation between routing lines connecting front pads to rear pads, may be provided.

According to an embodiment of the present disclosure, a light emitting display apparatus and a multi-screen display apparatus including the same, which may have a zero-bezel width and may protect a pixel circuit from static electricity, may be provided.

According to an embodiment of the present disclosure, a multi-screen display apparatus which display an image without a sense of discontinuity, may be provided.

It is to be understood that both the foregoing general description and the following detailed description of the present disclosure are examples and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
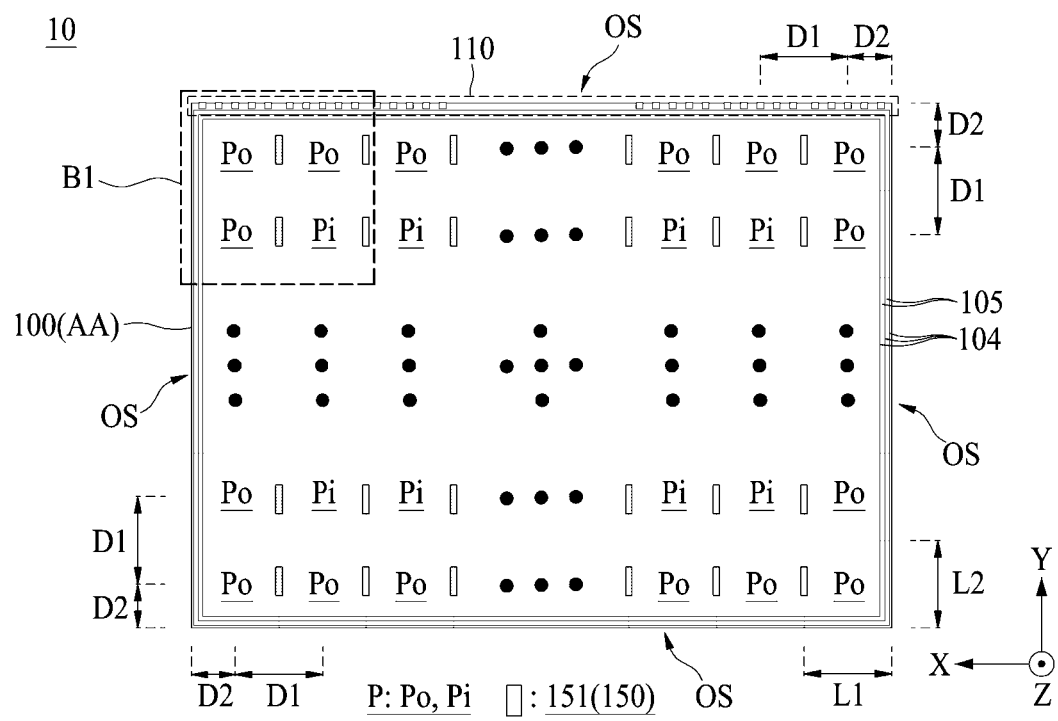
FIG. 1 is a plan view illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the technical concept, the detailed description thereof will be omitted. The sequence of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely distinguishing the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, or may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam, this may be construed as the encapsulation layer at least partially surrounding the dam. However, in some embodiments, the encapsulation layer may entirely surround the dam. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings. In addition, in adding reference numerals to elements of each of the drawings, although the same elements are illustrated in other drawings, like reference numerals may refer to like elements.

Figure 2:
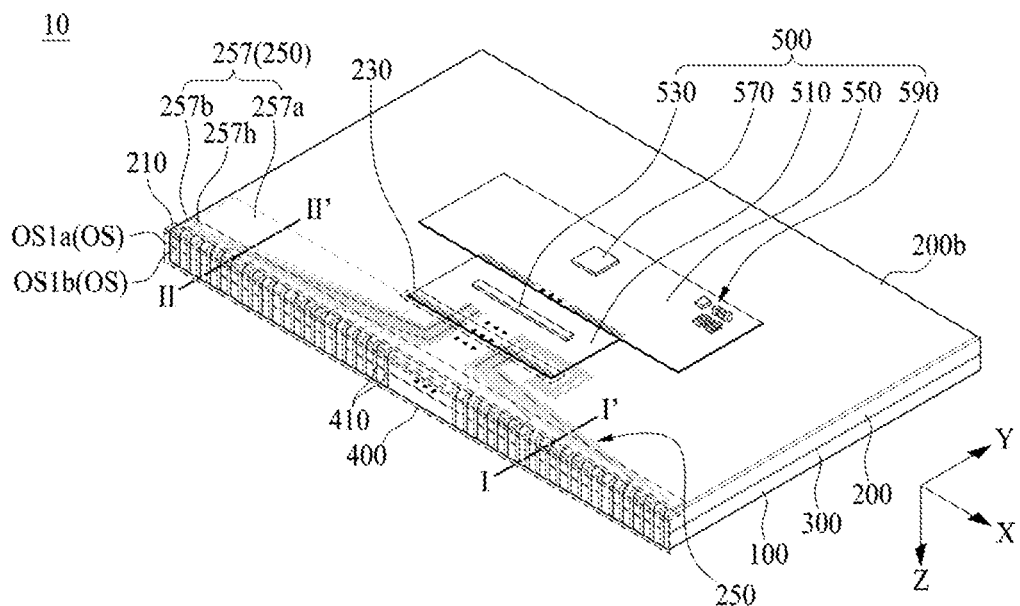
FIG. 2 is a rear perspective view illustrating a light emitting display apparatus according to an embodiment of the present disclosure.

FIG. 1 is a plan view illustrating a light emitting display apparatus 10 according to an embodiment of the present disclosure, and FIG. 2 is a perspective view illustrating a rear surface of the light emitting display apparatus 10 according to an embodiment of the present disclosure.

Referring to FIGS. 1 and 2, the light emitting display apparatus (or a light emitting display panel) 10 according to an embodiment of the present disclosure may include a substrate 100, a line substrate 200, a coupling member 300, and a routing portion 400.

The substrate 100 may be referred to as a first substrate, a front substrate, a base substrate, or a pixel array substrate. The substrate 100 may be a glass substrate, or may be a thin glass substrate or a plastic substrate, which is bendable or flexible.

The substrate 100 may include a display portion AA, a plurality of pixels P, a dam portion 104, and a plurality of switching circuit portions.

The display portion AA of the substrate 100 may be an area which displays an image and may be referred to as an active portion, an active area, or a display area. A size of the display portion AA may be the same as or substantially the same as the substrate 100 (or the light emitting display apparatus or the display panel). For example, a size of the display portion AA may be the same as a total size of a first surface of the substrate 100. The first surface may be a front surface of the substrate 100. Therefore, the display portion AA may be implemented (or disposed) on a whole front surface of the substrate 100, and thus, a whole front surface of the light emitting display apparatus may implement the display portion AA.

An end portion (or an outermost portion) of the display portion AA may overlap or may be aligned with an outer surface OS of the substrate 100. For example, with respect to a thickness direction Z of the light emitting display apparatus (or a light emitting display panel), a lateral surface (or an end line) of the display portion AA may be aligned at a vertical extension line vertically extending from the outer surface OS of the substrate 100. The lateral surface of the display portion AA may be surrounded only by air without being surrounded by a separate mechanism. That is, the display portion AA or all lateral surfaces (or the outer surface) of the substrate 100 may be provided in a structure which directly contacts air without being surrounded by a separate mechanism. Therefore, the outer surface OS of the substrate 100 corresponding to the end portion of the display portion AA may be surrounded by only air (or abutting ambient air), and thus, the light emitting display apparatus (or the light emitting display panel) according to an embodiment of the present disclosure may have an air-bezel structure or a non-bezel structure (or a zeroized bezel or no bezel) where the end portion (or lateral surface) of the display portion AA is surrounded by air (or abutting ambient air).

The plurality of pixels P may be arranged (or disposed) over the display portion AA of the substrate 100 to have the first interval D1 along each of a first direction X and a second direction Y. The first direction X may traverse (or intersect or cross) the second direction Y. The first direction X may be a widthwise direction, a horizontal direction, or a first length direction (for example, a widthwise length direction) of the substrate 100 or the light emitting display apparatus. The second direction Y may be a lengthwise direction, a vertical direction, or a second length direction (for example, a lengthwise length direction) of the substrate 100 or the light emitting display apparatus.

Each of the plurality of pixels P may be implemented at a plurality of pixel areas disposed on the display portion AA of the substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels P (or pixel areas) may all have the same size.

Two pixels P adjacent to each other along each of the first direction X and the second direction Y may have the same first interval D1 without an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P may include a circuit layer including a pixel circuit implemented in the pixel area of the substrate 100, and a light emitting device layer disposed at the circuit layer and coupled to the pixel circuit. The pixel circuit may be connected to pixel driving lines which include a data line, a gate line, and a reference line disposed in the pixel area, and may output a data current corresponding to a difference voltage between a data signal supplied to the data line and a reference voltage supplied to the reference voltage line in response to a scan signal supplied to the gate line. The plurality of pixels P may be selectively connected to the plurality of pixel driving lines. The light emitting device layer may include a self-emitting device (or a self-emitting layer) which is commonly disposed over the remaining display portion AA except for a periphery portion of the display portion AA. The light emitting device layer may be configured to emit light by the data current supplied from the pixel circuit. The pixel driving lines, the pixel circuit, and the light emitting device layer will be described below.

The plurality of pixels P may be divided (or classified) into outermost pixels Po and internal pixels (or inner pixels) Pi.

The outermost pixels Po may be pixels disposed closest to the outer surface OS of the substrate 100 of the plurality of pixels P. For example, the outermost pixels Po may be pixels which are arranged in each of a first horizontal line (or a first pixel row), a last horizontal line (or a last pixel row), a first vertical line (or a first pixel column), and a last vertical line (or a last pixel column).

A second interval D2 between a center portion of each of the outermost pixels Po and the outer surface OS of the substrate 100 may be half or less than half of the first interval D1. For example, the second interval D2 may be a shortest distance (or a shortest length) between a center portion of the outermost pixel Po area and the outer surface OS of the substrate 100.

When the second interval D2 is greater than half of the first interval D1, the substrate 100 may have a greater size than the display portion AA by a difference area between half of the first interval D1 and the second interval D2, and thus, an area between the end of the outermost pixel Po and the outer surface OS of the substrate 100 may be configured as a non-display portion surrounding a whole display portion AA. For example, when the second interval D2 is greater than half of the first interval D1, the substrate 100 inevitably includes a bezel area based on a non-display portion surrounding the whole display portion AA. On the other hand, when the second interval D2 is half or less than half of the first interval D1, the end of each of the outermost pixels Po may be aligned with (or disposed at) the outer surface OS of the substrate 100, or the end portion of the display portion AA may be aligned with (or disposed at) the outer surface OS of the substrate 100, and thus, the display portion AA may be implemented (or disposed) at the whole front surface of the substrate 100.

The internal pixels Pi may be the remaining pixels other than the outermost pixels Po among the plurality of pixels P, or may be pixels surrounded by the outermost pixels Po among the plurality of pixels P. The internal pixels (or second pixels) Pi may be implemented to have a configuration or a structure, which differs from the outermost pixels (or first pixels) Po.

The dam portion 104 may be implemented at periphery portions of the outermost pixels Po which are implemented at a periphery portion of the substrate 100 or are arranged in the display portion AA. For example, the dam portion 104 may be disposed in the display portion AA to one-dimensionally have a closed loop line shape (or a continuous line shape or a closed loop shape) along a region between a center portion of the outermost pixels Po and the outer surface OS of the substrate 100. For example, the closed loop line shape may be a ring shape which is continuously connected.

The dam portion 104 may be configured to prevent the spread or overflow of an organic encapsulation layer of an encapsulation layer, disposed on the light emitting device layer, at the periphery portions of the outermost pixels Po. Also, the dam portion 104 may isolate (or disconnect or separate) at least some layers of the light emitting device layer at the periphery portions of the outermost pixels Po, and thus, may block a lateral water penetration path, thereby preventing or minimizing a reduction in reliability of the light emitting device layer caused by lateral water penetration.

The dam portion 104 may include an undercut structure or an eaves structure for isolating (or disconnecting or separating) at least some layers of the light emitting device layer. For example, the dam portion 104 may include an undercut region which is implemented by the undercut structure or an eaves structure. Therefore, at least a portion of the light emitting device layer may be physically isolated (or disconnected or separated) by the undercut region of the dam portion 104. For example, a self-emitting device (or a self-emitting layer) of the light emitting device layer formed over the dam portion 104 may be isolated (or disconnected or separated) at least once in the undercut region of the dam portion 104.

Each of the plurality of switching circuit portions may be selectively configured to overlap the dam portion 104 and selectively connected to the plurality of pixel driving lines. For example, each of the plurality of switching circuit portions may be disposed under (or below) the dam portion 104. For example, the dam portion 104 may be disposed over the plurality of switching circuit portions. Each of the plurality of switching circuit portions may be disposed (or included) in (or inside) the outermost pixels Po disposed at a first periphery portion of the substrate 100. For example, one switching circuit portion may be disposed in (or inside) each of one outermost pixel Po. The plurality of switching circuit portions will be described below.

The light emitting display apparatus (or the light emitting display panel) 10 or the substrate 100 according to an embodiment of the present disclosure may further include a first pad portion 110.

The first pad portion 110 may be a front pad portion or a first routing pad. The first pad portion 110 may be disposed (or included) in outermost pixels Po disposed at the first periphery portion (or one periphery portion) of a first surface of the substrate 100 parallel to the first direction X, and thus, may not include a non-display portion (or a bezel area) based on the first pad portion 110.

The first pad portion 110 may include a plurality of first pads (or front pads) connected (or coupled) to pixel driving lines. For example, the first pad portion 110 may include a plurality of first pads (or front pads) for receiving a data signal, a gate control signal, a pixel driving power, a reference voltage, and a pixel common voltage or the like from a driving circuit part 500. The plurality of first pads may be disposed at one periphery portion of the substrate 100 and electrically coupled to the plurality of pixel driving lines and the metal line of at least one dam included in the dam portion 104. Each of the outermost pixels Po disposed at the first periphery portion of the substrate 100 to include the first pad portion 110 may include at least one of the plurality of first pads. Thus, the outermost pixels Po may include at least one first pad, and thus, may be implemented to have a configuration or a structure which differs from an inner pixel Pi including no first pad.

For example, when the first pad portion 110 is not disposed (or included) in (or inside) the outermost pixels Po and is disposed between ends of the outermost pixels Po and the outer surface OS of the substrate 100, the substrate 100 may include a non-display portion where the first pad portion 110 is disposed between ends of the outermost pixels Po and the outer surface OS of the substrate 100, and due to the non-display portion, the second interval D2 may be greater than half of the first interval D1, the whole substrate 100 may not be implemented as the display portion AA, and a separate bezel for covering the non-display portion may be needed. On the other hand, the first pad portion 110 according to an embodiment of the present disclosure may be disposed (or included) in (or inside) the outermost pixels Po, and thus, because a non-display portion (or a bezel area) caused by the first pad portion 110 is not formed or provided between the ends of the outermost pixels Po and the outer surface OS of the substrate 100, the second interval D2 may be less than or equal to half of the first interval D1, whereby all of the substrate 100 may be implemented as the display portion AA.

The light emitting display apparatus (or a light emitting display panel) 10 or the substrate 100 according to an embodiment of the present disclosure may further include a gate driving circuit 150.

The gate driving circuit 150 may be disposed or embedded within the display portion AA to supply a scan signal (or a gate signal) to the pixels P disposed on the substrate 100. The gate driving circuit 150 may simultaneously supply the scan signal to pixels P disposed in a horizontal line parallel to the first direction X. For example, the gate driving circuit 150 may be configured to supply at least one scan signal to pixels P disposed in one horizontal line through at least one gate line.

The gate driving circuit 150 may be implemented with a shift register including a plurality of stage circuits. That is, the light emitting display apparatus (or a light emitting display panel) 10 according to an embodiment of the present disclosure may include a shift register which is embedded (or built-in) in the display portion AA of the substrate 100 to supply the scan signal to the pixels P.

Each of the plurality of stage circuits may include a plurality of branch circuits 151 which are arranged spaced apart from one another in each horizontal line of the substrate 100 along the first direction X. Each of the plurality of stage circuits may be disposed to be dispersed (or spaced apart from one another) between a plurality of pixels P within each horizontal line. Each of the plurality of branch circuits 151 may include at least one thin film transistor (TFT) (or branch TFT). For example, each of the plurality of branch circuits 151 may be disposed one by one between at least one pair of adjacent pixels (or pixel areas) of the plurality of pixels P (or a pixel area) within one horizontal line. Each of the plurality of stage circuits may generate a scan signal through driving of the plurality of branch circuits 151 based on a gate control signal supplied through gate control lines and may supply the scan signal to pixels P disposed within a corresponding horizontal line.

The light emitting display apparatus (or the light emitting display panel) 10 or the substrate 100 according to an embodiment of the present disclosure may further include at least one separation portion 105.

The at least one separation portion 105 may be implemented at a periphery portion of the substrate 100 or implemented at a periphery portion of the outermost pixel Po disposed in the display portion AA. For example, the at least one separation portion 105 may be disposed within the display portion AA to one-dimensionally have a closed loop line shape (or a continuous line shape or a closed loop shape) along a near region of the dam portion 104. Thus, the outermost pixels Po may be configured to include at least one separation portion 105, and thus, the outermost pixels Po may be implemented to have a configuration or a structure, which differs from the internal pixels Pi.

The at least one separation portion 105 may isolate (or disconnect or separate) at least some layers of the light emitting device layer within the outermost pixels Po, and thus, may block a lateral water penetration path, thereby preventing or minimizing a reduction in reliability of the light emitting device layer caused by lateral water penetration. The at least one separation portion 105 may include an undercut structure or an eaves structure for isolating (or disconnecting or separating) at least some layers of the light emitting device layer. For example, the at least one separation portion 105 may include an undercut region which is implemented by the undercut structure or an eaves structure. Therefore, at least a portion of the light emitting device layer may be physically isolated (or disconnected or separated) by the undercut region of the at least one separation portion 105. For example, the self-emitting device (or the self-emitting layer) of the light emitting device layer formed over the at least one separation portion 105 may be isolated (or disconnected or separated) at least once in the undercut region of the at least one separation portion 105.

The line substrate 200 may be referred to as a second substrate, a link substrate, a lower substrate, a rear substrate, a wiring substrate, or link glass. The line substrate 200 may be a glass substrate, or may be a thin glass substrate or a plastic substrate, which is bendable or flexible. For example, the line substrate 200 may include the same material as the substrate 100. A size of the line substrate 200 may be the same as or substantially the same as a size of the substrate 100, but embodiments of the present disclosure are not limited thereto, the size of the line substrate 200 may be smaller than the size of the substrate 100. For example, the line substrate 200 may be configured to have the same size as the substrate 100 in order to maintain or secure the stiffness of the substrate 100.

The line substrate 200 may include a second pad portion 210, at least one third pad portion 230, and a link line portion 250.

The second pad portion 210 may be a rear pad portion or a second routing pad. The second pad portion 210 may be disposed at one periphery portion (or a first rear periphery portion) of a rear surface 200b of the line substrate 200 overlapping the first pad portion 110 disposed at the front surface of the substrate 100.

The second pad portion 210 may include a plurality of second pads (or rear pad) which are disposed in parallel with each other at a first periphery portion of the line substrate 200 along the first direction X. For example, the second pad portion 210 may include a plurality of second pads (or rear pads) to receive a data signal, a gate control signal, a pixel driving power, a reference voltage, and a pixel common voltage, or the like from the driving circuit part 500. The second pads may individually (or in a one-to-one relationship) overlap each of the plurality of first pads disposed at the first pad portion 110. In other words, each of the plurality of second pads may overlap a respective one of the plurality of first pads.

The at least one third pad portion 230 may be an input pad portion, a driving circuit connection pad portion, a driving circuit bonding portion, or a driving circuit bonding pad portion. The at least one third pad portion 230 may be disposed at the rear surface 200b of the line substrate 200. For example, the at least one third pad portion 230 may be disposed at a middle portion adjacent to the first periphery portion of the rear surface 200b of the line substrate 200. For example, the line substrate 200 may include two or more third pad portions 230 connected to the second pad portion 210. For example, the second pad portion 210 may be divided into two or more regions along the first direction X, and each of the two or more third pad portions 230 may be configured to be connected to a corresponding division region of the second pad portion 210.

The at least one third pad portion 230 may include a plurality of input pads (or third pads) which are spaced apart from one another by a certain interval along the first direction X. For example, the at least one third pad portion 230 may include a plurality of input pads (or third pads) to receive a data signal, a gate control signal, a pixel driving power, a reference voltage, and a pixel common voltage, or the like from the driving circuit part 500.

The link line portion 250 may be disposed between the second pad portion 210 and the at least one third pad portion 230. The link line portion 250 may include a plurality of link lines which are configured to connect the plurality of second pads of the second pad portion 210 to the plurality of input pads disposed at the at least one third pad portion 230.

Some of a plurality of input pads disposed at the at least one third pad portion 230 may be individually (or in a one-to-one relationship) connected to some of a plurality of second pads, disposed at the second pad portion 210, through a corresponding link line of the plurality of link lines. In other words, some of the plurality of input pads may be connected to respective ones of the plurality of second pads through corresponding link lines. For example, input pads respectively receiving the data signal, the gate control signal, the pixel driving power, and the reference voltage from the driving circuit part 500 among the plurality of input pads may be individually (or in a one-to-one relationship) connected to a corresponding second pad, disposed at the second pad portion 210, through a corresponding link line.

The other of the plurality of input pads disposed at the at least one third pad portion 230 may be coupled to the other of the plurality of second pads in common. For example, one or more pixel common voltage input pads receiving a pixel common voltage among the plurality of input pads may be coupled to second pads, receiving the pixel common voltage, of the plurality of second pads through a pixel common power link line 257.

The pixel common power link line 257 may include a first common link line 257a and a second common link line 257b.

The first common link line 257a may be commonly coupled to one or more pixel common voltage input pad disposed at the at least one third pad portion 230. For example, the first common link line 257a may be disposed at one side of the third pad portion 230 at the rear surface 200b of the line substrate 200.

The first common link line 257a may be disposed or formed over the rear surface 200b of the line substrate 200 between the second pad portion 210 and the at least one third pad portion 230 to have a relatively wide size (or area) so that the voltage drop of the pixel common voltage applied thereto is reduced or minimized. A size of the first common link line 257a according to an embodiment of the present disclosure may progressively increase in a direction from one side portion thereof to the other side portion thereof. For example, a size of the first common link line 257a may progressively increase in a direction from the at least one third pad portion 230 to the outer surface OS of the line substrate 200.

The second common link line 257b may be disposed at the first periphery portion of the rear surface 200b of the line substrate 200 to be adjacent to the second pad portion 210. The second common link line 257b according to an embodiment may be disposed in parallel with the first direction X to face all the plurality of second pads disposed at the second pad portion 210. For example, the second common link line 257b may have a bar shape having a relatively wide size (or area), for reducing or minimizing the voltage drop of the pixel common voltage applied to the pixel common power link line 257.

The second common link line 257b may be electrically connected to at least a portion of the other side of the first common link line 257a through a link contact hole 257h. The second common link line 257b may extend (or protrude) toward the plurality of pixel common voltage pads disposed at the second pad portion 210 and may be electrically connected to each of the plurality of pixel common voltage pads.

The coupling member 300 may be interposed between the substrate 100 and the line substrate 200. The substrate 100 and the line substrate 200 may be opposite-bonded to each other by the coupling member 300. The coupling member 300 may be a transparent adhesive member including an optically clear adhesive (OCA) or an optically clear resin (OCR), or a double-sided tape, but embodiments of the present disclosure are not limited thereto. For example, the coupling member 300 may include a glass fiber.

Alternatively, the line substrate 200 may be omitted. In this case, the second pad portion 210, the at least one third pad portion 230, and the link line portion 250 may be disposed at a rear surface of the substrate 100, and thus, their repetitive descriptions are omitted. Therefore, when the line substrate 200 is omitted, the coupling member 300 may be omitted.

The routing portion 400 may be referred to as a side line portion, an edge line portion, a side routing portion, an edge routing portion, a printing line portion, a side printing line portion, or a side wiring portion, or the like. The routing portion 400 may be disposed to surround the outer surface OS of the substrate 100 and the outer surface OS of the line substrate 200. The routing portion 400 according to an embodiment may include a plurality of routing lines 410 which are disposed at each of a first outer surface (or one surface) OS1a among the outer surface OS of the substrate 100 and a first outer surface (or one surface) OS1b among the outer surface OS of the line substrate 200.

Alternatively, when the line substrate 200 is omitted, each of the plurality of routing lines 410 may be formed to surround a first outer surface (or one surface) OS1a of the outer surface OS of the substrate 100 and may individually (or in a one-to-one relationship) connect the first pads of the first pad portion 110 to the second pads of the second pad portion 210. In other words, each of the plurality of routing lines 410 may connect a respective one of the first pads to a respective one of the second pads.

The light emitting display apparatus according to an embodiment of the present disclosure may further include a driving circuit part 500.

The driving circuit part 500 may drive (or emit light) the pixels P disposed on the substrate 100 (e.g., cause the pixels P to emit light) based on digital image data and a timing synchronization signal supplied from a display driving system to allow the display portion AA to display an image corresponding to the digital image data. The driving circuit part 500 may be connected (or coupled) to the at least one third pad portion 230 disposed at the rear surface 200b of the line substrate 200 and may output, to the at least one third pad portion 230, a data signal, a gate control signal, and a driving power for driving (or emitting light) the pixels P disposed on the substrate 100 (e.g., for causing the pixels P to emit light).

The driving circuit part 500 according to an embodiment of the present disclosure may include a flexible circuit film 510, a driving integrated circuit (IC) 530, a printed circuit board (PCB) 550, a timing controller 570, and a power circuit part 590.

The flexible circuit film 510 may be connected to the at least one third pad portion 230 disposed at the rear surface 200b of the line substrate 200.

The driving IC 530 may be mounted on the flexible circuit film 510. The driving IC 530 may receive subpixel data and a data control signal provided from the timing controller 570, convert the subpixel data into an analog data signal based on the data control signal, and output the analog data signal.

The driving IC 530 may sense a characteristic value of a driving TFT disposed in a subpixel SP through each of the plurality of reference voltage lines (or pixel sensing lines) disposed at the substrate 100 during a predetermined or selected external sensing period, generate sensing raw data corresponding to a sensing value for each subpixel, and provide the sensing raw data for each subpixel to the timing controller 570.

Also, the driving IC 530 may sense (or receive) a test signal through each of the plurality of reference voltage lines (or pixel sensing lines) in a test mode, generate line-based line sensing data corresponding to a sensing value (or a reception value), and provide the line sensing data to the timing controller 570.

Moreover, the driving IC 530 may sense a line resistance of at least some of the plurality of routing lines 410 through the plurality of switching circuit portions during the test mode or may sense a line resistance of each of the plurality of routing lines 410 and may generate line-based resistance sensing data corresponding to the sensed line resistance, and may provide the resistance sensing data to the timing controller 570. For example, the driving IC 530 may sense a line resistance of each of the plurality of data routing lines respectively connected to the plurality of data lines, generate resistance sensing data corresponding to the sensed line resistance of the data routing line, and provide the resistance sensing data to the timing controller 570.

According to an embodiment of the present disclosure, the driving IC 530 may output a data signal in which a line-based resistance compensation value provided from the timing controller 570 is reflected, thereby preventing or minimizing an image quality defect caused by a resistance deviation between the plurality of data routing lines.

According to another embodiment of the present disclosure, the driving IC 530 may include a plurality of signal output circuits which output data signals. A current option value (or an output current option value) of each of the plurality of signal output circuits may be set (or vary) based on a line-based resistance compensation value (or a bias voltage level) provided from the timing controller 570, and thus, the driving IC 530 may output a data signal in which the line-based resistance compensation value provided from the timing controller 570 is reflected.

The PCB 550 may be coupled to the other side periphery portion of the flexible circuit film 510. The PCB 550 may transfer a signal and power between elements of the driving circuit part 500.

The timing controller 570 may be mounted on the PCB 550 and may receive the digital image data and the timing synchronization signal provided from the display driving system through a user connector disposed at the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital image data based on the timing synchronization signal to generate pixel data matching a pixel arrangement structure disposed in the display portion AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal.

The timing controller 570 may drive each of the driving IC 530 and the gate driving circuit 150 based on an external sensing mode during a predetermined or selected external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel.

The timing controller 570 may drive each of the driving IC 530 and the plurality of switching circuit portions in the test mode, determine whether there is a short circuit or not of the routing line and a short circuit defect position based on the line-based line sensing data provided from the driving IC 530, and display a determination result by using a separate monitor.

The timing controller 570 may drive each of the driving IC 530 and the plurality of switching circuit portions in the test mode and may modulate subpixel-based pixel data based on the line-based resistance sensing data provided from the driving IC 530 or may set (or vary) a current option value (or an output current option value or a slew rate) of the driving IC 530, thereby preventing or minimizing an image quality defect caused by a resistance deviation between the plurality of data routing lines. For example, the timing controller 570 may generate the line-based resistance compensation value for compensating for a resistance deviation between the plurality of data routing lines based on the line-based resistance sensing data provided from the driving IC 530 and may provide the line-based resistance compensation value to the driving IC 530. For example, the line-based resistance compensation value may be stored in a storage circuit in a look-up table form.

The power circuit part 590 may be mounted on the PCB 550 and may generate various source voltages needed for displaying an image on the pixels P by using an input power supplied from the outside to provide the generated source voltage to a corresponding circuit.

Figure 3A:
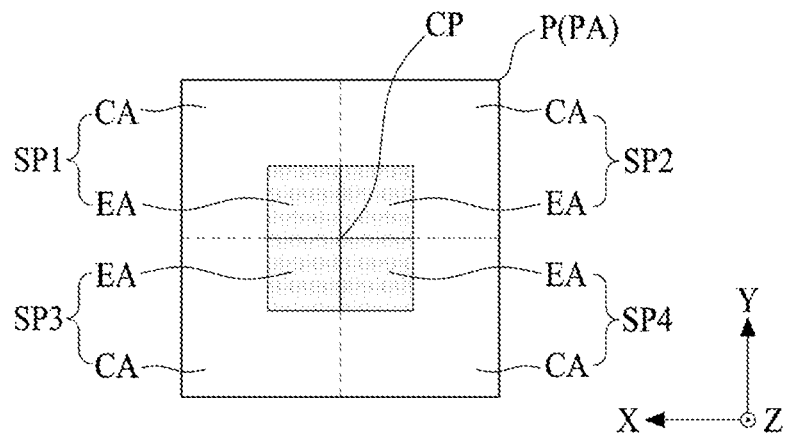
FIG. 3A is a diagram illustrating one pixel according to an embodiment of the present disclosure illustrated in FIG. 1.
Figure 3B:
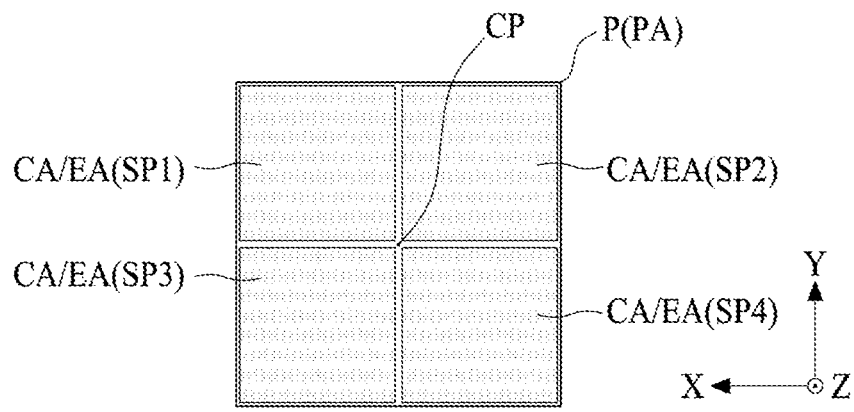
FIG. 3B is a diagram illustrating one pixel according to another embodiment of the present disclosure illustrated in FIG. 1.
Figure 3C:
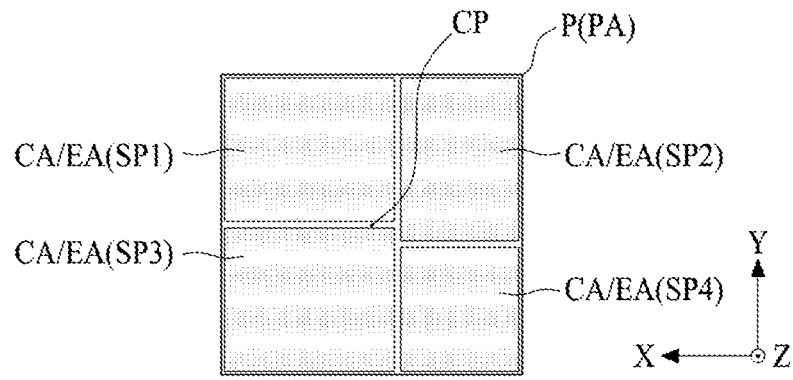
FIG. 3C is a diagram illustrating one pixel according to another embodiment of the present disclosure illustrated in FIG. 1.

FIG. 3A is a diagram illustrating one pixel according to an embodiment of the present disclosure illustrated in FIG. 1, FIG. 3B is a diagram illustrating one pixel according to another embodiment of the present disclosure illustrated in FIG. 1, and FIG. 3C is a diagram illustrating one pixel according to another embodiment of the present disclosure illustrated in FIG. 1.

Referring to FIGS. 1 and 3A, the one pixel (or a unit pixel) P according to an embodiment of the present disclosure may include a plurality of subpixels SP1 to SP4 which are disposed at a pixel area PA. For example, the one pixel (or a unit pixel) P may be configured to include first to fourth subpixels SP1 to SP4 which are disposed at the pixel area PA.

The plurality of subpixels or the first to fourth subpixels SP1 to SP4 may be disposed in a 2×2 form or a quad form. The first to fourth subpixels SP1 to SP4 may each include an emission area EA and a circuit area CA. For example, the emission area EA may be referred to as an opening area, an opening portion, or an emission portion.

The emission area EA of each of the first to fourth subpixels SP1 to SP4 may have a uniform quad structure to have a square shape having the same size (or same area) to each other. According to an embodiment, the emission area EA having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, the emission area EA having a uniform quad structure may be disposed at the center portion CP of the corresponding subpixel area to have a size which is less than each of four equal division regions of the pixel P.

The circuit area CA of each of the first to fourth subpixels SP1 to SP4 may be disposed around (or near) a corresponding emission area EA. The circuit area CA may include a pixel circuit and pixel driving lines for driving a corresponding subpixel, e.g. for causing the subpixel to emit light. For example, the circuit area CA may be referred to as a non-emission area, a non-opening area, a non-emission portion, a non-opening portion, or a periphery portion.

Referring to FIGS. 1 and 3B, the emission area EA of each of the first to fourth subpixels SP1 to SP4 according to another embodiment of the present disclosure may extend to the circuit area CA to overlap some or all of the circuit area CA. That is, in order to increase an aperture ratio of the subpixels SP1 to SP4 corresponding to sizes of the emission area EA or decrease the pixel pitch D1 as a resolution of the pixel P is higher, the emission area EA of each of the first to fourth subpixels SP1 to SP4 may extend to the circuit area CA to overlap some or all of the circuit area CA. For example, since the emission area EA of each of the first to fourth subpixels SP1 to SP4 has a top emission structure, the emission area EA may be disposed to overlap the corresponding circuit area. Thus, the emission area EA may have a size which is equal to or greater than the circuit area CA.

Referring to FIGS. 1 and 3C, each of the first to fourth subpixels SP1 to SP4 according to another embodiment may have a non-uniform quad structure having different sizes. For example, the emission area EA of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality, or the like. When the emission area EA has a non-uniform quad structure, among the emission area EA of each of the first to fourth subpixels SP1 to SP4, the emission area EA of the fourth subpixel SP4 may have a smallest size (or area), and the emission area EA of the third subpixel SP3 may have a largest size. The emission area EA of each of the first to fourth subpixels SP1 to SP4 may extend to the circuit area CA to overlap some or all of the circuit area CA. For example, since the emission area EA of each of the first to fourth subpixels SP1 to SP4 has a top emission structure, the emission area EA may be arranged to overlap the corresponding circuit area CA. Thus, the emission area EA may have a size which is equal to or greater than the circuit area CA.

In FIGS. 3A to 3C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. According to an embodiment of the present disclosure, the first color may be red, the second color may be blue, the third color may be white, and the fourth color may be green. According to another embodiment of the present disclosure, some of the first to fourth colors may be the same. For example, the first color may be red, the second color may be first green, the third color may be second green, and the fourth color may be blue, but embodiments of the present disclosure are not limited thereto.

Alternatively, each of the first to fourth subpixels SP1 to SP4 according to another embodiment of the present disclosure may have a 1×4 form, a uniform stripe structure, or a non-uniform stripe structure. For example, the emission area EA of each of the first to fourth subpixels SP1 to SP4 may have the 1×4 form, the uniform stripe structure, or the non-uniform stripe structure. For example, the emission area EA of each of the first to fourth subpixels SP1 to SP4 having the uniform stripe structure may each have a rectangular shape which includes a short side parallel to the first direction X and a long side parallel to the second direction Y. Optionally, a white subpixel implemented to emit white light of the first to fourth subpixels SP1 to SP4 having the 1×4 form, the uniform stripe structure, or the non-uniform stripe structure may be omitted.

Figure 4:
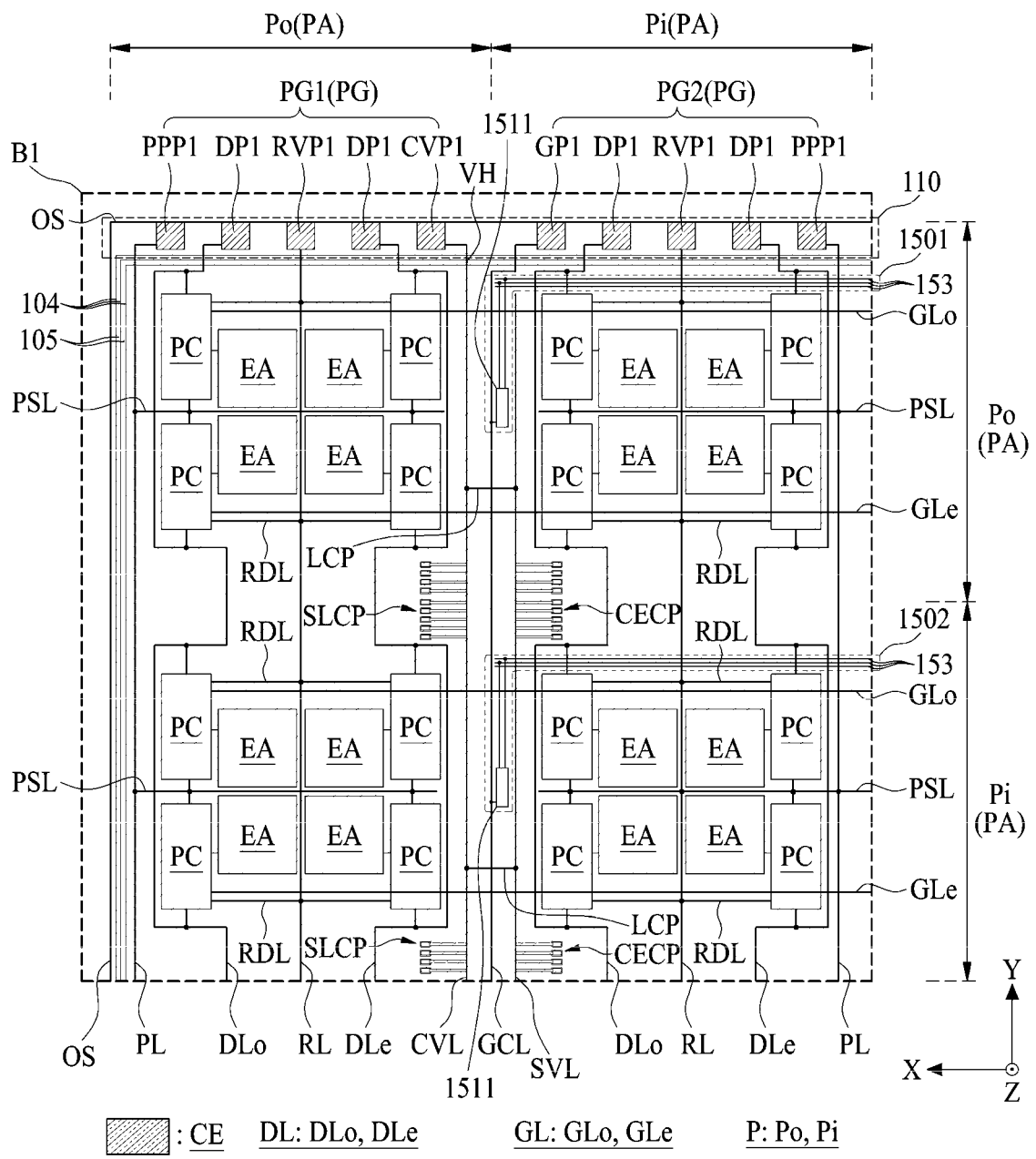
FIG. 4 is an enlarged view of a region 'B1' illustrated in FIG. 1.
Figure 5:
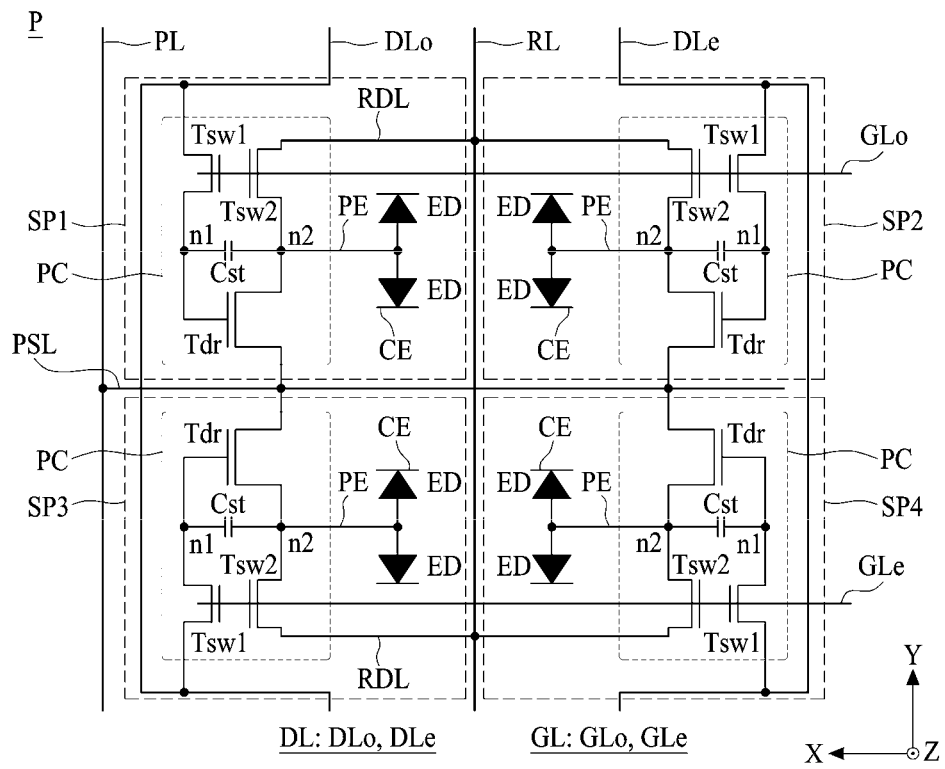
FIG. 5 is an equivalent circuit diagram illustrating one subpixel illustrated in FIGS. 1 and 4.

FIG. 4 is an enlarged view of a region 'B1' illustrated in FIG. 1, and FIG. 5 is an equivalent circuit diagram illustrating one subpixel illustrated in FIGS. 1 and 4.

Referring to FIGS. 1, 4, and 5, a substrate 100 according to an embodiment of the present disclosure may include pixel driving lines DL, GL, PL, CVL, RL, and GCL, a plurality of pixels P, a common electrode CE, a plurality of common electrode connection portions CECP, and a first pad portion 110.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines (or a plurality of reference lines) RL, and gate control lines GCL.

The plurality of data lines DL may extend long along the second direction Y and may be disposed spaced apart from one another by a predetermined or selected interval in the display portion AA of the substrate 100 along the first direction X.

The plurality of gate lines GL may extend long along the first direction X and may be disposed spaced apart from one another by a predetermined or selected interval in the display portion AA of the substrate 100 along the second direction Y.

The plurality of pixel driving power lines PL may extend long along the second direction Y and may be disposed spaced apart from one another by a predetermined or selected interval at the display portion AA of the substrate 100 along the first direction X.

Two adjacent pixel driving power lines PL of the plurality of pixel driving power lines PL may be coupled to a plurality of power sharing lines PSL disposed in each of the pixel areas PA arranged along the second direction Y. For example, the plurality of pixel driving power lines PL may be electrically coupled to (or contact) one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized or reduced. Accordingly, the light emitting display apparatus according to embodiments of the present disclosure may be prevented or minimized or reduced the degradation in image quality caused by a deviation of the pixel driving power supplied to each of the pixels P arranged at the display portion AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long along the second direction Y and may be disposed spaced apart from one another by a predetermined or selected interval at the display portion AA of the substrate 100 along the first direction X. For example, each of the plurality of pixel common voltage lines CVL may be disposed at a first periphery portion of an even-numbered pixel area PA with respect to the first direction X, but embodiments of the present disclosure are not limited thereto.

The plurality of reference voltage lines RL may extend long along the second direction Y and may be disposed spaced apart from one another by a predetermined or selected interval at the display portion AA of the substrate 100 along the first direction X. Each of the plurality of reference voltage lines RL may be disposed at a center region of each of the pixel areas PA arranged along the second direction Y, but embodiments of the present disclosure are not limited thereto.

Each of the plurality of reference voltage lines RL may be shared by two adjacent subpixels ((SP1, SP2) (SP3, SP4)) along the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) along the first direction X in each pixel area PA and may be electrically coupled to the two adjacent subpixels ((SP1, SP2) (SP3, SP4)).

Each of the plurality of gate control lines GCL may extend long along the second direction Y and may be disposed spaced apart from one another by a predetermined or selected interval at the display portion AA of the substrate 100 along the first direction X. For example, each of the plurality of gate control lines GCL may be disposed between the plurality of pixel areas PA or at a boundary region between two adjacent pixel areas PA with respect to the first direction X.

Each of the plurality of pixels P may include at least three subpixels. For example, each of the plurality of pixels P may include first to fourth subpixels SP1 to SP4. Each of the first to fourth subpixels SP1 to SP4 may include a pixel circuit PC and a light emitting device layer.

The pixel circuit PC according to an embodiment may be disposed in a circuit area of the pixel area PA and may be connected to a gate line GLo or GLe adjacent thereto, a data line DLo or DMe adjacent thereto, and the pixel driving power line PL. For example, a pixel circuit PC disposed at a first subpixel SP1 may be connected to an odd-numbered data line DLo and an odd-numbered gate line GLo, a pixel circuit PC disposed at a second subpixel SP2 may be connected to an even-numbered data line DMe and an odd-numbered gate line GLo, a pixel circuit PC disposed at a third subpixel SP3 may be connected to an odd-numbered data line DLo and an even-numbered gate line GLe, and a pixel circuit PC disposed at a fourth subpixel SP4 may be connected to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GLo or GLe a first electrode (or a first source/drain electrode) connected to a corresponding data line DLo or DLe, and a second electrode (or a second source/drain electrode) connected to a gate node n1 of the driving TFT Tdr. The first switching TFT Tsw1 may be turned on by a scan signal (or a first gate signal) supplied through corresponding gate line GLo or GLe and may transfer a data signal, supplied through corresponding data line DLo or DLe, to the gate electrode n1 of the driving TFT Tdr.

The second switching TFT Tsw2 may include a gate electrode connected to a corresponding gate line GLo or GLe a first electrode (or a first source/drain electrode) connected to a source node n2 of the driving TFT Tdr, and a second electrode (or a second source/drain electrode) connected to a corresponding reference voltage line RL. The second switching TFT Tsw2 may be turned on by a scan signal (or a second gate signal) supplied through the corresponding gate line GLo or GLe and may transfer a reference voltage, supplied through the corresponding reference voltage line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment may include a first capacitor electrode connected to the gate node n1 of the driving TFT Tdr, a second capacitor electrode connected to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) connected to the second electrode of the first switching TFT Tsw1 and the first capacitor electrode of the storage capacitor Cst in common, a first electrode (or a first source/drain electrode or the source node n2) connected to the first electrode of the second switching TFT Tsw2, the second capacitor electrode of the storage capacitor Cst, and a pixel electrode PE of the light emitting device layer in common, and a second electrode (or a second source/drain electrode or a drain node) connected to a corresponding pixel driving power line PL. The driving TFT Tdr may be turned on based on a voltage of the storage capacitor Cst and may control the amount of current flowing from the pixel driving power line PL to the light emitting device layer.

The light emitting device layer may be disposed in an emission area EA of the pixel area PA and electrically connected to (or contact) the pixel circuit PC. The light emitting device layer according to an embodiment may include a pixel electrode PE electrically connected to (or contacting) the pixel circuit PC, a common electrode CE electrically connected to (or contacting) the pixel common voltage line CVL, and a self-emitting device ED interposed between the pixel electrode PE and the common electrode CE.

Each of the plurality of common electrode connection portions CECP may be disposed between the plurality of pixels P respectively overlapping the plurality of pixel common voltage lines CVL and may be electrically connected to (or contact) the common electrode CE to each of the plurality of pixel common voltage lines CVL. With respect to the first direction X and the second direction Y, each of the plurality of common electrode connection portions CECP according to an embodiment may be electrically coupled to each of the plurality of pixel common voltage lines CVL in a portion between the plurality of pixels P or a boundary portion between the plurality of pixels P and may be electrically connected to (or contact) a portion of the common electrode CE, and thus, may be electrically connected to (or contact) the common electrode CE to each of the plurality of pixel common voltage lines CVL.

Each of the plurality of common electrode connection portions CECP may be disposed at a portion between the plurality of pixels P to electrically connect (or contact) the common electrode CE to each of the plurality of pixel common voltage lines CVL, and thus, may prevent or minimize or reduce a voltage drop (IR drop) of the pixel common voltage caused by a surface resistance of the common electrode CE. According to an embodiment of the present disclosure, each of the plurality of common electrode connection portions CECP may be formed together with a pixel electrode PE having at least two-layer structure so as to be electrically connected (or contact) to each of the plurality of pixel common voltage lines CVL. For example, the common electrode CE may be connected (or contact) to each of the plurality of common electrode connection portions CECP by a side contact structure (or a side exposed structure).

The dam portion 104 may be disposed or implemented at periphery portions of the substrate 100 or the outermost pixels Po to have a closed loop line shape (or a closed loop shape). The dam portion 104 is the same as described with reference to FIG. 1, and thus, the repetitive description thereof is omitted.

The light emitting display apparatus 10 or the substrate 100 according to an embodiment of the present disclosure may further include a separation portion 105. The separation portion 105 may be disposed or implemented at periphery portions of the substrate 100 or the outermost pixels Po to have a closed loop line shape (or a closed loop shape) around (or near) the dam portion 104. The separation portion 105 is the same as described with reference to FIG. 1, and thus, the repetitive description thereof is omitted.

The first pad portion 110 may include a plurality of first pads which are disposed in parallel with one another along the first direction X at the first periphery portion of the substrate 100. The plurality of first pads may be divided (or classified) into a plurality of first data pads DP1, a plurality of first gate pads GP1, a plurality of first pixel driving power pads PPP1, a plurality of first reference voltage pads RVP1, and a plurality of first pixel common voltage pads CVP1.

Each of the plurality of first data pads DP1 may be individually (or a one-to-one relationship) connected to one side end of each of the plurality of data lines DLo and DLe disposed on the substrate 100. In other words, each of the plurality of first data pads DP1 may be connected to one side end of a respective one of the plurality of data lines DLo and DLe.

Each of the plurality of first gate pads GP1 may be individually (or in a one-to-one relationship) connected to one side end of each of the gate control lines GCL disposed at the substrate 100. In other words, each of the plurality of first gate pads GP1 may be connected to one side end of a respective one of the gate control lines GCL. The plurality of first gate pads GP1 may be divided (or classified) into a first start signal pad, a plurality of first shift clock pads, a plurality of first carry clock pads, at least one first gate driving power pad, and at least one first gate common power pad, or the like.

Each of the plurality of first pixel driving power pads PPP1 may be individually (or in a one-to-one relationship) connected to one side end of each of the plurality of pixel driving power lines PL disposed on the substrate 100. In other words, each of the plurality of first pixel driving power pads PPP1 may be connected to one side end of a respective one of the plurality of pixel driving power lines PL. Each of the first reference voltage pads RVP1 may be individually (or in a one-to-one relationship) connected to one side end of each of the plurality of reference voltage lines RL disposed on the substrate 100. In other words, each of the first reference voltage pads RVP1 may be connected to one side end of a respective one of the plurality of reference voltage lines RL. Each of the first pixel common voltage pads CVP1 may be individually (or in a one-to-one relationship) connected to one side end of each of the plurality of pixel common voltage lines CVL disposed on the substrate 100. In other words, each of the first pixel common voltage pads CVP1 may be connected to one side end of a respective one of the plurality of pixel common voltage lines CVL.

The first pad portion 110 according to an embodiment of the present disclosure may include a plurality of pad groups PG disposed along the first direction X. Each of the plurality of pad groups PG may be connected to two adjacent pixels P disposed along the first direction X. Each of the plurality of pad groups PG may include a first pad group PG1 and a second pad group PG2 which are alternately disposed along the first direction X. The first pad group PG1 may include a first pixel driving power pad PPP1, a first data pad DP1, a first reference voltage pad RVP1, a first data pad DP1, and a first pixel common voltage pad CVP1 continuously or sequentially disposed within an odd-numbered pixel area PA along the first direction X. The second pad group PG2 may include a first gate pad GP1, a first data pad DP1, a first reference voltage pad RVP1, a first data pad DP1, and a first pixel driving power pad PPP1 continuously or sequentially disposed within an even-numbered pixel area PA along the first direction X.

The light emitting display apparatus 10 or the substrate 100 according to an embodiment of the present disclosure may further include a plurality of secondary voltage lines SVL and a plurality of secondary line connection portions SLCP.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically connected to (or contact) an adjacent pixel common voltage line CVL without being electrically connected to (or contacting) the pixel common voltage pad CVP1, and thus, may be supplied with a pixel common voltage from the adjacent pixel common voltage line CVL. To this end, the substrate 100 according to an embodiment of the present disclosure may further include a plurality of line connection patterns LCP which may be electrically connect to (or contact) a pixel common voltage line CVL and a secondary voltage line SVL adjacent to each other.

Each of the plurality of line connection patterns LCP may be disposed on the substrate 100 so as to intersect with or overlap a pixel common voltage line CVL and a secondary voltage line SVL adjacent to each other, and may electrically connect (or contact) a pixel common voltage line CVL and a secondary voltage line SVL adjacent to each other through a line jumping structure. For example, one side of each of the plurality of line connection patterns LCP may be electrically connected to (or contact) a portion of the secondary voltage line SVL through a first line contact hole formed at an insulation layer over the secondary voltage line SVL, and the other side of each of the plurality of line connection patterns LCP may be electrically connected to (or contact) a portion of the pixel common voltage line CVL through a second line contact hole formed at the insulation layer over the pixel common voltage line CVL.

Each of the plurality of secondary line connection portions SLCP may electrically connect (or contact) the common electrode CE to each of the plurality of secondary voltage lines SVL between the plurality of pixels P overlapping each of the plurality of secondary voltage lines SVL. For example, each of the plurality of secondary line connection portions SLCP may electrically connect the common electrode CE to a respective one of the plurality of secondary voltage lines SVL. With respect to the second direction Y, each of the plurality of secondary line connection portions SLCP according to an embodiment may be electrically connected to (or contact) each of the plurality of secondary voltage lines SVL in a portion between the plurality of pixels P or a boundary portion between the plurality of pixels P, and may be electrically connected to (or contact) a portion of the common electrode CE, and thus, may electrically connect (or contact) the common electrode CE to each of the plurality of secondary voltage lines SVL. Therefore, the common electrode CE may be additionally connected to each of the plurality of secondary voltage lines SVL through the secondary line connection portions SLCP. Accordingly, the light emitting display apparatus 10 according to an embodiment of the present disclosure may more prevent or minimize or reduce the degradation in image quality caused by a deviation of the pixel common voltage supplied to each of the pixels P arranged in the display portion AA. Also, in the light emitting display apparatus 10 according to an embodiment of the present disclosure, although the pixel common voltage pad CVP connected to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

The light emitting display apparatus 10 or the substrate 100 according to an embodiment of the present disclosure may further include an encapsulation layer.

The encapsulation layer may be implemented to surround a light emitting device layer. The encapsulation layer may include a first inorganic encapsulation layer (or a first encapsulation layer) disposed over the light emitting device layer, the dam portion 104 and the separation portion 105, a second inorganic encapsulation layer (or a third encapsulation layer) disposed over the first inorganic encapsulation layer, and an organic encapsulation layer (or a second encapsulation layer) interposed between the first inorganic encapsulation layer and the second inorganic encapsulation layer disposed over an encapsulation region defined by the dam portion 104.

The organic encapsulation layer may cover a front surface (or a top surface) of the light emitting device layer and may flow toward an end of the substrate 100, and the spread (or flow) of the organic encapsulation layer may be blocked by the dam portion 104. The dam portion 104 may define or limit an arrangement region (or an encapsulation region) of the organic encapsulation layer, and the spread or overflow of the organic encapsulation layer may be blocked or prevented.

Figure 6:
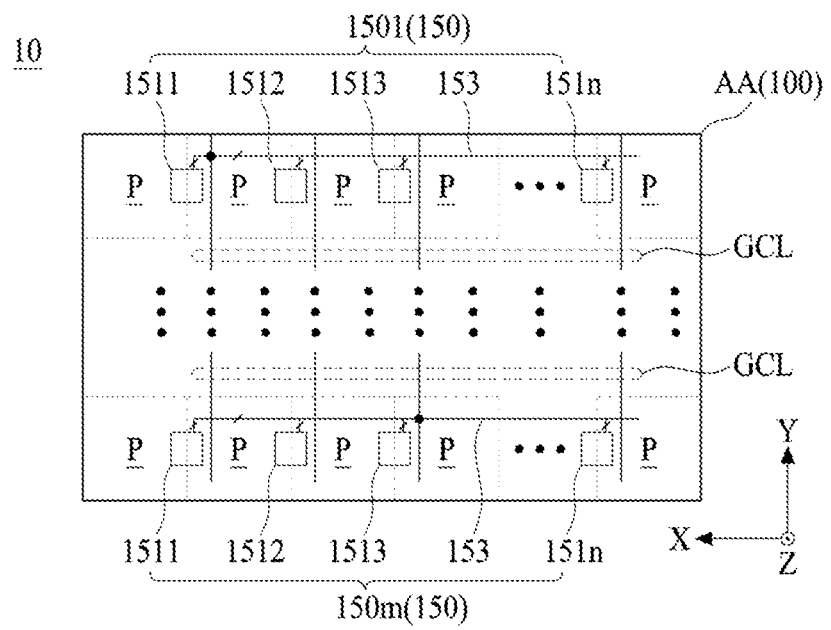
FIG. 6 is a diagram illustrating a gate driving circuit illustrated in FIGS. 1 and 4.

FIG. 6 is a diagram illustrating a gate driving circuit illustrated in FIGS. 1 and 4.

Referring to FIGS. 1, 4, and 6, the gate driving circuit 150 according to another embodiment of the present disclosure may be implemented (or embedded) within the display portion AA of the substrate 100. The gate driving circuit 150 may generate a scan signal based on gate control signals supplied through the first pad portion 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined or selected interval in a display portion AA of the substrate 100 along the first direction X. For example, the gate control lines GCL may be disposed between at least one pair of adjacent pixels P along the first direction X.

The gate driving circuit 150 may be implemented with a shift register including a plurality of stage circuits 1501 to 150m, where m is an integer of 2 or more.

Each of the plurality of stage circuits 1501 to 150m may be individually disposed in each horizontal line on a first surface of the substrate 100 along the first direction X and may be dependently connected to one another along the second direction Y. In other words, each of the plurality of stage circuits 1501 to 150m may be disposed in a respective one of the horizontal lines of the substrate 100. Each of the plurality of stage circuits 1501 to 150m may generate a scan signal in a predetermined or selected order in response to gate control signals supplied through the first pad portion 110 and the gate control lines GCL and may supply the scan signal to a corresponding gate line GL.

Each of the plurality of stage circuits 1501 to 150m may include a plurality of branch circuits 1511 to 151n and a branch network 153.

The plurality of branch circuits 1511 to 151n may be selectively connected to the gate control lines GCL through the branch network 153 and may be electrically connected to (or contact) one another through the branch network 153. Each of the plurality of branch circuits 1511 to 151n may generate the scan signal based on a gate control signal supplied through the gate control lines GCL and a voltage of the branch network 153, and may supply the scan signal to a corresponding gate line GL.

Each of the plurality of branch circuits 1511 to 151n may include at least one TFT (or branch TFT) of a plurality of TFTs configuring one stage circuit of the plurality of stage circuits 1501 to 150m. Any one branch circuit of the plurality of branch circuits 1511 to 151n may include a pull-up TFT connected to the gate line GL. The other branch circuit of the plurality of branch circuits 1511 to 151n may include a pull-down TFT connected to the gate line GL.

Each of the plurality of branch circuits 1511 to 151n according to an embodiment may be disposed at a circuit area between two adjacent pixels P or at a circuit area between at least two adjacent pixels P, in each horizontal line of the substrate 100, but embodiments of the present disclosure are not limited thereto. For example, each of the plurality of branch circuits 1511 to 151n may be disposed at a circuit area (or a boundary region) between at least one pair of adjacent pixels P according to the number of TFTs configuring the one stage circuit 1501 to 150m and the number of pixels P disposed in one horizontal line.

The branch network 153 may be disposed at each horizontal line of the substrate 100 and may electrically connect (or contact) the plurality of branch circuits 1511 to 151n to each other. The branch network 153 may include a plurality of control node lines and a plurality of network lines.

The plurality of control node lines may be disposed at each horizontal line of the substrate 100 and may be selectively connected to the plurality of branch circuits 1511 to 151n within one horizontal line. For example, the plurality of control node lines may be disposed at an upper periphery region (or a lower periphery region) among pixel areas arranged within each horizontal line of the substrate 100, but embodiments of the present disclosure are not limited thereto.

The plurality of network line may be selectively connected to the gate control lines GCL disposed at the substrate 100 and may be selectively connected to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

As described above, according to an embodiment of the present disclosure, because the gate driving circuit 150 is disposed within the display portion AA of the substrate 100, a second interval D2 between a center portion CP of the outermost pixel Po and the outer surface OS of the substrate 100 may be equal to or less than half of a first interval (or a pixel pitch) D1 between adjacent pixels P. For example, when the gate driving circuit 150 is not disposed within the display portion AA of the substrate 100 and is disposed at a periphery portion of the substrate 100, the second interval D2 may not be equal to or less than half of the first interval D1 due to the gate driving circuit 150. Accordingly, in the light emitting display apparatus 10 according to an embodiment of the present disclosure, the gate driving circuit 150 may be disposed within the display portion AA of the substrate 100, and thus, the second interval D2 may be implemented to be equal to or less than half of the first interval D1, and moreover, the light emitting display apparatus may be implemented to have an air bezel structure which has a zeroized bezel or where a bezel area is not provided.

Figure 7:
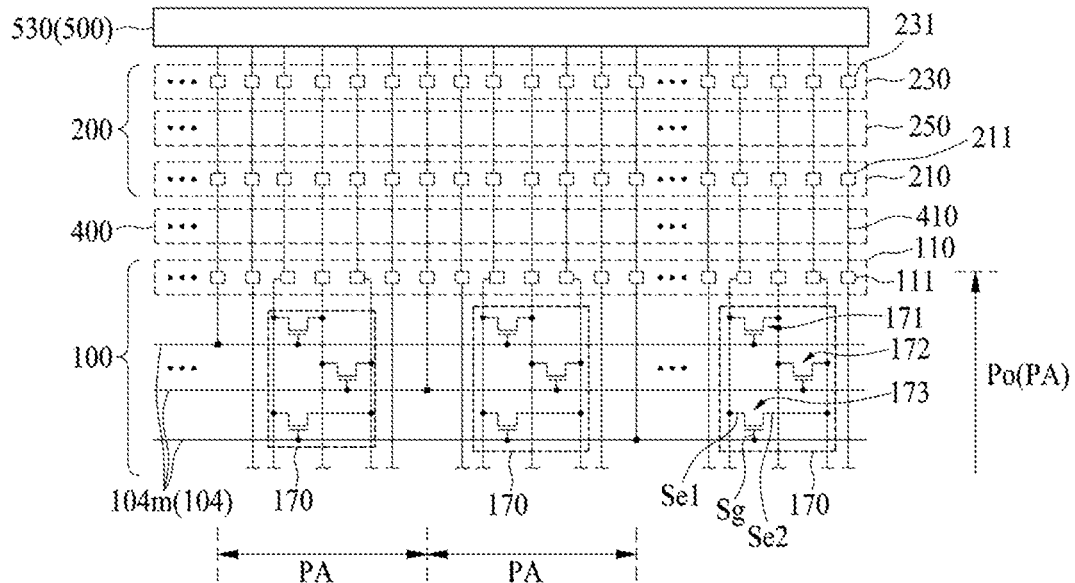
FIG. 7 is a diagram illustrating a plurality of switching circuit portions according to an embodiment of the present disclosure.
Figure 8:
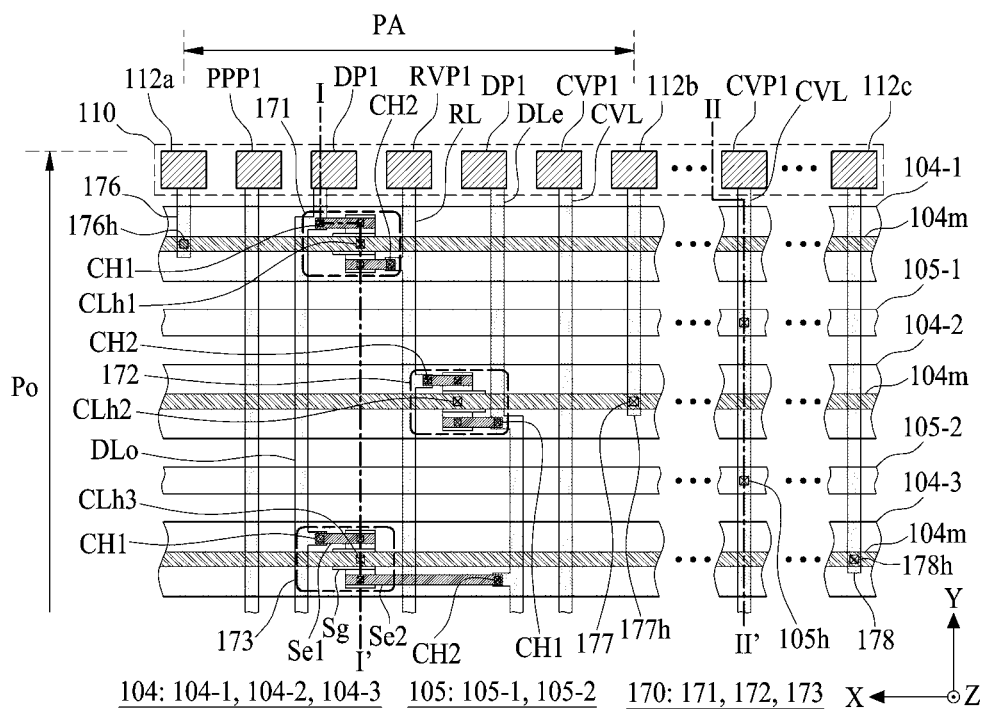
FIG. 8 is a diagram illustrating a first pad portion, one switching circuit portion, and a dam portion illustrated in FIG. 7.

FIG. 7 is a diagram for describing a plurality of switching circuit portions according to an embodiment of the present disclosure, and FIG. 8 is a diagram illustrating the first pad portion, one switching circuit portion, and the dam portion illustrated in FIG. 7. FIGS. 7 and 8 schematically illustrate a switching circuit portion for sensing a resistance of a routing line disposed in a routing portion according to an embodiment of the present disclosure and elements relevant thereto.

Referring to FIGS. 1, 7, and 8, in the light emitting display apparatus 10 according to an embodiment of the present disclosure, each of a plurality of switching circuit portions 170 may be disposed to overlap the dam portion 104 and may be connected to a driving circuit part 500 through a first pad portion 110, a routing portion 400, a second pad portion 210, a link line portion 250, and a third pad portion 230. Each of the plurality of switching circuit portions 170 may be configured to be driven (or switched) based on a switching control signal provided from the driving circuit part 500.

The dam portion 104 may include first to third dams 104-1 to 104-3, and a separation portion 105 may include first and second separation structures 105-1 and 105-2 disposed between the first to third dams 104-1 to 104-3.

Each of the first to third dams 104-1 to 104-3 may be implemented in parallel to surround the display portion to one-dimensionally have a closed loop line shape (or a continuous line shape or a closed loop shape). The first dam 104-1 may be disposed to surround the second dam 104-2, and the second dam 104-2 may be disposed to surround the third dam 104-3.

Each of the first to third dams 104-1 to 104-3 may include a metal line 104m. The metal line 104m may be embedded or implemented in (or inside) the dam portion 104, and thus, may one-dimensionally have the same closed loop line shape (or a continuous line shape or a closed loop shape) as the dam portion 104.

Each of the first and second separation structures 105-1 and 105-2 may be implemented in parallel to one-dimensionally have a closed loop line shape (or a continuous line shape or a closed loop shape). The first separation structure 105-1 may be disposed between the first dam 104-1 and the second dam 104-2. The second separation structure 105-2 may be disposed between the second dam 104-2 and the third dam 104-3. Each of the first and second separation structures 105-1 and 105-2 may intersect with the plurality of pixel driving lines.

In the light emitting display apparatus 10 according to an embodiment of the present disclosure, the first pad portion 110 may further include first to third front sensing control pads 112a, 112b, and 112c and first to third pad connection lines 176, 177, and 178.

Each of the first to third front sensing control pads 112a, 112b, and 112c may be disposed between the plurality of first pads. For example, each of the first to third front sensing control pads 112a, 112b, and 112c may be disposed one by one in a region between the first pad group PG1 and the second pad group PG2 described above with reference to FIG. 4. In the test mode, each of the first to third front sensing control pads 112a, 112b, and 112c may receive a corresponding switching control signal from the driving IC 530 via the flexible circuit film 510, the third pad portion 230, the link line portion 250, the second pad portion 210, and the routing portion 400.

According to an embodiment of the present disclosure, each of the first to third front sensing control pads 112a, 112b, and 112c may be selected from among a plurality of front dummy pads which are arranged at a certain interval in the first pad portion 110 and are not connected to pixel driving power. For example, the first pad portion 110 may include a plurality of front pads, and the plurality of front pads may include or be divided (or classified) into a plurality of first data pads DP1, a plurality of first gate pads GP1, a plurality of first pixel driving power pads PPP1, a plurality of first reference voltage pads RVP1, a plurality of first pixel common voltage pads CVP1, and the first to third front sensing control pads 112a, 112b, and 112c.

The first pad connection line 176 may be configured to be electrically coupled to the first front sensing control pad 112a and the metal line 104m of the first dam 104-1. The first pad connection line 176 may extend long along the second direction Y to overlap the first front sensing control pad 112a and overlap the metal line 104m of the first dam 104-1. For example, one side (or one end) of the first pad connection line 176 may be electrically connected to the first front sensing control pad 112a through a pad contact hole. The metal line 104m of the first dam 104-1 may be electrically connected to the other side (or the other end) of the first pad connection line 176 through a via hole 176h. Accordingly, in the test mode, a first switching control signal supplied from the driving IC 530 to the first front sensing control pad 112a may be supplied to the metal line 104*m* of the first dam 104-1 through the first pad connection line 176.

The second pad connection line 177 may be configured to be electrically coupled to the second front sensing control pad 112*b* and the metal line 104*m* of the second dam 104-2. The second pad connection line 177 may extend long along the second direction Y to overlap the second front sensing control pad 112*b* and overlap the metal line 104*m* of the second dam 104-2. For example, one side (or one end) of the second pad connection line 177 may be electrically connected to the second front sensing control pad 112*b* through a pad contact hole. The metal line 104*m* of the second dam 104-2 may be electrically connected to the other side (or the other end) of the second pad connection line 177 through a via hole 177*h*. Accordingly, in the test mode, a second switching control signal supplied from the driving IC 530 to the second front sensing control pad 112*b* may be supplied to the metal line 104*m* of the second dam 104-2 through the second pad connection line 177.

The third pad connection line 178 may be configured to be electrically coupled to the third front sensing control pad 112*c* and the metal line 104*m* of the third dam 104-3. The third pad connection line 178 may extend long along the a second direction Y to overlap the third front sensing control pad 112*c* and overlap the metal line 104*m* of the third dam 104-3. For example, one side (or one end) of the third pad connection line 178 may be electrically connected to the third front sensing control pad 112*c* through a pad contact hole. The metal line 104*m* of the third dam 104-3 may be electrically connected to the other side (or the other end) of the third pad connection line 178 through a via hole 178*h*. Accordingly, in the test mode, a third switching control signal supplied from the driving IC 530 to the third front sensing control pad 112*c* may be supplied to the metal line 104*m* of the third dam 104-3 through the third pad connection line 178.

Each of the plurality of switching circuit portions 170 may be disposed along a first periphery portion of the substrate 100 or along the first periphery portion of the outermost pixels Po. Each of the plurality of switching circuit portions 170 may be disposed (or included) in a corresponding outermost pixel of a plurality of outermost pixels Po. Each of the plurality of switching circuit portions 170 may be disposed to overlap the dam portion 104. Each of the plurality of switching circuit portions 170 may be disposed between the dam portion 104 and an outer surface of the substrate 100 to overlap the dam portion 104, and thus, an increase in bezel width caused by the plurality of switching circuit portions 170 may be prevented.

Each of the plurality of switching circuit portions 170 according to an embodiment of the present disclosure may include first to third switching circuits 171, 172, and 173.

The first to third switching circuits 171, 172, and 173 may be disposed to individually overlap the first to third dams 104-1, 104-2, and 104-3. For example, the first switching circuit 171 may overlap the first dam 104-1, or may be disposed under the first dam 104-1. The second switching circuit 172 may overlap the second dam 104-2, or may be disposed under the second dam 104-2. The third switching circuit 173 may overlap the third dam 104-3, or may be disposed under the third dam 104-3.

Each of the first to third switching circuits 171, 172, and 173 may be a thin film transistor (TFT) which includes a gate electrode Sg, a first electrode Se1 (or a first source/drain electrode), and a second electrode Se2 (or a second source/drain electrode). Each of the first to third switching circuits 171, 172, and 173 having such a configuration may be formed together with a driving TFT Tdr of a pixel circuit.

In the test mode, the first switching circuit 171 may be configured to sense a line resistance of a data routing line connected to a first data line (or an odd-numbered data line) DLo of two data lines DLo and DLe provided in one pixel area PA and a line resistance of a reference routing line connected to the reference voltage line RL. The first switching circuit 171 may be electrically connected to the first data line DLo, the reference voltage line RL, and the metal line 104*m* of the first dam 104-1, which are disposed in one pixel area PA. In the test mode, the first switching circuit 171 may be turned on based on the first switching control signal supplied through the metal line 104*m* of the first dam 104-1 and may output a test signal, supplied through the first data line DLo, to the reference voltage line RL.

The gate electrode Sg of the first switching circuit 171 may overlap the metal line 104*m* of the first dam 104-1 or may be disposed under the metal line 104*m* of the first dam 104-1, and may be electrically coupled to the metal line 104*m* of the first dam 104-1 through a first control line contact hole CLh1. For example, the metal line 104*m* of the first dam 104-1 may be a first switching control line.

The first electrode Se1 of the first switching circuit 171 may be electrically coupled to the first data line (or the odd-numbered data line) DLo of the two data lines DLo and DLe provided in one pixel area PA. For example, the first electrode Se1 of the first switching circuit 171 may extend to overlap or intersect with the first data line DLo and may be electrically coupled to the first data line DLo through a first contact hole CH1.

The second electrode Se2 of the first switching circuit 171 may be electrically coupled to the reference voltage line RL disposed in one pixel area PA. For example, the second electrode Se2 of the first switching circuit 171 may extend to overlap or intersect with the reference voltage line RL and may be electrically coupled to the reference voltage line RL through a second contact hole CH2. The reference voltage line RL may be used as a sensing line when the first switching circuit 171 is turned on.

In the test mode, the second switching circuit 172 may be configured to sense a line resistance of a data routing line connected to the second data line (or an even-numbered data line) DLe of the two data lines DLo and DLe provided in one pixel area PA and a line resistance of the reference routing line connected to the reference voltage line RL. The second switching circuit 172 may be electrically connected to the second data line DLe, the reference voltage line RL, and the metal line 104*m* of the second dam 104-2, which are disposed in one pixel area PA. In the test mode, the second switching circuit 172 may be turned on based on the second switching control signal supplied through the metal line 104*m* of the second dam 104-2 and may output a test signal, supplied through the second data line DLe, to the reference voltage line RL.

The gate electrode Sg of the second switching circuit 172 may overlap the metal line 104*m* of the second dam 104-2 or may be disposed under the metal line 104*m* of the second dam 104-2, and may be electrically coupled to the metal line 104*m* of the second dam 104-2 through a second control line contact hole CLh2. For example, the metal line 104*m* of the second dam 104-2 may be a second switching control line.

The first electrode Se1 of the second switching circuit 172 may be electrically coupled to the second data line (or the even-numbered data line) DLe of the two data lines DLo and DLe provided in one pixel area PA. For example, the first electrode Se1 of the second switching circuit 172 may extend to overlap or intersect with the second data line DLe and may be electrically coupled to the second data line DLe through a first contact hole CH1.

The second electrode Se2 of the second switching circuit 172 may be electrically coupled to the reference voltage line RL disposed in one pixel area PA. For example, the second electrode Se2 of the second switching circuit 172 may extend to overlap or intersect with the reference voltage line RL and may be electrically coupled to the reference voltage line RL through a second contact hole CH2. The reference voltage line RL may be used as a sensing line when the second switching circuit 172 is turned on.

In the test mode, the third switching circuit 173 may be configured to sense a line resistance of the two data routing lines connected to each of the first data line DLo and the second data line DLe provided in one pixel area PA. The third switching circuit 173 may be electrically connected to the first data line DLo, the second data line DLe, and the metal line 104m of the third dam 104-3, which are disposed in one pixel area PA. In the test mode, the third switching circuit 173 may be turned on based on the third switching control signal supplied through the metal line 104m of the third dam 104-3 and may output a test signal, supplied through the first data line DLo, to the second data line DLe.

The gate electrode Sg of the third switching circuit 173 may overlap the metal line 104m of the third dam 104-3 or may be disposed under the metal line 104m of the third dam 104-3, and may be electrically coupled to the metal line 104m of the third dam 104-3 through a third control line contact hole CLh3. For example, the metal line 104m of the third dam 104-3 may be a third switching control line.

The first electrode Se1 of the third switching circuit 173 may be electrically coupled to the first data line DLo. For example, the first electrode Se1 of the third switching circuit 173 may extend to overlap or intersect with the first data line DLo and may be electrically coupled to the first data line DLo through a first contact hole CH1.

The second electrode Se2 of the third switching circuit 173 may be electrically coupled to the second data line DLe. For example, the second electrode Se2 of the third switching circuit 173 may extend to overlap or intersect with the second data line DLe and may be electrically coupled to the second data line DLe through a second contact hole CH2.

Figure 9:
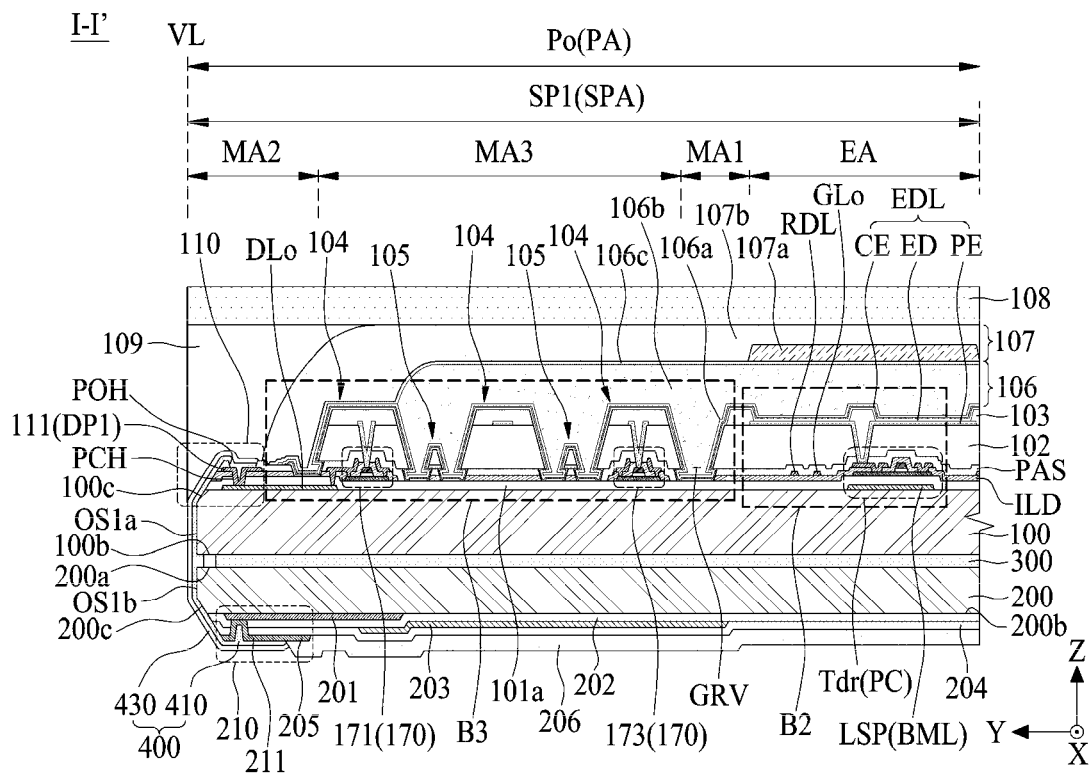
FIG. 9 is a cross-sectional view taken along line I-I' illustrated in FIGS. 2 and 8.
Figure 10:
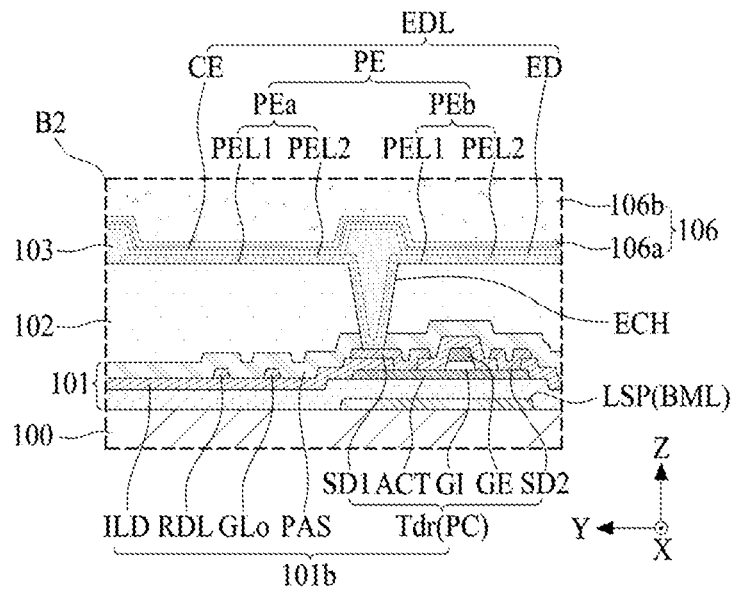
FIG. 10 is an enlarged view of a region 'B2' illustrated in FIG. 9.
Figure 11:
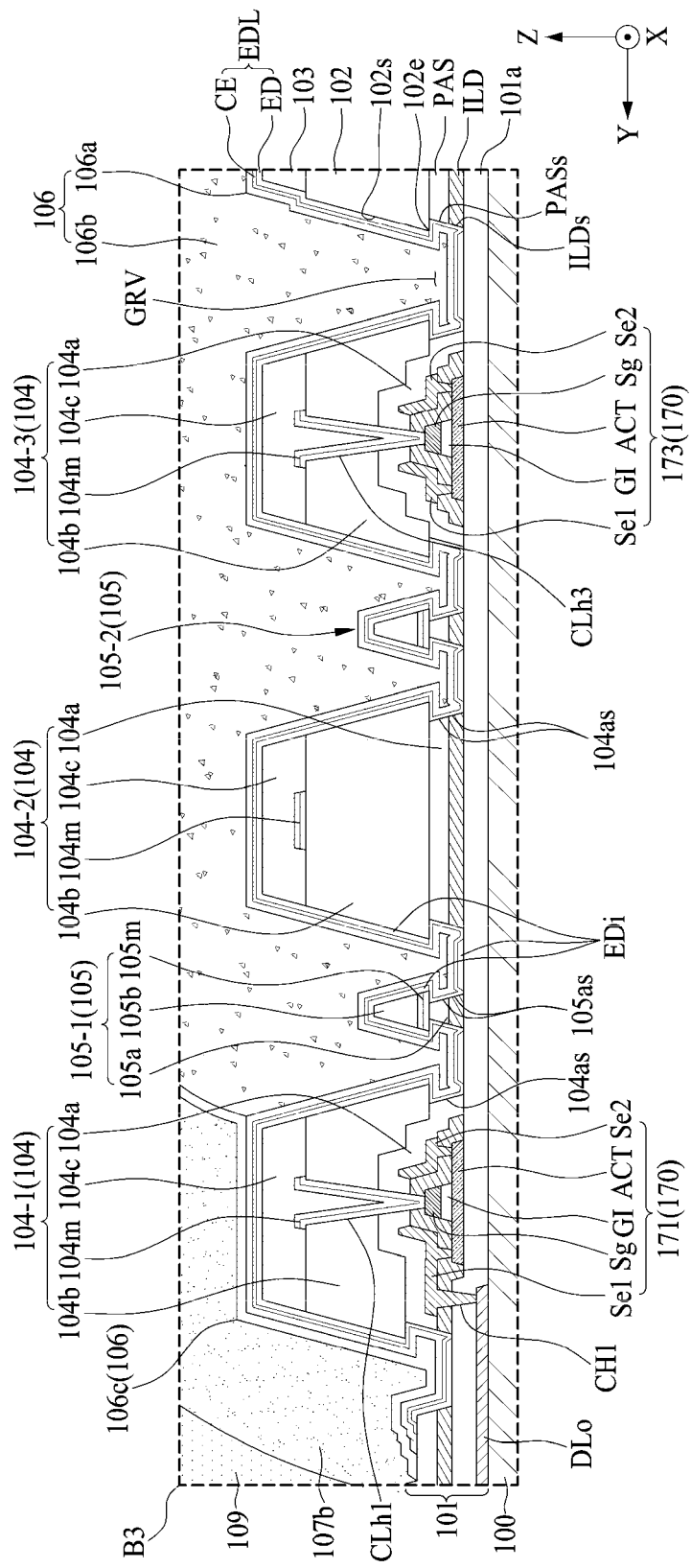
FIG. 11 is an enlarged view of a region 'B3' illustrated in FIG. 9.
Figure 12:
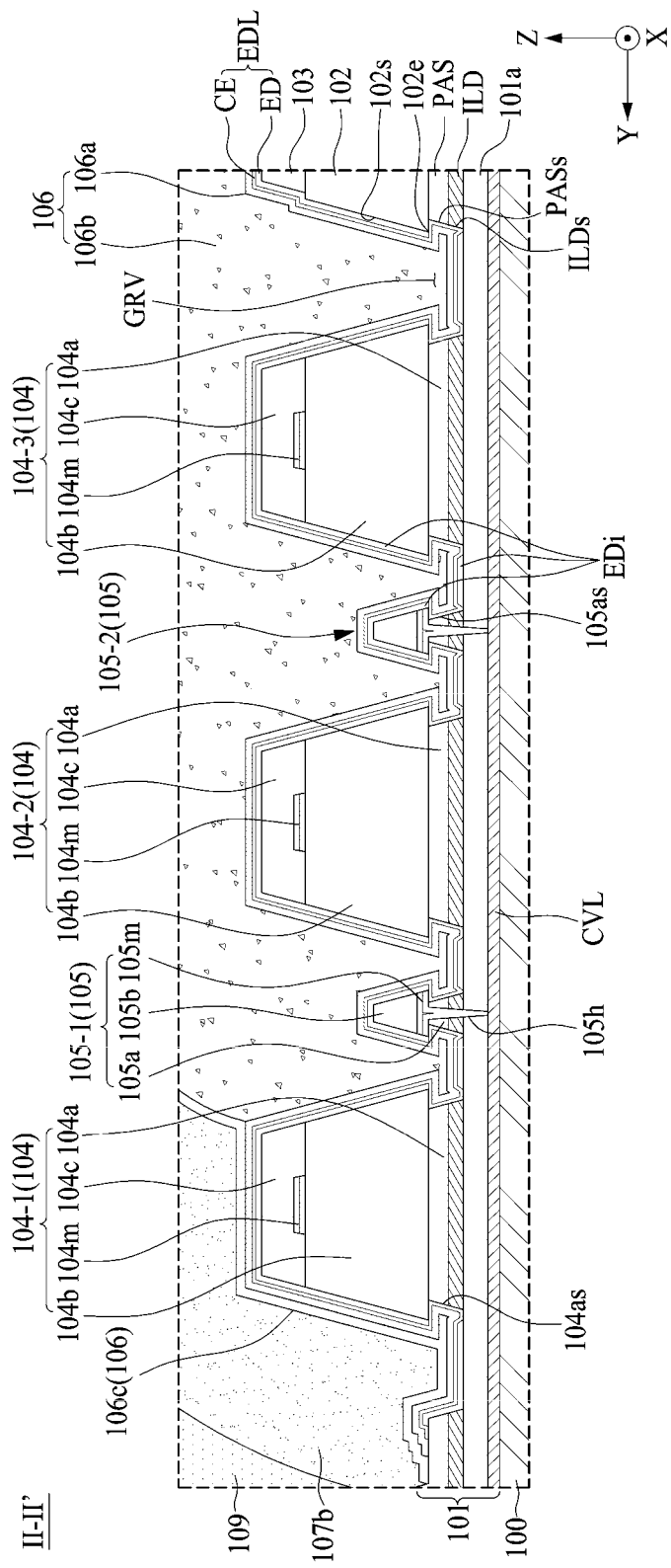
FIG. 12 is a cross-sectional view taken along line II-II' illustrated in FIGS. 2 and 8.

FIG. 9 is a cross-sectional view taken along line I-I' illustrated in FIGS. 2 and 8, FIG. is an enlarged view of a region 'B2' illustrated in FIG. 9, FIG. 11 is an enlarged view of a region 'B3' illustrated in FIG. 9, and FIG. 12 is a cross-sectional view taken along line II-II' illustrated in FIGS. 2 and 8. FIGS. 9 to 12 schematically illustrate a cross-sectional structure of an outermost pixel including a dam portion and a plurality of switching circuit portions, or the like according to an embodiment of the present disclosure, and thus, in the following description, the same elements as the elements described above with reference to FIGS. 1 to 8 are omitted or will be briefly described.

Referring to FIGS. 2 and 8 to 12, a light emitting display apparatus (or a light emitting display panel) 10 according to an embodiment of the present disclosure may include a substrate 100, a line substrate 200, a coupling member 300, and a routing portion 400.

The substrate 100 according to an embodiment of the present disclosure may include a circuit layer 101, a plurality of switching circuit portions 170, a planarization layer 102, a light emitting device layer EDL, a bank 103, a dam portion 104, and an encapsulation layer 106 thereon.

The circuit layer 101 may be disposed over the substrate 100. The circuit layer 101 may be referred to as a pixel array layer or a TFT array layer.

The circuit layer 101 according to an embodiment may include a buffer layer 101a and a circuit array layer 101b.

The buffer layer 101a may prevent materials, such as hydrogen or the like included in the substrate 100, from being diffused to the circuit array layer 101b in a high temperature process of a process of manufacturing a TFT. Also, the buffer layer 101a may prevent external water or moisture from penetrating into the light emitting device layer EDL. For example, the buffer layer 101a may be formed of an inorganic material.

The circuit array layer 101b may include a pixel circuit PC which includes a driving TFT Tdr disposed in each of a plurality of pixel areas PA over the buffer layer 101a, a plurality of switching circuit portions 170, and a passivation layer PAS.

The driving TFT Tdr disposed in a circuit area of each pixel area PA may include an active layer ACT, a gate insulation layer GI, a gate electrode GE, a first electrode SD1, and a second electrode SD2.

The active layer ACT may be disposed over the buffer layer 101a in each pixel area PA. The active layer ACT may include a channel area, overlapping the gate electrode GE, and a first electrode contact area and a second electrode contact area parallel to each other with the channel area therebetween. The active layer ACT may have obtained conductivity in a conductorization process (in other words, a process to make the material of the active layer ACT conductive), and thus, may be used as a bridge line of a jumping structure which directly connects (or contacts) lines within the display portion AA or electrically connects (or contacts) lines disposed on different layers.

The gate insulation layer GI may be disposed over the channel area of the active layer ACT. The gate insulation layer GI may insulate the active layer ACT from the gate electrode GE.

The gate electrode GE may be disposed over the gate insulation layer GI and connected to the gate line. The gate electrode GE may overlap the channel area of the active layer ACT with the gate insulation layer GI therebetween. The gate electrode GE and the active layer ACT may be covered by an interlayer insulation layer ILD.

The interlayer insulation layer ILD may be disposed over the substrate 100 to cover the gate electrode GE and the active layer ACT. For example, the interlayer insulation layer ILD may be formed of an inorganic material. The interlayer insulation layer ILD according to an embodiment may include a single-layer structure including one of silicon oxide (SiOx), silicon nitride (SiNx), silicon oxynitride (SiONx), titanium oxide (TiOx), and aluminum oxide (AlOx) or a stacked structure thereof, but embodiments of the present disclosure are not limited thereto. For example, the interlayer insulation layer ILD may be referred to as an insulation layer or a first insulation layer.

The first electrode SD1 may be disposed over the interlayer insulation layer ILD overlapping the first electrode contact area of the active layer ACT and may be electrically connected to (or contact) the first electrode contact area of the active layer ACT through a first via hole disposed in the interlayer insulation layer ILD. For example, the first electrode SD1 may be a source electrode of the driving TFT Tdr, and the first electrode contact area of the active layer ACT may be a source area.

The second electrode SD2 may be disposed over the interlayer insulation layer ILD overlapping the second electrode contact area of the active layer ACT and may be electrically connected to (or contact) the second electrode contact area of the active layer ACT through a second via hole disposed in the interlayer insulation layer ILD. For example, the second electrode SD2 may be a drain electrode of the driving TFT Tdr, and the second electrode contact area of the active layer ACT may be a drain area.

As illustrated in FIG. 5, each of first and second switching TFT Tsw1 and Tsw2 configuring the pixel circuit PC may be formed together with the driving TFT Tdr, and thus, their repetitive descriptions are omitted.

The plurality of switching circuit portions 170 may be formed in a periphery portion MA3 of outermost pixels Po. The plurality of switching circuit portions 170 may include first to third switching circuits 171, 172, and 173. Each of the first to third switching circuits 171, 172, and 173 having such a configuration may be formed together with the driving TFT Tdr, and thus, the repetitive description thereof is omitted.

The circuit layer 101 according to an embodiment may further include a lower metal layer BML which is disposed between the substrate 100 and the buffer layer 101a. The lower metal layer BML may include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the substrate 100 and the active layer ACT. The light blocking pattern LSP may block light which is incident on the active layer ACT through the substrate 100, thereby preventing or minimizing a threshold voltage variation of each TFT caused by external light. Optionally, the light blocking pattern LSP may be electrically coupled to the first electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized, reduced or prevented.

The lower metal layer BML may be used as a line disposed in parallel with each of the gate line GL, the data line DL, the pixel driving power line PL, the pixel common voltage line CVL, and the reference voltage line RL. For example, the lower metal layer BML may be used as a line (or a metal layer) disposed in parallel to the second direction Y of the pixel driving lines DL, GL, PL, CVL, RL, and GCL disposed over the substrate 100.

The passivation layer PAS may be disposed over the substrate 100 to cover the pixel circuit PC including the driving TFT Tdr. The passivation layer PAS may be an uppermost layer of the circuit layer 101 covering the driving TFT Tdr disposed in each subpixel area SPA, but embodiments of the present disclosure are not limited thereto. The passivation layer PAS may be formed of an inorganic material which is the same as or different from the interlayer insulation layer ILD. For example, the passivation layer PAS may include a single-layer structure including one of silicon oxide (SiOx), silicon nitride (SiNx), silicon oxynitride (SiONx), titanium oxide (TiOx), and aluminum oxide (AlOx) or a stacked structure thereof. For example, the passivation layer PAS may be referred to as a protection layer, a circuit protection layer, a circuit insulation layer, an inorganic insulation layer, a first inorganic insulation layer, or a second insulation layer, or the like.

The planarization layer 102 may be disposed over the substrate 100 on which the passivation layer PAS is disposed, and may provide a flat surface over the passivation layer PAS. For example, the passivation layer PAS may be disposed between the interlayer insulation layer ILD and the passivation layer PAS.

The planarization layer 102 may be formed to cover the remaining circuit layer 101 except a periphery portion of the passivation layer PAS disposed at a periphery portion of the substrate 100. For example, the planarization layer 102 may be disposed between the substrate 100 and the light emitting device layer EDL or disposed under the light emitting device layer EDL. The planarization layer 102 according to an embodiment may be formed of an organic material, but embodiments of the present disclosure are not limited thereto. For example, the planarization layer 102 may be formed of an organic material which includes acrylic resin, epoxy resin, phenolic resin, polyamide-based resin, polyimide-based resin, or the like, but embodiments of the present disclosure are not limited thereto.

The light emitting device layer EDL may be disposed over the planarization layer 102. The light emitting device layer EDL according to an embodiment may include a pixel electrode PE, a self-emitting device ED, and a common electrode CE. It should be understood that term "self-emitting device" includes a layer that outputs light when a voltage is applied. It may refer to any portion of a light emission layer, namely a self-emission layer, that is in contact with the pixel electrode PE and the common electrode CE. Generally, this will include all regions in which the three layers are present in the pixel and in which the bank 103 is not present, as shown in FIG. 9.

The pixel electrode PE may be referred to as an anode electrode or a first electrode of the self-emitting device ED, or may be referred to as a reflective electrode, or a lower electrode. The pixel electrode PE may be disposed over the planarization layer 102 overlapping an emission area EA of each subpixel SP. The pixel electrode PE may be disposed to overlap at least a portion or all of the pixel circuit PC.

The pixel electrode PE may include a plurality of pixel division electrodes PEa and PEb which are disposed in an emission area EA to overlap at least a portion or all of the pixel circuit PC, but embodiments of the present disclosure are not limited thereto, and may include a single electrode structure which is formed as a single body (or one body) in the emission area EA to overlap at least a portion or all of the pixel circuit PC.

The pixel electrode PE according to an embodiment of the present disclosure may include a first pixel division electrode PEa disposed in one region of the emission area EA and a second pixel division electrode PEb disposed in another region of the emission area EA. The plurality of pixel division electrodes PEa and PEb may be disposed spaced apart from each other within a corresponding emission area EA (or a subpixel area SPA). One side of each of the plurality of pixel division electrodes PEa and PEb may extend (or protrude) to a first electrode SD1 of a driving TFT Tdr and may be connected to the first electrode SD1 of a driving TFT Tdr through an electrode contact hole ECH in common. For example, each of the plurality of pixel division electrodes PEa and PEb may branch from the electrode contact hole ECH disposed within the emission area EA (or the subpixel area SPA).

The plurality of pixel division electrodes PEa and PEb may be implemented for repairing (or normalizing) a corresponding subpixel when a defect occurs due to particles in a manufacturing process. For example, when a defect occurs in a first pixel division electrode PEa of the plurality of pixel division electrodes PEa and PEb due to particles, the first electrode SD1 of the driving TFT Tdr may be electrically disconnected (or decoupled) from the first pixel division electrode PEa by cutting an extension portion of the first pixel division electrode PEa in a repair process, and thus, a corresponding subpixel may be repaired (or normalized) through the other pixel division electrode PEb except the first pixel division electrode PEa.

The pixel electrode PE may include a stack structure of at least two or more-layer pixel electrode layers PEL1 and PEL2. For example, each of the at least two or more-layer pixel electrode layers PEL1 and PEL2 may include at least one material selected from among indium tin oxide (ITO), indium zinc oxide (IZO), aluminum (Al), silver (Ag), molybdenum (Mo), titanium (Ti), MoTi, and copper (Cu). For example, the at least two or more-layer pixel electrode layers PEL1 and PEL2 may be sequentially stacked over the planarization layer 102, and then, may be simultaneously patterned, but embodiments of the present disclosure are not limited thereto.

The pixel electrode PE according to an embodiment of the present disclosure may have a two-layer structure including a first pixel electrode layer (or a first metal layer) PEL1 disposed over the planarization layer 102 and a second pixel electrode layer (or a second metal layer) PEL2 disposed (or stacked) over the first pixel electrode layer PELL. The first and second pixel electrode layers PEL1 and PEL2 may be sequentially deposited over the planarization layer 102, and then, may be simultaneously patterned, but embodiments of the present disclosure are not limited thereto.

The first pixel electrode layer PEL1 may act as an adhesive layer corresponding to the planarization layer 102 and may act as a secondary electrode of the self-emitting device ED, and may include indium tin oxide (ITO) or indium zinc oxide (IZO). The second pixel electrode layer PEL2 may act as a reflective plate and may perform a function of decreasing a resistance of the pixel electrode PE, and may include one material of aluminum (Al), silver (Ag), molybdenum (Mo), titanium (Ti), a Mo—Ti alloy (MoTi), and copper (Cu).

The pixel electrode PE according to another embodiment of the present disclosure may have a three-layer structure of IZO/MoTi/ITO or ITO/MoTi/ITO, a four-layer structure of ITO/Cu/MoTi/ITO, or a fifth-layer structure of ITO/MoTi/ITO/Ag/ITO, but embodiments of the present disclosure are not limited thereto.

The self-emitting device ED may be disposed over the substrate 100. The self-emitting device ED may be formed over the pixel electrode PE and may directly contact the pixel electrode PE. The pixel electrode PE may be disposed under (or below) the self-emitting device ED.

The self-emitting device ED may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). The self-emitting device ED may include an organic light emitting device, or may include a stacked or a combination structure of an organic light emitting device and a quantum dot light emitting device.

The organic light emitting device may include two or more organic light emitting parts for emitting white light (or blue light). For example, the organic light emitting device may include a first organic light emitting part and a second organic light emitting part for emitting white light based on a combination of first light and second light. For example, the first organic light emitting part may include at least one of a blue light emitting layer, a green light emitting layer, a red light emitting layer, a yellow light emitting layer, and a yellow-green light emitting layer. The second organic light emitting part may include at least one of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device may further include at least one or more function layers for enhancing emission efficiency and/or lifetime. For example, the function layer(s) may be disposed over and/or under the light emitting layer.

The common electrode CE may be disposed over the display portion AA of the substrate 100 and may be electrically coupled to the self-emitting device ED disposed at each of the plurality of subpixels SP. The common electrode CE may be referred to as a cathode electrode, a transparent electrode, an upper electrode, or a second electrode. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank 103 may be disposed over the planarization layer 102 to include an opening portion overlapping the emission area EA of the subpixel areas SPA. The bank 103 may be disposed over the planarization layer 102 to cover a periphery portion of the pixel electrode PE. The bank 103 may be adjacent the emission area EA (or the opening portion) of each of the plurality of subpixels SP and may electrically isolate the pixel electrodes PE disposed in adjacent subpixels SP. The bank 103 may be formed to cover the electrode contact hole ECH disposed in each pixel areas PA. The bank 103 may be covered by the self-emitting device ED of the light emitting device layer EDL. For example, the self-emitting device ED may be disposed over the bank 103 as well as over the pixel electrode PE of each of the plurality of subpixels SP.

The dam portion 104 may be implemented at a periphery portion of the substrate 100 or at periphery portions of the outermost pixels Po. The dam portion 104 may be disposed over the circuit layer 101 of the display portion AA to one-dimensionally have a closed loop line shape (or a continuous line shape or a closed loop shape) along a third margin area MA3 of outermost pixels Po. For example, the dam portion 104 may be supported by an interlayer insulation layer ILD of the circuit layer 101 based on a formation position, or may be disposed over the switching circuit portion 170. For example, the third margin area MA3 may be an area including the dam portion 104.

The dam portion 104 may be implemented to isolate (or disconnect or separate) at least some layers of the light emitting device layer EDL disposed at the periphery portions of the substrate 100 or the periphery portions of the outermost pixels Po. At the periphery portions of the substrate 100 or the periphery portions of the outermost pixels Po, the dam portion 104 may include a function of physically isolating (or disconnecting or separating) the self-emitting device ED of the light emitting device layer EDL, a function of blocking the spread or overflow of the organic encapsulation layer, and a function of preventing the penetration of water (or moisture) in the lateral direction of the substrate 100. A structure of the dam portion 104 for isolating (or disconnecting or separating) the light emitting device layer EDL will be described below.

The encapsulation layer 106 may be disposed over a remaining portion other than an outermost periphery portion of the substrate 100 and may be implemented to cover the light emitting device layer EDL. The encapsulation layer 106 may be implemented over the substrate 100 to surround all of the front surface and lateral surfaces of the light emitting device layer EDL. For example, the encapsulation layer 106 may be implemented to surround all of the front surface and lateral surfaces of the light emitting device layer EDL, and thus, may prevent oxygen or water (or moisture) from penetrating into the light emitting device layer EDL, thereby improving the reliability of the light emitting device layer EDL against oxygen or water (or moisture).

The encapsulation layer 106 may include first to third encapsulation layers 106a, 106b, and 106c.

The first encapsulation layer 106a may be implemented to prevent oxygen or water (or moisture) from penetrating into the light emitting device layer EDL. The first encapsulation layer 106a may be disposed over the common electrode CE and may surround the light emitting device layer EDL. Therefore, all of a front surface and lateral surfaces of the light emitting device layer EDL may be surrounded by the first encapsulation layer 106a. The first encapsulation layer 106a may be a first inorganic encapsulation layer including an inorganic material. For example, the first encapsulation layer 106a may include a single-layer structure, including one of silicon oxide (SiOx), silicon nitride (SiNx), silicon oxynitride (SiONx), titanium oxide (TiOx), and aluminum oxide (AlOx), or a stack structure thereof.

The second encapsulation layer 106b may be implemented over the first encapsulation layer 106a disposed at an encapsulation region defined by the dam portion 104 to have a thickness which is relatively thicker than the first encapsulation layer 106a. The second encapsulation layer 106b may have a thickness that is configured to fully cover particles (or an undesired material or an undesired structure element) which are or may be on the first encapsulation layer 106a. The second encapsulation layer 106b may be surrounded by the dam portion 104. The second encapsulation layer 106b may spread to the periphery portion of the substrate 100 due to a relatively thick thickness, but the spread of the second encapsulation layer 106b may be blocked by the dam portion 104. The second encapsulation layer 106b may include an organic material or a liquid organic material. For example, the second encapsulation layer 106b may include an organic material such as silicon oxycarbon (SiOCz) acrylic or epoxy-based resin, or the like. For example, the second encapsulation layer 106b may be referred to as a particle cover layer, or an organic encapsulation layer, or the like.

The third encapsulation layer 106c may be implemented to primarily prevent oxygen or water (or moisture) from penetrating into the light emitting device layer EDL. The third encapsulation layer 106c may be implemented to surround all of the second encapsulation layer 106b disposed inside from the dam portion 105 and the first encapsulation layer 106a disposed outside from the dam portion 105. The third encapsulation layer 106c according to an embodiment of the present disclosure may include an inorganic material which is the same as or different from the first encapsulation layer 106a. The third encapsulation layer 106c may be a second inorganic encapsulation layer including an inorganic material.

The light emitting display apparatus 10 or the substrate 100 according to an embodiment of the present disclosure may further include a separation portion 105.

The separation portion 105 may be disposed or implemented at the periphery portions of the substrate 100 or periphery portions of the outermost pixels Po. The separation portion 105 may be disposed or implemented at the periphery portion of the substrate 100 or the periphery portions of the outermost pixels Po to one-dimensionally have a closed loop line shape (or a continuous line shape or a closed loop shape) along a near region of the dam portion 104, in the third margin area MA3 of the outermost pixels Po. For example, the separation portion 105 may be disposed on the circuit layer 101 and may be supported by the buffer layer 101a or the interlayer insulation layer ILD of the circuit layer 101.

In the outermost pixels Po, a first margin area MA1 may be disposed between the third margin area MA3 and an emission area EA. For example, the first margin area MA1 may be disposed between an end of the emission area EA (or the bank 103) of the outermost pixel Po and the dam portion 104 based on the reliability margin of the light emitting device layer EDL caused by lateral penetration of water (or moisture). For example, a second margin area MA2 may be disposed between the outer surface OS1a of the substrate 100 and the third margin area MA3. For example, the second margin area MA2 may be configured to have a second width between the outer surface OS1a of the substrate 100 and the dam portion 104 based on the reliability margin of the light emitting device layer EDL caused by lateral penetration of water (or moisture), and may include the first pad portion 110. The third margin area MA3 may be disposed between the first margin area MA1 and the second margin area MA2, and may include the dam portion 104.

The separation portion 105 may be implemented to isolate (or disconnect or separate) the self-emitting device ED disposed at a periphery portion of the outermost pixels Po. The separation portion 105 may be implemented to prevent the penetration of water (or moisture) in a lateral direction of the substrate 100 to prevent the self-emitting device ED from being degraded by the lateral penetration of water (or moisture). The separation portion 105 may isolate (or disconnect or separate) the self-emitting device ED of the light emitting device layer EDL at least once near the dam portion 104, and thus, may prevent the lateral penetration of water (or moisture). The separation portion 105 will be described below.

Referring to FIGS. 2, 4, 8, and 10, the light emitting display apparatus 10 or the substrate 100 according to an embodiment of the present disclosure may further include a first pad portion 110.

The first pad portion 110 may be disposed at one periphery portion of the substrate 100 and may be electrically connected to the pixel driving lines DL, GL, PL, CVL, RL, and GCL in a one-to-one relationship.

The first pad portion 110 according to an embodiment may include a plurality of first pads 111 disposed inside the circuit layer 101. The plurality of first pads 111 may be divided (or classified) into first data pads DP, first gate pads GP, first pixel driving power pads PPP, first reference voltage pads RVP, and first pixel common voltage pads CVP. The first pad portion 110 according to an embodiment may further include first to third front sensing control pads 112*a*, 112*b*, and 112*c* and first to third pad connection lines 176, 177, and 178.

Each of the plurality of first pads 111 and the first to third front sensing control pads 112*a*, 112*b*, and 112*c* may be disposed over the interlayer insulation layer ILD and may be electrically connected to (or contact) a corresponding line of the pixel driving lines DL, GL, PL, CVL, RL, and GCL through a pad contact hole PCH passing through the interlayer insulation layer ILD and the buffer layer 101*a*. For example, each of the plurality of first pads 111 and the first to third front sensing control pads 112*a*, 112*b*, and 112*c* according to an embodiment may include the same material as the pixel electrode PE and may be formed together with the pixel electrode PE. For example, each of the plurality of first pads 111 and the first to third front sensing control pads 112*a*, 112*b*, and 112*c* according to another embodiment may include the same material as source/drain electrodes of a TFT and may be formed together with the source/drain electrodes of the TFT.

A portion of each of the plurality of first pads 111 and the first to third front sensing control pads 112*a*, 112*b*, and 112*c* may be exposed over the substrate 100 through a pad open hole POH formed at the passivation layer PAS.

Referring again to FIG. 9, the light emitting display apparatus 10 or the substrate 100 according to an embodiment of the present disclosure may further include a wavelength conversion layer 107 disposed over the encapsulation layer 106.

The wavelength conversion layer 107 may convert white light (or blue light), which is incident thereon from an emission area EA of each subpixel area SPA, into color light corresponding to each subpixel area SPA or may transmit only color light corresponding to the subpixel SP. For example, the wavelength conversion layer 107 may include at least one of a wavelength conversion member and a color filter layer.

The wavelength conversion layer 107 may include a plurality of wavelength conversion members 107*a* and a protection layer 107*b*.

The plurality of wavelength conversion members 107*a* may be disposed over the encapsulation layer 106 disposed at the emission area EA of each subpixel SP. For example, the plurality of wavelength conversion members 107*a* may have the same size as or wider than the emission area EA of each subpixel SP. The plurality of wavelength conversion members 107*a* may be grouped (or classified) into red light filter (or a first light filter) disposed over the encapsulation layer 106 in the emission area EA of a red subpixel SP, a green light filter (or a second light filter) disposed over the encapsulation layer 106 in the emission area EA of a green subpixel SP, and a blue light filter (or a third light filter) disposed over the encapsulation layer 106 in the emission area EA of a blue subpixel SP.

The protection layer 107*b* may be implemented to cover the wavelength conversion members 107*a* and to provide a flat surface over the wavelength conversion members 107*a*. The protection layer 107*b* may be disposed to cover the wavelength conversion members 107*a* and the encapsulation layer 106 where the wavelength conversion members 107*a* are not disposed. The protection layer 107*b* according to an embodiment may include an organic material. Alternatively, the protection layer 107*b* may further include a getter material for adsorbing water and/or oxygen.

Alternatively, the wavelength conversion layer 107 may be changed to (or configured as) a wavelength conversion sheet having a sheet form and may be disposed over the encapsulation layer 106. In this case, the wavelength conversion sheet (or a quantum dot sheet) may include the wavelength conversion members 107*a* interposed between a pair of films. For example, when the wavelength conversion layer 107 or wavelength conversion sheet includes a quantum dot which re-emits colored light set in a subpixel SP, the light emitting device layer EDL of a subpixel SP may be implemented to emit white light or blue light.

The light emitting display apparatus 10 or the substrate 100 according to an embodiment of the present disclosure may further include a functional film 108. The functional film 108 may be disposed over the wavelength conversion layer 107. For example, the functional film 108 may be coupled to the wavelength conversion layer 107 by a transparent adhesive member. The functional film 108 according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 100, from traveling to the outside. The barrier layer may include a material (for example, a polymer material) which is low in water transmission rate, and may primarily prevent the penetration of water or oxygen. The touch sensing layer may include a touch electrode layer based on a mutual capacitance method or a self-capacitance method, and may output touch data corresponding to a user's touch through the touch electrode layer. The light path control layer may include a stacked structure where a high refraction layer and a low refraction layer are alternately stacked and may change a path of light incident from each pixel P to minimize or reduce a color shift based on a viewing angle.

The light emitting display apparatus 10 or the substrate 100 according to an embodiment of the present disclosure may further include a side sealing member 109.

The side sealing member 109 may be formed between the substrate 100 and the functional film 108 and may cover all of lateral surfaces of the circuit layer 101 and the wavelength conversion layer 107. For example, the side sealing member 109 may cover all of lateral surfaces of each of the circuit layer 101 and the wavelength conversion layer 107 exposed at the outside of the light emitting display apparatus, between the functional film 108 and the substrate 100. Also, the side sealing member 109 may cover a portion of the routing portion 400 connected to the first pad portion 110 of the substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the first pad portion 110 of the substrate 100 may prevent or minimize or reduce the reflection of external light caused by the first pads 111 disposed at the first pad portion 110. Optionally, the side sealing member 109 may further include a getter material for adsorbing water (or moisture) and/or oxygen.

The light emitting display apparatus 10 or the substrate 100 according to an embodiment of the present disclosure may further include a first chamfer 100*c* which is provided at a corner portion between the first surface 100*a* and the outer surface OS. The first chamfer 100*c* may reduce or minimize the damage of the corner portion of the substrate 100 caused by a physical impact applied from the outside and may prevent a disconnection of the routing portion 400 caused by the corner portion of the substrate 100. For example, the first chamfer 100*c* may have a 45-degree angle, but embodiments of the present disclosure are not limited thereto. The first chamfer 100*c* may be implemented by a chamfer process using a cutting wheel, a polishing wheel, a laser, or the like. Accordingly, each of outer surfaces of the first pads 111 of the first pad portion 110 disposed to contact the first chamfer 100*c* may include an inclined surface which is inclined by an angle corresponding to an angle of the first chamfer 100*c* by removing or polishing a corresponding portion thereof together with the corner portion of the substrate 100 through the chamfer process. For example, when the first chamfer 100*c* is formed at an angle of 45 degrees between the outer surface OS and the first surface 100*a* of the substrate 100, the outer surfaces (or one ends) of the first pads 111 of the first pad portion 110 may be formed at an angle of 45 degrees.

Referring to FIGS. 2, 4, 7, and 9, the line substrate 200 according to an embodiment of the present disclosure may include a second pad portion 210, at least one third pad portion 230, and a link line portion 250.

The second pad portion 210 may include a plurality of second pads 211 which are disposed at the rear surface 200*b* of the line substrate 200 to overlap a plurality of first pads disposed in the first pad portion 110 in a one-to-one relationship. The plurality of second pads 211 may be grouped (or classified) into a plurality of second pixel driving power pads, a plurality of second data pads, a plurality of second reference voltage pads, a plurality of second gate pads, and a plurality of second pixel common voltage pads.

The plurality of second pixel driving power pads may overlap each of the plurality of first pixel driving power pads PPP1 disposed at the first pad portion 110. The plurality of second data pads may overlap each of the plurality of first data pads DP1 disposed at the first pad portion 110. The plurality of second reference voltage pads may overlap each of the plurality of first reference voltage pads RVP1 disposed at the first pad portion 110. The plurality of second gate pads may overlap each of the plurality of first gate pads GP1 disposed at the first pad portion 110. The plurality of second pixel common voltage pads may overlap each of the plurality of first pixel common voltage pads CVP1 disposed at the first pad portion 110.

The second pad portion 210 may further include first to third rear sensing control pads respectively overlapping the first to third front sensing control pads 112*a* to 112*c* disposed in the first pad portion 110. According to an embodiment of the present disclosure, each of first to third rear sensing control pads may be selected from among a plurality of rear dummy pads respectively overlapping a plurality of front dummy pads. For example, the second pad portion 210 may include a plurality of rear pads, the plurality of rear pads be grouped (or classified) into a plurality of second pixel driving power pads, a plurality of second data pads, a plurality of second reference voltage pads, a plurality of second gate pads, a plurality of second pixel common voltage pads, and first to third rear sensing control pads.

The at least one third pad portion 230 may include a plurality of third pads (or input pads) 231 which are spaced apart from one another by a certain interval. For example, the plurality of third pads 231 may be grouped (or classified) into a plurality of third pixel driving power pads, a plurality of third data pads, a plurality of third reference voltage pads, a plurality of third gate pads, and at least one third pixel common voltage pads. The at least one third pad portions 230 may be coupled to the driving circuit part 500 and may receive a pixel driving power, a data signal, a reference voltage, a gate control signal, and a pixel common voltage from the driving circuit part 500. The driving circuit part 500 may supply a ground voltage to the metal line 104*m*.

Moreover, the at least one third pad portions 230 may further include first to third switching control signal pads which receive first to third switching control signals from the driving circuit part 500.

The link line portion 250 may include a plurality of link lines disposed between the second pad portion 210 and the at least one third pad portion 230 among the rear surface 200*b* of the line substrate 200

The plurality of link lines may be grouped (or classified) into a plurality of pixel driving power link lines, a plurality of data link lines, a plurality of reference voltage link lines, a plurality of gate link lines, and at least one pixel common voltage link lines.

The plurality of pixel driving power link lines may be individually (or in a one-to-one relationship) connected (or coupled) to each of the plurality of second pixel driving power pads and each of the plurality of third pixel driving power pads. The plurality of data link lines may be individually (or in a one-to-one relationship) connected (or coupled) to each of the plurality of second data pads and each of the plurality of third data pads. The plurality of reference voltage link lines may be individually (or in a one-to-one relationship) connected (or coupled) to each of the plurality of second reference voltage pads and each of the plurality of third reference voltage pads. The plurality of gate link lines may be individually (or in a one-to-one relationship) connected (or coupled) to each of the plurality of second gate pads and each of the plurality of third gate pads. The at least one pixel common voltage link lines may be connected (or coupled) to each of the plurality of second pixel common voltage pads and the at least one third pixel common voltage pads in common.

Moreover, in the link line portion 250, a plurality of link lines may be further divided (or classified) into first to third sensing control link lines. For example, the link line portion 250 may further include the first to third sensing control link lines. The first to third sensing control link lines may be individually (or a one-to-one relationship) connected to each of the first to third rear sensing control pads disposed at the second pad portion 210 and each of the first to third switching control signal pads disposed at the at least one third pad portion 250.

The light emitting display apparatus 10 or the line substrate 200 according to an embodiment of the present disclosure may further include a metal pattern layer and an insulation layer.

The metal pattern layer (or a conductive pattern layer) may include a plurality of metal layers. The metal pattern layer may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over the rear surface 200*b* of the line substrate 200. The first metal layer 201 may include a first metal pattern. For example, the first metal layer 201 may be referred to as a first link layer or a link line layer. The first metal pattern may be used as link lines of the link line portion 250.

The first insulation layer 202 may be implemented over the rear surface 200*b* of the line substrate 200 to cover the first metal layer 201. The first insulation layer 202 according to an embodiment may include an inorganic material.

The second metal layer 203 may be implemented over the first insulation layer 202. The second metal layer 203 according to an embodiment may include a second metal pattern. For example, the second metal layer 203 may be referred to as a second link layer, a jumping line layer, or a bridge line layer. The second metal pattern may be used as the gate link lines among the link lines of the link line portion 250, but embodiments of the present disclosure are not limited thereto. For example, the second metal layer 203 may be used as a jumping line (or a bridge line) for electrically connecting the link lines which are formed of different metal materials on different layers in the link line portion 250.

Optionally, a link line (for example, a plurality of first link lines) disposed at the second metal layer 203 may be modified to be disposed at the first metal layer 201, and a link line (for example, a plurality of second link lines) disposed at the first metal layer 201 may be modified to be disposed at the second metal layer 203.

The second insulation layer 204 may be implemented over the rear surface 200b of the line substrate 200 to cover the second metal layer 203. The second insulation layer 204 according to an embodiment may include an inorganic material.

The third metal layer 205 may be implemented over the second insulation layer 204. The third metal layer 205 according to an embodiment may include a third metal pattern. For example, the third metal layer 205 may be referred to as a third link layer or a pad electrode layer. The third metal pattern may be used as the pads of the second pad portion 210. For example, the pads of the second pad portion 210 formed of the third metal layer 205 may be electrically connected to (or contact) the first metal layer 201 through the pad contact holes formed at the first and second insulation layers 202 and 204.

The third insulation layer 206 may be implemented over the rear surface 200b of the line substrate 200 to cover the third metal layer 205. The third insulation layer 206 according to an embodiment may include an organic material. For example, the third insulation layer 206 may include an insulating material such as photo acrylic or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

The routing portion 400 according to an embodiment may include a plurality of routing lines 410 which are disposed at each of a first outer surface OS1a among the outer surface OS of the substrate 100 and a first outer surface OS1b among the outer surface OS of the line substrate 200.

Each of the plurality of routing lines 410 may be electrically connected to each of the first pads 111 of the first pad portion 110 and the second pads 211 of the second pad portion 210 in a one-to-one relationship. In other words, each of the plurality of routing lines 410 may be electrically connected to a respective one of the first pads 111 of the first pad portion 110 and to a respective one of the second pads 211 of the second pad portion 210. The plurality of routing lines 410 may be grouped (classified) into a plurality of pixel power routing lines, a plurality of data routing lines, a plurality of reference voltage routing lines, a plurality of gate routing lines, and a plurality of pixel common voltage routing lines.

The plurality of pixel power routing lines may be individually (or in a one-to-one relationship) connected (or coupled) to each of the plurality of first pixel driving power pads PPP1 disposed at the first pad portion 110 and each of the plurality of second pixel driving power pads disposed at the second pad portion 210. The plurality of data routing lines may be individually (or in a one-to-one relationship) connected (or coupled) to each of the plurality of first data pads DP1 disposed at the first pad portion 110 and each of the plurality of second data pads disposed at the second pad portion 210. The plurality of reference voltage routing lines may be individually (or in a one-to-one relationship) connected (or coupled) to each of the plurality of first reference voltage pads RVP1 disposed at the first pad portion 110 and each of the plurality of second reference voltage pads disposed at the second pad portion 210. The plurality of gate routing lines may be individually (or in a one-to-one relationship) connected (or coupled) to each of the plurality of first gate pads GP1 disposed at the first pad portion 110 and each of the plurality of second gate pads disposed at the second pad portion 210. The plurality of pixel common voltage routing lines may be individually (or a in one-to-one relationship) connected (or coupled) to each of the plurality of first pixel common voltage pads CVP1 disposed at the first pad portion 110 and each of the plurality of second pixel common voltage pads disposed at the second pad portion 210.

Moreover, in the routing portion 400, the plurality of routing lines 410 may be further divided (or classified) into first to third sensing control routing lines. For example, the routing portion 400 may further include the first to third sensing control routing lines. The first to third sensing control routing lines may be individually (or in a one-to-one relationship) connected to each of the first to third front sensing control pads 112a, 112b, and 112c disposed at the first pad portion 110 and each of the first to third rear sensing control pads disposed at the second pad portion 210.

Each of the plurality of routing lines 410 and the first to third sensing control routing lines may be formed to surround the outer surface OS1a of the substrate 100 and the outer surface OS1b of the line substrate 200. According to an embodiment of the present disclosure, each of the plurality of routing lines 410 and the first to third sensing control routing lines may be formed by a printing process using a conductive paste. According to another embodiment of the present disclosure, each of the plurality of routing lines 410 and the first to third sensing control routing lines may be formed by a transfer process that transfers the conductive paste pattern to a transfer pad of a flexible material and transfers the conductive paste pattern transferred to the transfer pad to the routing portion 400. For example, the conductive paste may be an Ag paste, but embodiments of the present disclosure are not limited thereto.

The light emitting display apparatus 10 or the routing portion 400 according to an embodiment of the present disclosure may further include an edge coating layer 430.

The edge coating layer 430 may be implemented to cover the routing portion 400. The edge coating layer 430 may be implemented to cover each of the plurality of routing lines 410 and the first to third sensing control routing lines. For example, the edge coating layer 430 may be an edge protection layer or an edge insulation layer.

The edge coating layer 430 according to an embodiment may be implemented to cover all of the first periphery portion and the first outer surface OS1a of the substrate 100 and the first periphery portion and the first outer surface OS1b of the line substrate 200 as well as the plurality of routing lines 410 and the first to third sensing control routing lines. The edge coating layer 430 may prevent the corrosion of each of the plurality of routing lines 410 and the first to third sensing control routing lines including a metal material, or may prevent electrical short circuit between the plurality of routing lines 410 and each of the first to third sensing control routing lines. Also, the edge coating layer 430 may prevent or minimize or reduce the reflection of external light caused by the plurality of routing lines 410, the first to third sensing control routing lines, and the first pads 111 of the first pad portion 110. The edge coating layer 430 may include a light blocking material including black ink. The edge coating layer 430 may implements (or configures) the outermost lateral surface (or sidewall) of the light emitting display apparatus (or the light emitting display panel), and thus, may include an impact absorbing material (or substance) or a ductile material so as to prevent the damage of an outer surface OS of the substrates 100 and 200 due to external impact. As another embodiment, the edge coating layer 430 may include a mixed material of a light blocking material and an impact absorbing material.

A dam portion 104, a plurality of switching circuit portions 170, and a separation portion 105 will be described below with reference to FIGS. 9, 11, and 12.

Each of first to third dams 104-1 to 104-3 of the dam portion 104 according to an embodiment of the present disclosure may include a first dam pattern (or a lower dam) 104a, a second dam pattern (or a middle dam) 104b, a metal line 104m, and a third dam pattern (or an upper dam) 104c.

The first dam pattern 104a may be disposed over a circuit layer 101 of a third margin area MA3 of the substrate 100 or the outermost pixel Po. A portion of the first dam pattern 104a may be disposed on the switching circuit portion 170. The first dam pattern 104a may be formed of an inorganic material.

According to an embodiment of the present disclosure, the first dam pattern 104a may include the same material as that of a passivation layer PAS. The first dam pattern 104a may be implemented in a single layer structure of the passivation layer PAS. In this case, the first dam pattern 104a may be formed or implemented by a portion (or a non-patterning region) of the passivation layer PAS which remains intactly without being patterned (or removed) by a patterning process of the passivation layer PAS disposed over the interlayer insulation layer ILD of the third margin area MA3.

According to an embodiment of the present disclosure, the first dam pattern 104a may be implemented in a stack structure of the passivation layer PAS and the interlayer insulation layer ILD. In this case, the first dam pattern 104a may be formed or implemented by a portion (or a non-patterning region) of the interlayer insulation layer ILD and the passivation layer PAS which remains intactly without being patterned (or removed) by a patterning process of the interlayer insulation layer ILD and the passivation layer PAS disposed over the buffer layer 101a of the third margin area MA3.

A side surface of the first dam pattern 104a may be implemented in an inclined structure or a forward tapered structure. For example, a cross-sectional surface of the first dam pattern 104a taken along a width direction may have a cross-sectional structure having a trapezoid shape where a top side is narrower than a lower side.

The second dam pattern 104b may be disposed over the first dam pattern 104a. The second dam pattern 104b according to an embodiment may be formed of an inorganic material. For example, the second dam pattern 104b may be formed of the same material as the planarization layer 102. The second dam pattern 104b may have the same height (or thickness) as the planarization layer 102, or may have a height which is higher than the planarization layer 102. For example, a height (or thickness) of the second dam pattern 104b may be twice a height (or thickness) of the planarization layer 102, based on two depositions of the planarization layer 102. The second dam pattern 104b may be formed or implemented by a portion (or a non-patterning region) of the planarization layer 102 which remains intactly without being patterned (or removed) by a patterning process of the planarization layer 102.

A lateral surface of the second dam pattern 104b may be implemented in an inclined structure or a forward tapered structure. For example, a cross-sectional surface of the second dam pattern 104b taken along a width direction may have a cross-sectional structure having the same trapezoid shape as the first dam pattern 104a. With respect to the width direction, each of one edge portion and the other edge portion of the second dam pattern 104b may protrude to the outside of the side surface of the first dam pattern 104a. For example, a distance between an end of a lateral surface of the second dam pattern 104b and an end of a lateral surface of the first dam pattern 104a may be greater than a thickness obtained by summating a thickness of the self-emitting device ED and a thickness of the common electrode CE.

The lateral surface of the first dam pattern 104a may have an undercut structure with respect to the second dam pattern 104b. For example, the dam portion 104 may include an undercut region disposed at a boundary portion between the first dam pattern 104a and the second dam pattern 104b or at an upper lateral surface of the first dam pattern 104a. The undercut region between a lateral surface of the first dam pattern 104a and the second dam pattern 104b may be a structure for isolating (or disconnecting or separating) at least a portion of the light emitting device layer EDL disposed over the dam portion 104. For example, the undercut region between the first dam pattern 104a and the second dam pattern 104b may be formed or implemented by an over-etching process performed on the passivation layer PAS. The second dam pattern 104b may protrude to the outside of the lateral surface of the first dam pattern 104a based on an undercut structure of the first dam pattern 104a, and thus, may cover the lateral surface of the first dam pattern 104a. Accordingly, the second dam pattern 104b may have an eaves structure with respect to the first dam pattern 104a.

The metal line 104m may be disposed over the second dam pattern 104b. The metal line 104m may be stacked over the second dam pattern 104b with the same material or the same structure as the pixel electrode PE. The metal line 104m may be formed or implemented by a portion (or a non-patterning region) of the pixel electrode PE which remains intactly over the second dam pattern 104b without being patterned (or removed) by a patterning process of the pixel electrode PE.

The third dam pattern 104c may be disposed over the second dam pattern 104b to surround the metal line 104m. A lateral surface of the third dam pattern 104c may be implemented in an inclined structure or a forward tapered structure. For example, the third dam pattern 104c taken along a widthwise direction may have a cross-sectional structure having a trapezoid shape which is the same as the second dam pattern 104b.

The third dam pattern 104c may include an organic material or an inorganic material. For example, the third dam pattern 104c may be stacked over the second dam pattern 104b with the same material as a bank 103. The third dam pattern 104c may be formed or implemented by a portion (or a non-patterning region) of the bank 103 which remains intactly over the second dam pattern 104b without being patterned (or removed) by a patterning process of the bank 103.

According to an embodiment, a material layer of the self-emitting device ED disposed over each of the first to third dam 104-1, 104-2, and 104-3 may be automatically isolated (or disconnected or separated) in performing a deposition process, based on the undercut region (or the eaves structure) between the first dam pattern 104a and the second dam pattern 104b. For example, because the deposition material of the self-emitting device ED has linearity, the material layer of the self-emitting device ED may not be deposited over the lateral surface of the first dam pattern 104a covered by the second dam pattern 104b and may be deposited on a top surface and a lateral surface of each of the first to third dam 104-1, 104-2, and 104-3 and a circuit layer 101, and thus, may be isolated (or disconnected or separated) in the undercut region between the first dam pattern 104a and the second dam pattern 104b of each of the first to third dam 104-1, 104-2, and 104-3. Accordingly, the self-emitting device ED may be automatically isolated (or disconnected or separated) at each of the first to third dam 104-1, 104-2, and 104-3 in performing a deposition process, and thus, a separate patterning process of isolating (or disconnecting or separating) the self-emitting device ED may be omitted. Accordingly, the self-emitting device ED disposed over the substrate 100 may be isolated (or disconnected or separated) at each of the first to third dam 104-1, 104-2, and 104-3, and thus, a lateral water penetration path of the substrate 100 may be blocked by each of the first to third dam 104-1, 104-2, and 104-3.

Additionally, the common electrode CE disposed over the self-emitting device ED may be automatically isolated (or separated) by the undercut region of each of the first to third dam 104-1, 104-2, and 104-3 like the self-emitting device ED, in performing a deposition process based on deposition method, or may be formed to surround all of each of the first to third dam 104-1, 104-2, and 104-3 and the self-emitting devices EDi of island shape isolated by each of the first to third dam 104-1, 104-2, and 104-3 without being isolated by the undercut region of each of the first to third dam 104-1, 104-2, and 104-3.

Referring to FIGS. 8, 9, and 11, the metal line 104m of the first dam 104-1 may overlap or intersect with each of the first pad connection line 176 and the gate electrode Sg of the first switching circuit 171 of each of the plurality of switching circuit portions 170. The metal line 104m of the first dam 104-1 may be electrically connected to (or contact) the first pad connection line 176 through a via hole 176h formed in an overlap region between the first pad connection line 176 and the first dam 104-1. The metal line 104m of the first dam 104-1 may be electrically connected to (or contact) the gate electrode Sg of the first switching circuit 171 through a first control line contact hole CLh1 formed in an overlap region between the gate electrode Sg of the first switching circuit 171 and the first dam 104-1. Therefore, the metal line 104m embedded in the first dam 104-1 may be disposed in a closed loop line shape which is continuously disposed at the periphery portion of the substrate 100, and thus, may supply a first switching control signal, supplied through the first front sensing control pad 112a and the first pad connection line 176, to the gate electrode Sg of the first switching circuit 171 of each of the plurality of switching circuit portions 170.

For example, the metal line 104m embedded in the first dam 104-1 may be used as a first switching control line.

The metal line 104m of the second dam 104-2 may overlap or intersect with each of the second pad connection line 177 and the gate electrode Sg of the second switching circuit 172 of each of the plurality of switching circuit portions 170. The metal line 104m of the second dam 104-2 may be electrically connected to (or contact) the second pad connection line 177 through a via hole 177h formed in an overlap region between the second pad connection line 177 and the second dam 104-2. The metal line 104m of the second dam 104-2 may be electrically connected to (or contact) the gate electrode Sg of the second switching circuit 172 through a second control line contact hole CLh2 formed in an overlap region between the gate electrode Sg of the second switching circuit 172 and the second dam 104-2. Therefore, the metal line 104m embedded in the second dam 104-2 may be disposed in a closed loop line shape which is continuously disposed at the periphery portion of the substrate 100, and thus, may supply a second switching control signal, supplied through the second front sensing control pad 112b and the second pad connection line 177, to the gate electrode Sg of the second switching circuit 172 of each of the plurality of switching circuit portions 170. For example, the metal line 104m embedded in the second dam 104-2 may be used as a second switching control line.

The metal line 104m of the third dam 104-3 may overlap or intersect with each of the third pad connection line 178 and the gate electrode Sg of the third switching circuit 173 of each of the plurality of switching circuit portions 170. The metal line 104m of the third dam 104-3 may be electrically connected to (or contact) the third pad connection line 178 through a via hole 178h formed in an overlap region between the third pad connection line 178 and the third dam 104-3. The metal line 104m of the third dam 104-3 may be electrically connected to (or contact) the gate electrode Sg of the third switching circuit 173 through a third control line contact hole CLh3 formed in an overlap region between the gate electrode Sg of the third switching circuit 173 and the third dam 104-3. Therefore, the metal line 104m embedded in the third dam 104-3 may be disposed in a closed loop line shape which is continuously disposed at the periphery portion of the substrate 100, and thus, may supply a third switching control signal, supplied through the third front sensing control pad 112c and the third pad connection line 178, to the gate electrode Sg of the third switching circuit 173 of each of the plurality of switching circuit portions 170. For example, the metal line 104m embedded in the third dam 104-3 may be used as a third switching control line.

Additionally, the metal line 104m embedded in each of the first to third dams 104-1, 104-2, and 104-3 may be used as a switching control line for supplying the plurality of switching circuit portions 170 with a switching control signal supplied from the driving circuit part 500 in a test mode of the light emitting display apparatus, and moreover, may be used as an anti-electrostatic line or a static electricity blocking line in a normal driving mode or an image display mode of the light emitting display apparatus. For example, in the normal driving mode or the image display mode of the light emitting display apparatus, the driving circuit part 500 may supply an anti-electrostatic power to the metal line 104m embedded in each of the first to third dams 104-1, 104-2, and 104-3. For example, the anti-electrostatic power may be a ground voltage or a pixel common voltage. Accordingly, the metal line 104m embedded in each of the first to third dams 104-1, 104-2, and 104-3 may block static electricity flowing into the display portion AA from the outside to prevent a defect caused by static electricity.

Additionally, in an overlap region between the metal line 104m embedded in each of the first to third dams 104-1, 104-2, and 104-3 and the first to third pad connection lines 176, 177, and 178, due to a distance (or height) between the metal line 104m and the first to third pad connection lines 176, 177, and 178, it may be difficult to form via holes 176h, 177h, and 178h for exposing the first to third pad connection lines 176, 177, and 178. Therefore, a middle metal layer may be additionally disposed between the metal line 104m and the first to third pad connection lines 176, 177, and 178. The middle metal layer may be implemented on the interlayer insulation layer ILD along with the first electrode SD1 of the driving TFT Tdr. For example, the middle metal layer may be electrically connected to (or contact) the first to third pad connection lines 176, 177, and 178 through a middle via hole which is formed to pass through the interlayer insulation layer ILD and the buffer layer 101a. Also, a portion of the metal line 104m may be electrically connected to (or contact) the middle metal layer through the via holes 176h, 177h, and 178h which pass through the second dam pattern 104b and expose the middle metal layer. Accordingly, the metal line 104m may be electrically connected to (or contact) the first to third pad connection lines 176, 177, and 178 through the middle metal layer.

The separation portion 105 according to an embodiment of the present disclosure may be implemented near (or around) the dam portion 104 to isolate (or disconnect or separate) the self-emitting device ED disposed near (or around) the dam portion 104. The separation portion 105 may be implemented to prevent the penetration of water (or moisture) in a lateral direction of the substrate 100 to prevent the self-emitting device ED from being degraded by the lateral penetration of water (or moisture). The separation portion 105 may isolate (or disconnect or separate) the self-emitting device ED of the light emitting device layer EDL at least once near (or around) the dam portion 104, thereby preventing the lateral penetration of water (or moisture). For example, the separation portion 105 may be a separation region, a separation line, an isolation region, an isolation line, a disconnection region, or a disconnection line, of the self-emitting device ED.

The separation portion 105 may be implemented over the interlayer insulation layer ILD or the buffer layer 101a of the circuit layer 101 near (or around) the dam portion 104. The separation portion 105 may include a plurality of separation structures 105-1 and 105-2 disposed near (or around) the dam portion 104. For example, the separation portion 105 may include a first separation structure 105-1 disposed between the first dam 104-1 and the second dam 104-2, and a second separation structure 105-2 disposed between the second dam 104-2 and the third dam 104-3.

The first and second separation structures 105-1 and 105-2 may be disposed over the circuit layer 101 of the display portion AA to one-dimensionally have a closed loop line shape (or a continuous line shape or a closed loop shape). The first separation structure 105-1 may be disposed to surround the first dam 104-1. The second separation structure 105-2 may be disposed to surround the second dam 104-2.

Each of the first and second separation structures 105-1 and 105-2 may include a lower structure 105a and an upper structure 105b.

The lower structure 105a may be implemented in a single layer structure based on the passivation layer PAS, or may be implemented in a stack structure of the passivation layer PAS and the interlayer insulation layer ILD. A lateral surface of the lower structure 105a may be implemented in an inclined structure or a tapered structure. For example, the lower structure 105a may be referred to as the term such as a base separation structure, a lower taper structure, or a first taper structure, or the like. The lower structure 105a may be implemented in the same structure as the first dam pattern 104a together with the first dam pattern 104a.

The upper structure 105b may be disposed over the lower structure 105a. The upper structure 105b may include an organic material. The upper structure 105b may be formed of the same material as a bank 103, but embodiments of the present disclosure are not limited thereto. A lateral surface of the upper structure 105b may be implemented in an inclined structure or a tapered structure. With respect to a widthwise direction, each of one edge portion and the other edge portion of the upper structure 105b may protrude to the outside of a lateral surface of the lower structure 105a. For example, the upper structure 105a may be referred to as the term such as an upper taper structure or a second taper structure, or the like.

A lateral surface 105as of the lower structure 105a may have an undercut structure with respect to the upper structure 105b. For example, each of the first and second separation structures 105-1 and 105-2 may include an undercut region disposed on an upper lateral surface of the lower structure 105a or a boundary portion between the lower structure 105a and the upper structure 105b. An undercut region between the lower structure 105a and the upper structure 105b may be a structure for isolating (or disconnecting or separating) at least some layers of the light emitting device layer EDL disposed on the separation portion 105. For example, the undercut region between the lower structure 105a and the upper structure 105b may be formed or implemented by an over-etching process of the passivation layer PAS. The upper structure 105b may protrude to the outside of a lateral surface of the lower structure 105a based on an undercut structure of the lower structure 105a, and thus, may cover a lateral surface of the lower structure 105a. Accordingly, the upper structure 105b may be disposed on the lower structure 105a to have an eaves structure with respect to the lower structure 105a.

At least one of the first and second separation structures 105-1 and 105-2 may further include a metal structure 105m disposed between the lower structure 105a and the upper structure 105b.

The metal structure 105m may be disposed over the lower structure 105a. The metal structure 105m may be stacked over the lower structure 105a with the same material or the same structure as the pixel electrode PE or the metal line 104m of the dam portion 104. The metal structure 105m may be formed together with the metal line 104m of the dam portion 104. A lateral surface of the metal structure 105m may be implemented in an inclined structure or a forward tapered structure. With respect to the width direction, each of one edge portion and the other edge portion of the metal structure 105m may protrude to the outside of the side surface of the lower structure 105a. For example, the metal structure 105m may be referred to as the term such as a metal pattern layer or a middle structure, or the like.

The upper structure 105b may be disposed over the metal structure 105m. The upper structure 105b may be stacked on an upper surface of the metal structure 105m. In FIGS. 9, 11, and 12, the upper structure 105b is illustrated as being disposed at only the upper surface of the metal structure 105m, but embodiments of the present disclosure are not limited thereto, and the upper structure 105b may be stacked on the lower structure 105a to surround or cover all of a lateral surface and an upper surface of the metal structure 105m. In this case, like the metal line 104m of the dam portion 104, the metal structure 105m may be embedded inside the upper structure 105b.

The lateral surface of the lower structure 105a may have an undercut structure with respect to the metal structure 105m. For example, each of the first and second separation structures 105-1 and 105-2 may include an undercut region disposed at a boundary portion between the lower structure 105a and the metal structure 105m or at an upper lateral surface of the lower structure 105a. The undercut region between the lower structure 105a and the metal structure 105m may be formed or implemented by an over-etching process of the passivation layer PAS. The metal structure 105m may protrude to the outside of the lateral surface of the lower structure 105a by the undercut structure of the lower structure 105a, and thus, may cover the lateral surface of the lower structure 105a. Accordingly, the metal structure 105m may have an eaves structure with respect to the lower structure 105a.

According to an embodiment of the present disclosure, a material layer of the self-emitting device ED disposed over the separation portion 105 may be automatically isolated (or disconnected or separated) in performing a deposition process, based on the undercut region (or the eaves structure) between the lower structure 105a and the upper structure 105b (or the metal structure 105m). For example, because the deposition material of the self-emitting device ED has linearity, the material layer of the self-emitting device ED may not be deposited over the lateral surface of the lower structure 105a covered by the upper structure 105b (or the metal structure 105m) and may be deposited on a top surface and a lateral surface of the upper structure 105b and a circuit layer 101 near the separation portion 105, and thus, may be isolated (or disconnected or separated) in the undercut region between the lower structure 105a and the upper structure 105b (or the metal structure 105m). Accordingly, the self-emitting device ED may be automatically isolated (or disconnected) by the first and second separation structures 105-1 and 105-2 of the separation portion 105 in performing a deposition process, and thus, a separate patterning process of isolating (or disconnecting or separating) the self-emitting device ED may be omitted. Accordingly, the self-emitting device ED disposed over the substrate 100 may be additionally isolated (or disconnected or separated) near (or around) the dam portion 104 by the separation portion 105, and thus, a lateral water penetration path of the substrate 100 may be additionally blocked by each of the first and second separation structures 105-1 and 105-2 of the separation portion 105.

Optionally, the common electrode CE disposed over the self-emitting device ED may be automatically isolated (or separated) by the undercut region of the separation portion 105 like the self-emitting device ED, in performing a deposition process based on deposition method, or may be formed to surround all of each of the first and second separation structures 105-1 and 105-2 and the self-emitting devices EDi of island shape isolated by each of the each of the first and second separation structures 105-1 and 105-2 without being isolated by the undercut region of the separation portion 105.

Additionally, a metal structure 105m of at least one of the first and second separation structures 105-1 and 105-2 may be implemented to have an eaves structure with respect to the lower structure 105a and prevent static electricity from flowing into the display portion AA from the outside. To this end, the metal structure 105m of each of the first and second separation structures 105-1 and 105-2 may be implemented to be electrically coupled to a pixel common voltage line CVL. For example, as illustrated in FIGS. 8 and 12, a portion of the metal structure 105m overlapping the pixel common voltage line CVL may be electrically connected to (or contact) the pixel common voltage line CVL through a via hole 105h which is formed to pass through the lower structure 105a and the buffer layer 101a. Accordingly, the metal structure 105m of each of the first and second separation structures 105-1 and 105-2 may be disposed in a closed loop line shape which is continuously disposed at a periphery portion of the substrate 100, and thus, may prevent static electricity from flowing into the display portion AA from the outside to prevent a defect caused by the static electricity. For example, the metal structure 105m of at least one of the first and second separation structures 105-1 and 105-2 may discharge static electricity, flowing in from the outside, to the pixel common voltage line CVL to prevent a defect caused by the static electricity.

Referring to FIGS. 9, 11, and 12, the light emitting display apparatus 10 or the substrate 100 according to an embodiment of the present disclosure may further include a groove line GRV.

The groove line GRV may be implemented between the dam portion 104 and the planarization layer 102. The groove line GRV may be formed or implemented together with the dam portion 104.

The groove line GRV may be implemented by removing all of the passivation layer PAS and the planarization layer 102 at an inner region of the dam portion 104. For example, the groove line GRV may be a region where a single structure or a multi-layer structure or the like, including at least one of the interlayer insulation layer ILD, the passivation layer PAS, the planarization layer 102, a pixel electrode material layer, and the bank 103 disposed on the buffer layer 101a between the dam portion 104 and the bank 103, is removed. For example, the groove line GRV may be formed or implemented by patterning (or removing) each of the bank 103, the planarization layer 102, the passivation layer PAS, and the interlayer insulation layer ILD disposed in a first margin area MA1 of an outermost pixel Po or the substrate 100. Accordingly, the groove line GRV may define or contact a lateral surface 102s of the planarization layer 102 and may be implemented in a closed loop line shape (or a continuous line shape or a closed loop shape) surrounding the lateral surface 102s of the planarization layer 102.

The groove line GRV may define or contact the lateral surface 102s of the planarization layer 102, a lateral surface PASs of the passivation layer PAS, and a lateral surface ILDs of the interlayer insulation layer ILD, which are commonly disposed in an inner pixel Po and the outermost pixel Po. For example, the groove line GRV may define or contact a lateral end 102e of the planarization layer 102, the lateral surface PASs of the passivation layer PAS, and the lateral surface ILDs of the interlayer insulation layer ILD, which are commonly disposed in the inner pixel Po and the outermost pixel Po. For example, each of the lateral surface 102s of the planarization layer 102, the lateral surface PASs of the passivation layer PAS, and the lateral surface ILDs of the interlayer insulation layer ILD may be exposed at the groove line GRV, and thus, may implement one sidewall of the groove line GRV.

The lateral end 102e of the planarization layer 102 may protrude toward a center portion of the groove line GRV (or the dam portion 104) from the lateral surface PASs of the passivation layer PAS. For example, a distance between the lateral end 102e of the planarization layer 102 and the outer surface OS of the substrate 100 may be less than a distance between the lateral surface PASs of the passivation layer PAS and the outer surface OS of the substrate 100. For example, a distance between the lateral end 102e of the planarization layer 102 and the lateral surface PASs of the passivation layer PAS or a distance between the lateral surface PASs of the passivation layer PAS and the lateral end 102e of the planarization layer 102 may be greater than a thickness obtained by summating a thickness of the self-emitting device ED and a thickness of the common electrode CE. Therefore, a periphery portion (or an edge portion) of the planarization layer 102 including the lateral surface 102s and the lateral end 102e of the planarization layer 102 may cover the lateral surface PASs of the passivation layer PAS and may directly face an upper surface of the buffer layer 101a. Accordingly, the periphery portion of the planarization layer 102 may have an eaves structure with respect to the lateral surface PASs of the passivation layer PAS.

The lateral surface PASs of the passivation layer PAS may be implemented in an inclined structure or a forward tapered structure. Thus, the lateral surface PASs of the passivation layer PAS may have an undercut structure with respect to the periphery portion of the planarization layer 102. For example, a boundary portion between the planarization layer 102 and the passivation layer PAS positioned at one side of the groove line GRV or an upper lateral surface of the passivation layer PAS may have an undercut structure with respect to the planarization layer 102. For example, due to the groove line GRV, an undercut region may be implemented between the lateral surface PASs of the passivation layer PAS adjacent to the groove line GRV and the lateral surface 102s of the planarization layer 102 adjacent to the groove line GRV, and the undercut region may be a structure for isolating (or disconnecting or separating) an edge portion of the planarization layer 102 and at least some layers of the light emitting device layer EDL disposed over the groove line GRV. The self-emitting device ED disposed over the groove line GRV and the lateral surface of the planarization layer 102 may be isolated in the undercut region. For example, the undercut region between the lateral surface PASs of the passivation layer PAS and the lateral surface 102s of the planarization layer 102 may be formed or implemented by an over-etching process performed on the passivation layer PAS. The lateral surface 102s of the planarization layer 102 may protrude to the outside of the lateral surface PASs of the passivation layer PAS by the undercut structure of the lateral surface PASs of the passivation layer PAS, and thus, may cover the lateral surface PASs of the passivation layer PAS. Accordingly, the lateral surface 102s of the planarization layer 102 may have an eaves structure with respect to the lateral surface PASs of the passivation layer PAS.

According to an embodiment of the present disclosure, a material layer of the self-emitting device ED disposed over the periphery portion of the planarization layer 102 and the groove line GRV may be automatically isolated (or disconnected or separated) by an undercut region (or an eaves structure) between the lateral surface PASs of the passivation layer PAS and the lateral surface 102s of the planarization layer 102 in performing a deposition process. For example, because a deposition material of the self-emitting device ED has linearity, the deposition material of the self-emitting device ED may not be deposited on the lateral surface PASs of the passivation layer PAS covered by the lateral surface 102s of the planarization layer 102 and may be deposited on the lateral surface 102s of the planarization layer 102 and the buffer layer 101a at the groove line GRV, and thus, may be additionally isolated (or disconnected or separated) at an undercut region between the lateral surface 102s of the planarization layer 102 and the lateral surface PASs of the passivation layer PAS.

Additionally, a common electrode CE disposed on the self-emitting device ED may be automatically isolated (or disconnected or separated) by the undercut region between the lateral surface 102s of the planarization layer 102 and the lateral surface PASs of the passivation layer PAS like the self-emitting device ED, in a deposition process based on deposition, or may be formed to cover all of the lateral surface 102s of the planarization layer 102, the lateral surface PASs of the passivation layer PAS, and the buffer layer 101a at the groove line GRV without being isolated by the undercut region between the lateral surface 102s of the planarization layer 102 and the lateral surface PASs of the passivation layer PAS.

As described above, according to an embodiment of the present disclosure, the pad portion 110 of the substrate 100 may be disposed (or included) in the outermost pixel Po and the routing portion 400 electrically coupled to the pad portion 110 may be formed on a lateral surface of the substrate 100, and thus, a light emitting display apparatus having an air bezel structure having no bezel area or having a zeroized bezel may be implemented. According to an embodiment of the present disclosure, electrical short circuit between routing lines may be easily detected and line resistances of the routing lines may be sensed by controlling a switching operation of each of the plurality of switching circuit portions 170 which are disposed to overlap the dam portion 104 through the metal line 104m embedded in the dam portion 104, and thus, a resistance deviation of the routing line may be compensated for, thereby preventing or minimizing an image quality defect caused by the resistance deviation of the routing line. Moreover, according to an embodiment of the present disclosure, the self-emitting device ED may be isolated by the undercut structure of the dam portion 104, and thus, a reduction in reliability of the self-emitting device ED caused by the lateral penetration of water (or moisture) may be prevented. Also, according to an embodiment of the present disclosure, the self-emitting device ED may be additionally isolated at least twice or more by the undercut region implemented between the lateral surface 102s of the planarization layer 102 and the lateral surface PASs of the passivation layer PAS by the groove line GRV and the undercut region in the separation structures 105-1 and 105-2 disposed near (or around) the dam portion 104, and thus, a reduction in reliability of the self-emitting device ED caused by the lateral penetration of water (or moisture) may be better prevented. Also, according to an embodiment of the present disclosure, a metal structure disposed in the separation structures 105-1 and 105-2 and/or the metal line 104m embedded in the dam portion 104 may be provided, and thus, a pixel circuit disposed in an outermost pixel may be protected from static electricity.

Figure 13:
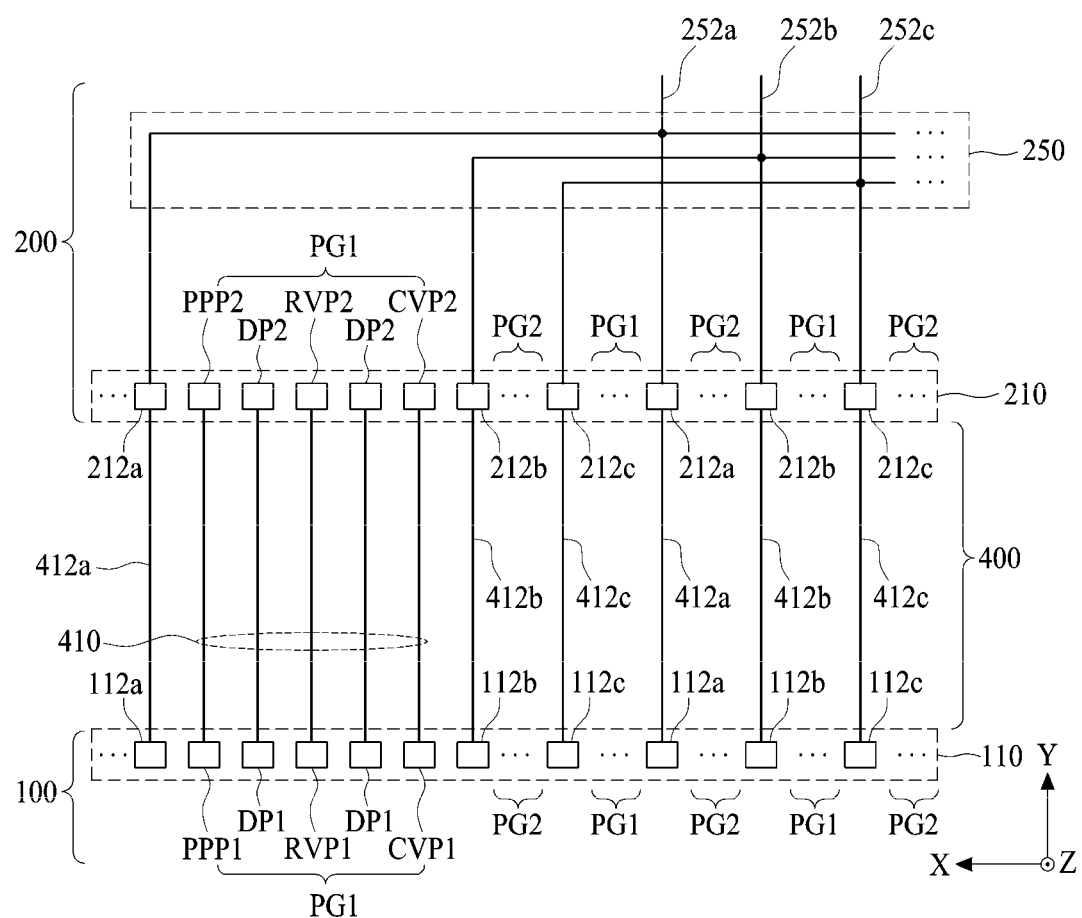
FIG. 13 is a diagram illustrating a first pad portion, a second pad portion, and a routing portion according to another embodiment of the present disclosure.

FIG. 13 is a diagram illustrating a first pad portion 110, a second pad portion 210, and a routing portion 400 according to another embodiment of the present disclosure.

Referring to FIG. 13, the first pad portion 110 according to another embodiment of the present disclosure may include a first pad group PG1, a second pad group PG2, and a plurality of first to third front sensing control pads 112a, 112b, and 112c.

The first pad group PG1 and the second pad group PG2 of the first pad portion 110 may be alternately arranged along a first direction X. The first pad group PG1 and the second pad group PG2 of the first pad portion 110 may be as described above with reference to FIG. 4, and thus, their repetitive descriptions are omitted.

Each of the plurality of first to third front sensing control pads 112a to 112c may be disposed between at least two pad groups PG1 and PG2. For example, each of the plurality of first to third front sensing control pads 112a to 112c may be disposed one by one between the first and second pad groups PG1 and PG2.

The second pad portion 210 may include a first pad group PG1, a second pad group PG2, and a plurality of first to third rear sensing control pads 212a, 212b, and 212c.

The second pad group PG1 and the second pad group PG2 of the second pad portion 210 may be alternately arranged along the first direction X.

The first pad group PG1 of the second pad portion 210 may include a second pixel driving power pad PPP2, a second data pad DP2, a second reference voltage pad RVP2, a second data pad DP2, and a second pixel common voltage pad CVP2 which in a one-to-one relationship overlap a first pixel driving power pad PPP1, a first data pad DP1, a first reference voltage pad RVP1, a first data pad DP1, and a first pixel common voltage pad CVP1 disposed in the first pad group PG1 of the first pad portion 110.

The second pad group PG2 of the second pad portion 210 may include a second gate pad, a second data pad DP2, a second reference voltage pad RVP2, a second data pad DP2, and a second pixel driving power pad PPP2 which a one-to-one relationship overlap a first gate pad, a first data pad DP1, a first reference voltage pad RVP1, a first data pad DP1, and a first pixel driving power pad PPP1 disposed in the second pad group PG2 of the first pad portion 110.

Each of the plurality of first to third rear sensing control pads 212a to 212c may be disposed between at least two pad groups PG1 and PG2. For example, each of the plurality of first to third rear sensing control pads 212a to 212c may be disposed one by one between the first and second pad groups PG1 and PG2.

The plurality of first rear sensing control pads 212a may be connected to a first sensing control link line 252a of the link line portion 250 in common or in parallel. The plurality of second rear sensing control pads 212b may be connected to a second sensing control link line 252b of the link line portion 250 in common or in parallel. The plurality of third rear sensing control pads 212c may be connected to a third sensing control link line 252c of the link line portion 250 in common or in parallel.

The routing portion 400 may include a plurality of routing lines 410 and a plurality of first to third sensing control routing lines 412a to 412c.

Each of the plurality of routing lines 410 may be formed to be in a one-to-one relationship connected to pads PPP1, DP1, RVP1, and CVP1 disposed in the first pad group PG1 and the second pad group PG2 of the first pad portion 110 and pads PPP2, DP2, RVP2, and CVP2 disposed in the first pad group PG1 and the second pad group PG2 of the second pad portion 210.

The plurality of first sensing control routing lines 412a may be formed to be in a one-to-one relationship connected to the plurality of first front sensing control pads 112a and the plurality of first rear sensing control pads 212a. The plurality of second sensing control routing lines 412b may be formed to be in a one-to-one relationship connected to the plurality of second front sensing control pads 112b and the plurality of second rear sensing control pads 212b. The plurality of third sensing control routing lines 412c may be formed to be in a one-to-one relationship connected to the plurality of third front sensing control pads 112c and the plurality of third rear sensing control pads 212c.

As described above, according to another embodiment of the present disclosure, each of the first to third sensing control routing lines 412a to 412c may be provided in plurality to have a parallel connection structure, and thus, even when a line defect occurs in some of a plurality of sensing control routing lines connected to one another in parallel, a switching control signal may be supplied through the other line.

Figure 14:
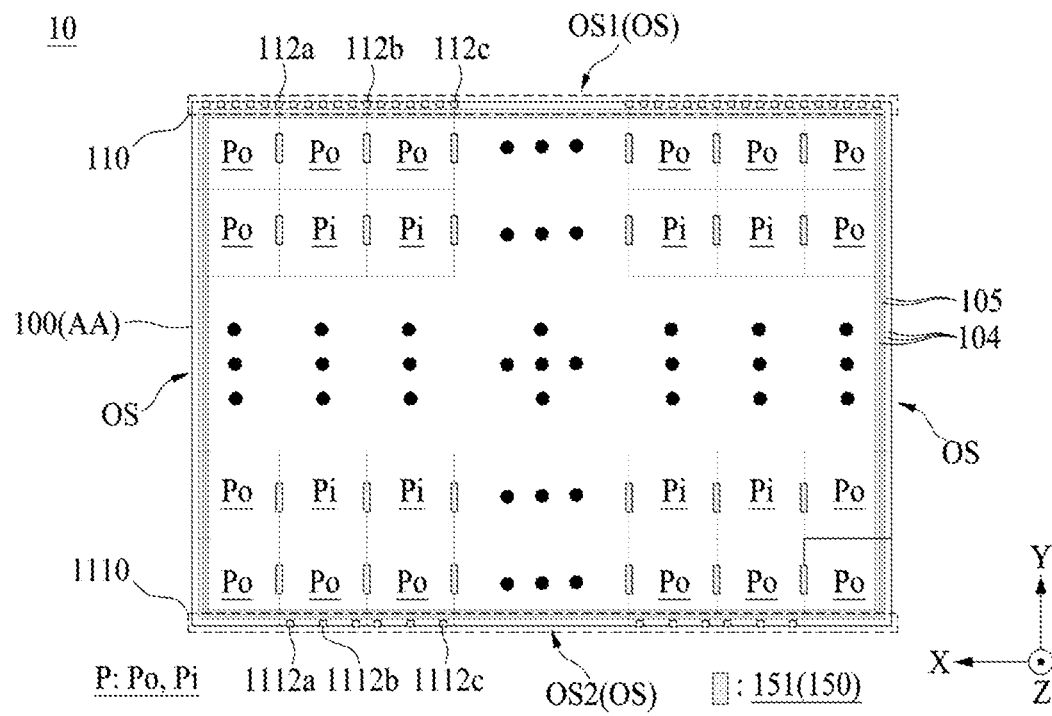
FIG. 14 is a plan view illustrating a light emitting display apparatus according to another embodiment of the present disclosure.
Figure 15:
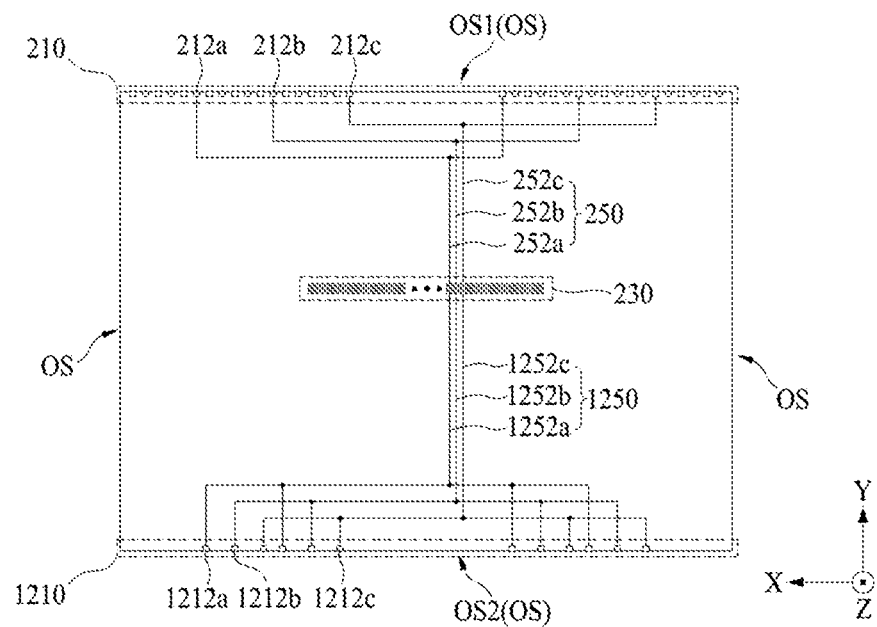
FIG. 15 is a rear view illustrating a light emitting display apparatus according to another embodiment of the present disclosure.

FIG. 14 is a plan view illustrating a light emitting display apparatus according to another embodiment of the present disclosure, and FIG. 15 is a rear view illustrating a light emitting display apparatus according to another embodiment of the present disclosure. FIGS. 14 and 15 illustrate an embodiment where a secondary pad portion is additionally provided in the light emitting display apparatus illustrated in FIGS. 1 to 13. Therefore, in the following description, the other elements except a secondary pad portion and relevant elements are referred to by like reference numerals, and their repetitive descriptions are omitted.

Referring to FIGS. 14 and 15, a light emitting display apparatus 10 according to another embodiment of the present disclosure may further include a front secondary pad portion 1110, a rear secondary pad portion 1210, and a secondary link line portion 1250.

The front secondary pad portion (or a fourth pad portion or a second front pad portion) 1110 may be disposed at a second periphery portion (or the other periphery portion), which is parallel to a first periphery portion, of a substrate 100. The front secondary pad portion 1110 may include at least one front secondary pads (or at least one fourth pads or at least one second front pads) 1112a, 1112b, and 1112c. For example, the front secondary pad portion 1110 may include a plurality of first to third front secondary pads 1112a, 1112b, and 1112c apart from one another along a first direction X.

Each of the plurality of first to third front secondary pads 1112a, 1112b, and 1112c may be configured to be electrically connected to a metal line 104m of a dam portion 104 disposed at the second periphery portion of the substrate 100. Except for that each of the plurality of first to third front secondary pads 1112a, 1112b, and 1112c is disposed at the second periphery portion of the substrate 100, each of the plurality of first to third front secondary pads 1112a, 1112b, and 1112c may be substantially the same as each of the plurality of first to third front sensing control pads 112a, 112b, and 112c disposed at the first pad portion 110, and thus, their repetitive descriptions are omitted.

The rear secondary pad portion (or a fifth pad portion or a second rear pad portion) 1210 may be disposed at a rear surface of a line substrate 200 to overlap the front secondary pad portion 1110. The rear secondary pad portion 1210 may include at least one rear secondary pads (or at least one fifth pads or a second rear pads) 1212a, 1212b, and 1212c overlapping the at least one front secondary pads 1112a, 1112b, and 1112c disposed at the front secondary pad portion 1110. For example, the rear secondary pad portion 1210 may include a plurality of first to third rear secondary pads 1212a, 1212b, and 1212c disposed at the rear surface of the line substrate 200 to in a one-to-one relationship overlap the first to third front secondary pads 1112a, 1112b, and 1112c disposed at the front secondary pad portion 1110. Except for that each of the plurality of first to third rear secondary pads 1212a, 1212b, and 1212c is disposed at the second periphery portion of the line substrate 200, each of the plurality of first to third rear secondary pads 1212a, 1212b, and 1212c may be substantially the same as each of the plurality of first to third rear sensing control pads 212a, 212b, and 212c disposed at the second pad portion 210, and thus, their repetitive descriptions are omitted.

The secondary link line portion 1250 may be disposed between the rear secondary pad portion 1210 and the at least one third pad portion 230. The secondary link line portion 1250 may include at least one secondary link lines 1252a, 1252b, and 1252c electrically coupled to the at least one rear secondary pads 1212a, 1212b, and 1212c. For example, the secondary link line portion 1250 may include first to third secondary link line 1252a, 1252b, and 1252c.

The first secondary link line 1252a may be connected to the plurality of first rear secondary pads 1212a in common or in parallel and may be connected to a first switching control signal pad disposed at the at least one third pad portion 230.

The second secondary link line 1252b may be connected to the plurality of second rear secondary pads 1212b in common or in parallel and may be connected to a second switching control signal pad disposed at the at least one third pad portion 230.

The third secondary link line 1252c may be connected to the plurality of third rear secondary pads 1212c in common or in parallel and may be connected to a third switching control signal pad disposed at the at least one third pad portion 230.

The light emitting display apparatus 10 according to another embodiment of the present disclosure may further include a secondary routing portion.

The secondary routing portion may include a plurality of secondary routing lines disposed to surround a second outer surface OS2 of a line substrate 200.

Each of the plurality of secondary routing lines may be individually (or in a one-to-one relationship) connected (or coupled) to each of the plurality of first to third front secondary pads 1112a, 1112b, and 1112c and each of the plurality of first to third rear secondary pads 1212a, 1212b, and 1212c. In other words, each of the plurality of secondary routing lines may be electrically connected to a respective one of the plurality of first to third front secondary pads 1112, 1112b, and 1112c of the front secondary pad portion 1110 and to a respective one of the plurality of first to third rear secondary pads 1212a, 1212b, 1212c of the rear secondary pad portion 1210. Except for that each of the plurality of secondary routing lines is disposed to surround the substrate 100 and the second outer surface OS2 of the line substrate 200, each of the plurality of secondary routing lines may be substantially the same as the plurality of sensing control routing lines 412a, 412b, and 412c described above with reference to FIG. 13, and thus, their repetitive descriptions are omitted.

As described above, according to another embodiment of the present disclosure, a switching control signal may be additionally supplied to a metal line 104m, disposed in the dam portion 104, through the secondary link line portion 1250, the rear secondary pad portion 1210, the secondary routing portion, and the front secondary pad portion 1110.

Alternatively, in the light emitting display apparatus according to another embodiment of the present disclosure, the metal line 104m disposed in the dam portion 104 may have a closed loop line shape which is one-dimensionally continued on the substrate 100 without being disconnected, and thus, the switching control signal may be supplied to the metal line 104m disposed in the dam portion 104 through the front secondary pad portion 1110 without the front sensing control pads 112a, 112b, and 112c. Therefore, when the light emitting display apparatus according to another embodiment of the present disclosure includes the secondary link line portion 1250, the rear secondary pad portion 1210, the secondary routing portion, and the front secondary pad portion 1110, each of the front sensing control pads 112a, 112b, and 112c, the rear sensing control pads 212a, 212b, and 212c, the sensing control routing lines 412a, 412b, and 412c, and the second control link lines 252a, 252, and 252c may be omitted. In this case, the number of pads of the first pad portion 110 may decrease, and thus, it may be easy to design a pixel having a high resolution.

Figure 16:
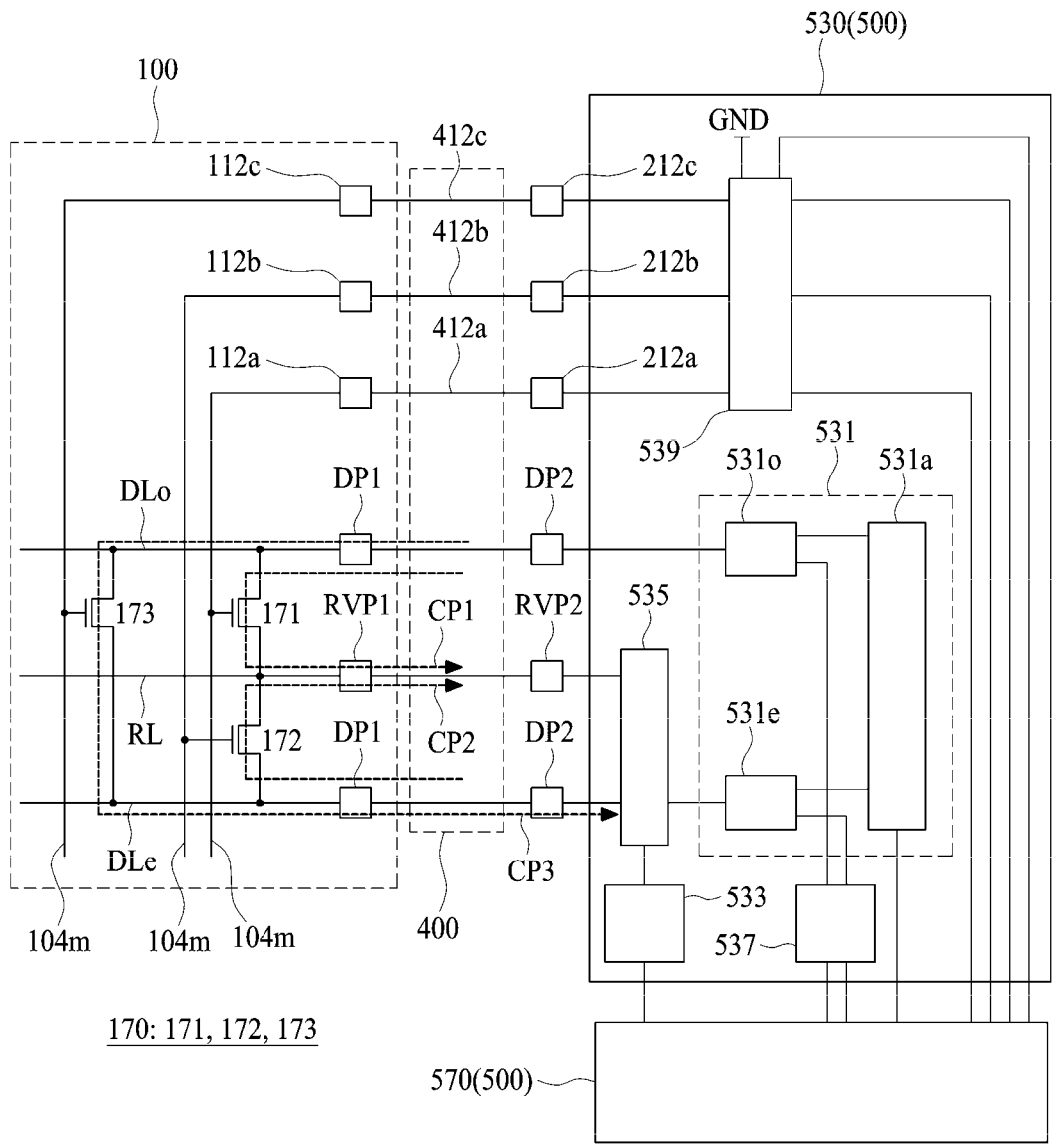
FIG. 16 is a diagram schematically illustrating a switching circuit portion, a driving IC, and a timing controller according to an embodiment of the present disclosure.

FIG. 16 is a diagram schematically illustrating a switching circuit portion, a driving IC, and a timing controller according to an embodiment of the present disclosure and is a diagram illustrating sensing of a line resistance of a routing line or short circuit of the routing line through a switching circuit portion.

Referring to FIG. 16, a driving IC 530 according to an embodiment of the present disclosure may include a data driver 531, a sensing unit 533, and a line selector 535. The sensing unit 533 may be a sensing circuit, and may be referred to as the sensing circuit 533.

The data driver 531 may receive subpixel data and a data control signal provided from a timing controller 570, convert the subpixel data into an analog data signal based on the data control signal, and output the analog data signal. For example, in the test mode, the data driver 531 may convert test data from the timing controller 570 into analog test data and may output the analog test data.

The data driver 531 according to an embodiment of the present disclosure may include a data signal generator 531a and a plurality of signal output circuits 531o and 531e.

The data signal generator 531a may be configured to convert the pixel data or the test data, supplied from the timing controller 570, into an analog data signal and output the analog data signal.

Each of the plurality of signal output circuits 531o and 531e may be connected to data lines DLo and DLe through a data link line, a second data pad DP2 of a second pad portion, a data routing line, and a first data pad DP1 of a first pad portion. Each of the plurality of signal output circuits 531o and 531e may buffer a data signal output from the data signal generator 531a and may output the buffered data signal to corresponding data lines DLo and DLe. For example, each of the plurality of signal output circuits 531o and 531e may be an output buffer and may be implemented as a differential amplifier or the like. For example, each of the plurality of signal output circuits 531o and 531e may be a voltage follower where an output voltage is fed back to an input terminal. A static current of each of the plurality of signal output circuits 531o and 531e may vary (or change) based on a current option value (or amplifier current option value or a bias voltage level) supplied to a bias terminal. For example, the static current of each of the plurality of signal output circuits 531o and 531e may increase or decrease based on a bias voltage level supplied to a bias terminal.

The sensing unit 533 may be selectively connected to a reference voltage line RL through a data link line, a second reference voltage pad RVP2 of a second pad portion, a reference routing line, and a first reference voltage pad RVP1 of a first pad portion. The sensing unit 533 may be configured to convert a sensing value, corresponding to a current (or a test signal) input through the reference voltage line RL, into sensing data and supply the sensing data to the timing controller 570. For example, the sensing unit 533 may analog-digital convert a sensing voltage corresponding to a current (or a test signal) input through the reference voltage line RL to generate sensing data and may supply the generated sensing data to the timing controller 570.

The sensing unit 533 may be provided as the same number as the number of reference lines disposed at the substrate 100. The sensing unit 533 according to an embodiment of the present disclosure may include a plurality of sensing circuits and a plurality of analog-to-digital converters.

Each of the plurality of sensing circuits may be configured with an integrator including an operational amplifier and a capacitor. For example, the operational amplifier of the sensing circuit may include an inverting input terminal (−) selectively connected to the reference voltage line RL, a non-inverting input terminal (+) to which a reference voltage is supplied, and an output terminal connected to the analog-to-digital converter. The capacitor may be a feedback capacitor which is connected between an inverting input terminal (−) and an output terminal of the operational amplifier. Additionally, each of the plurality of sensing circuits may further include a feedback switch (or a reset switch) connected between the inverting input terminal (−) and the output terminal of the operational amplifier. A current flowing in the feedback capacitor may be the same as a current flowing in the reference voltage line RL.

Each of the plurality of analog-to-digital converters may analog-digital convert an output voltage (or a sensing voltage) of a corresponding sensing circuit of the plurality of sensing circuits to generate sensing data and may supply the generated sensing data to the timing controller 570. For example, each of the plurality of analog-to-digital converters may analog-digital convert an output voltage (or a sensing voltage) of a corresponding sensing circuit based on a current flowing in the feedback capacitor of a corresponding sensing circuit to generate sensing data.

The line selector 535 may be configured to connect a data link line, connected to an even-numbered data line DLe, to the sensing unit 533 or the signal output circuits 531o and 531e, based on a line selection signal supplied from the timing controller 570. For example, the line selector 535 may be a multiplexer.

The timing controller 570 may generate first to third switching control signals to control a switching operation of each of first to third switching circuits 171, 172, and 173 in the test mode and may generate test data and a line selection signal to provide the generated test data and line selection signal to the data driver 531. The timing controller 570 may provide test data to the driving IC 530 and set a bias voltage level input to a bias terminal of each of the plurality of signal output circuits 531o and 531e based on the sensing data provided from the sensing unit 533. The timing controller 570 may generate a line resistance value of a data routing line connected to a data line among the plurality of routing lines based on the sensing data and sets the bias voltage level based on the generated line resistance value. In the test mode, the timing controller 570 may determine the short circuit or not of a routing line and a short circuit defect position based on line-based line sensing data provided from the sensing unit 533 of the driving IC 530 and may display a determination result by using a separate monitor. Also, in the test mode, the timing controller 570 may generate a line-based resistance compensation value for compensating for a resistance deviation between a plurality of data routing lines based on the line-based line sensing data supplied from the sensing unit 533 of the driving IC 530, generate a bias voltage corresponding to the line-based resistance compensation value, and supply the bias voltage to bias terminals of corresponding signal output circuits 531o and 531e of the driving IC 530. Accordingly, the signal output circuits 531o and 531e may output a data signal which is compensated by a resistance compensation value based on a bias voltage level.

According to an embodiment of the present disclosure, a current flowing in the routing line may be the same as a current flowing in the feedback capacitor of the sensing circuit, and thus, as in the following Equation 1, the timing controller 570 may calculate a line resistance R based on a sensing voltage corresponding to resistance sensing data, Current 1 flowing in the routing line, and Current 2 flowing in a feedback capacitor with a capacitance Cf of a sensing circuit.

$$\text{Current } 1 = (V_{data} - V_{inv})/R$$

$$\text{Current } 2 = Cf(V_{inv} - V_{sen})/\Delta T_{sen}$$

$$\text{Current } 1 = \text{Current } 2, (V_{data} - V_{inv})/R = Cf(V_{inv} - V_{sen})/\Delta t_{sen}$$

$$R = (\Delta T_{sen} \times (V_{data} - V_{inv}))/Cf(V_{inv} - V_{sen}) \qquad \text{Equation 1}$$

In Equation 1, Vdata may denote a voltage level of a test signal, Cf may denote a capacitance of a feedback capacitor, Vinv may denote a voltage level of an inverting terminal (−) of an operational amplifier, Vsen may denote a sensing voltage (or an output voltage of a sensing circuit) corresponding to resistance sensing data, and ΔTsen may denote a time for which a current flows. Vinv may have the same voltage level as that of a reference voltage which is applied to a non-inverting terminal (+) when the feedback switch of the sensing circuit is turned on. For example, when the feedback switch of the sensing circuit is turned on and thus a gain value of the operational amplifier is infinite, Vinv may have the same voltage level as a voltage level of the non-inverting terminal (+). In Equation 1, a voltage level Vdata of the test signal, the capacitance Cf of the feedback capacitor, the time ΔTsen for which a current flows, and the voltage level Vinv of the inverting terminal of the operational amplifier may each be a constant. Accordingly, the timing controller 570 may calculate the sensing voltage Vsen corresponding to the resistance sensing data and may calculate a line resistance R of the routing line through Equation 1. For example, as the feedback switch of the sensing circuit is turned on and a current flows in the feedback capacitor, the timing controller 570 may calculate a line resistance R of the routing line based on Equation 1.

Optionally, the timing controller 570 may not generate a bias voltage corresponding to the line-based resistance compensation value and may supply the line-based resistance compensation value to the driving IC 530. In this case, the driving IC 530 may further include a bias voltage generator 537. The bias voltage generator 537 may generate a line-based bias voltage corresponding to each line-based resistance compensation value supplied from the timing controller 570 and may supply the generated line-based bias voltage to bias terminals of corresponding signal output circuits 531o and 531e.

Additionally, the driving IC 530 or the driving circuit part 500 according to an embodiment of the present disclosure may further include a voltage selector 539.

The voltage selector 539 may select and output one of a ground voltage and a switching control signal supplied from the timing controller 570 based on a voltage selection signal of the timing controller 570.

In the test mode, the voltage selector 539 may output each of first to third switching control signals supplied from the timing controller 570 based on a voltage selection signal having a first voltage level supplied from the timing controller 570, and thus, each of the first to third switching circuits 171, 172, and 173 of the switching circuit portion 170 may be turned on based on a corresponding switching control signal supplied through each of the first to third front sensing control pads 112a, 112b, and 112c from the voltage selector 539.

The voltage selector 539 may output a ground voltage GND supplied from the timing controller 570 based on a voltage selection signal having a second voltage level supplied from the timing controller 570 in a non-test mode or a normal driving mode, and thus, each of the first to third switching circuits 171, 172, and 173 of the switching circuit portion 170 may be maintained in an off state by the ground voltage GND supplied through the metal line 104m of the dam portion 104 and each of the first to third front sensing control pads 112a, 112b, and 112c from the voltage selector 539, and the metal line 104m of the dam portion 104 may be maintained with the ground voltage GND and may be used as an anti-electrostatic line or a static electricity blocking line.

In the light emitting display apparatus according to an embodiment of the present disclosure, a driving method for testing short circuit of a routing line will be described below.

First, each of the first to third switching control signals having a first logic level (or a first voltage level or a gate off voltage level) may be output from the timing controller 570, and thus, each of the first to third switching circuits 171 to 173 of the switching circuit portion 170 may be turned off.

Subsequently, the test data signal may be supplied from the driving IC 530 to the data lines DLo and DLe, and thus, the sensing unit 533 of the driving IC 530 may sense a current input through the reference voltage line RL and the line selector 535 to output line sensing data.

Subsequently, the timing controller 570 may determine the short circuit or not of the routing line, based on line sensing data. For example, when short circuit between the reference voltage line RL and the data lines DLo and DLe disposed adjacent to each other occurs, a current flowing in the data lines DLo and DLe may flow in the reference voltage line RL through a short circuit portion, and thus, may sense a current flowing in the reference voltage line RL to detect the occurrence or not of short circuit between lines. For example, when line sensing data is greater than or equal to a reference threshold voltage value, the timing controller 570 may determine the occurrence of short circuit between routing lines. It should be understood that the short circuit being detected may be physically located in one or more of the display portion, the front pad portion and the routing portion. For example, a short circuit may be present between the odd-numbered data line DLo and the reference voltage line RL in the pixel area, between the first data pad DP1 and the first reference voltage pad RVP1, and/or between the routing line 410 connected to the first data pad DP1 and the routing line connected to the first reference voltage pad RVP1.

Therefore, according to an embodiment of the present disclosure, the first to third switching circuits 171 to 173 of each of the plurality of switching circuit portions 170 may be turned off and a current flowing in each of the plurality of reference voltage lines RL may be sensed while supplying a test signal to each of the plurality of data lines DLo and DLe, and thus, a short circuit defect between the plurality of routing lines may be detected.

In the light emitting display apparatus according to an embodiment of the present disclosure, a driving method for sensing a line resistance of a routing line will be described below.

First, in a first test period of a test mode, a line resistance value between an odd-numbered data routing line and a reference routing line may be sensed. According to an embodiment of the present disclosure, the first switching control signal having a second logic level (or a second voltage level or a gate on voltage level) and the second and third switching control signals having a first logic level may be output from the driving IC 530, and thus, the first switching circuit 171 of the switching circuit portion 170 may be turned on and each of the second and third switching circuits 172 and 173 of the switching circuit portion 170 may be turned off. Subsequently, the test data signal may be supplied from the driving IC 530 to the odd-numbered data line DLo, and thus, the sensing unit 533 of the driving IC 530 may sense a current input through the line selector 535 and a first current path CP1 including the odd-numbered data line DLo, the first switching circuit 171, and the reference voltage line RL to generate resistance sensing data. Subsequently, the timing controller 570 may generate a line resistance value of the odd-numbered data routing line and the reference routing line based on the resistance sensing data and may store the generated line resistance value in a storage circuit.

Subsequently, in a second test period of the test mode, a line resistance value between an even-numbered data routing line and the reference routing line may be sensed. According to an embodiment of the present disclosure, the second switching control signal having the second logic level and the first and third switching control signals having the first logic level may be output from the driving IC 530, and thus, the second switching circuit 172 of the switching circuit portion 170 may be turned on and each of the first and third switching circuits 171 and 173 of the switching circuit portion 170 may be turned off. Subsequently, the test data signal may be supplied from the driving IC 530 to the even-numbered data line DLe, and thus, the sensing unit 533 of the driving IC 530 may sense a current input through the line selector 535 and a second current path CP2 including the even-numbered data line DLe, the second switching circuit 172, and the reference voltage line RL to generate resistance sensing data. Subsequently, the timing controller 570 may generate a line resistance value of the even-numbered data routing line and the reference routing line based on the resistance sensing data and may store the generated line resistance value in a storage circuit.

Subsequently, in a third test period of the test mode, a line resistance value between the odd-numbered data routing line and the even-numbered data routing line may be sensed. According to an embodiment of the present disclosure, the third switching control signal having the second logic level and the first and second switching control signals having the first logic level may be output from the driving IC 530, and thus, the third switching circuit 173 of the switching circuit portion 170 may be turned on and each of the first and second switching circuits 171 and 172 of the switching circuit portion 170 may be turned off. Subsequently, the test data signal may be supplied from the driving IC 530 to the odd-numbered data line DLo and the even-numbered data line DLe, and thus, the sensing unit 533 of the driving IC 530 may sense a current input through the line selector 535 and a third current path CP3 including the odd-numbered data line DLo, the third switching circuit 173, and even-numbered data line DLe to generate resistance sensing data. Subsequently, the timing controller 570 may generate a line resistance value of the odd-numbered data routing line and the even-numbered data routing line based on the resistance sensing data and may store the generated line resistance value in a storage circuit.

Subsequently, the timing controller 570 may generate a line resistance value R1 of an odd-numbered data routing line and a line resistance value R2 of an even-numbered data routing line through the following Equation 2, based on the line resistance value generated in each of the first to third test periods and may additionally generate a line resistance value R3 of the reference routing line.

$$R1+R3=\text{Rsum1}, R2+R3=\text{Rsum2}, R1+R2=\text{Rsum3}$$

$$\text{Rsum1}+\text{Rsum2}+\text{Rsum3}=\text{Rtot},$$

$$2(R1+R2+R3)=\text{Rtot}, R1+R2+R3=\text{Rtot}/2$$

$$R1=(\text{Rtot}/2)-\text{Rsum2}, R2=(\text{Rtot}/2)-\text{Rsum1}, R3=(\text{Rtot}/2)-\text{Rsum3} \quad \text{Equation 2}$$

In Equation 2, R1 may denote a line resistance value of an odd-numbered data routing line, R2 may denote a line resistance value of an even-numbered data routing line, and R3 may denote a line resistance value of a reference routing line. Also, Rsum1 may denote a line resistance value sum of each of an odd-numbered data routing line and a reference routing line generated in the first test period, Rsum2 may denote a line resistance value sum of each of the even-numbered data routing line and a reference routing line generated in the second test period, and Rsum3 may denote a line resistance value sum of each of the odd-numbered data routing line and the even-numbered data routing line generated in the third test period.

Subsequently, the timing controller 570 may calculate a line-based resistance compensation value for compensating for a line-based resistance deviation based on a line-based resistance value and may store the line-based resistance compensation value in the storage circuit in a lookup table form. In an embodiment of the present disclosure, the timing controller 570 may modulate pixel data which is to be supplied to each of a plurality of data lines, based on a resistance compensation value of each of a plurality of data routing lines stored in the storage circuit and may supply the modulated pixel data to the driving IC 530. In another embodiment of the present disclosure, the timing controller 570 may set a current option value (or a bias voltage level) of each of the plurality of signal output circuits 531o and 531e respectively corresponding to a plurality of data lines based on a resistance compensation value of each of a plurality of data routing lines stored in the storage circuit, store the current option value in the storage circuit, and supply the current option value, stored in the storage circuit, to corresponding signal output circuits 531o and 531e. Accordingly, each of the plurality of signal output circuits 531o and 531e may output a data signal where a resistance value of a corresponding data routing line is compensated for based on a bias voltage level corresponding to a current option value supplied from the timing controller 570, and thus, a resistance deviation between line resistance values of a plurality of data routing lines may be compensated for.

Therefore, according to another embodiment of the present disclosure, the first to third switching circuits 171, 172, and 173 of each of the plurality of switching circuit portions 170 may be selectively turned on and a current flowing in the reference voltage line RL may be sensed while supplying a test signal to each of the plurality of data lines DLo and DLe, and thus, a line resistance of each of the plurality of routing lines may be detected and a resistance deviation between line resistance values of a plurality of data routing lines may be compensated for.

Figure 17:
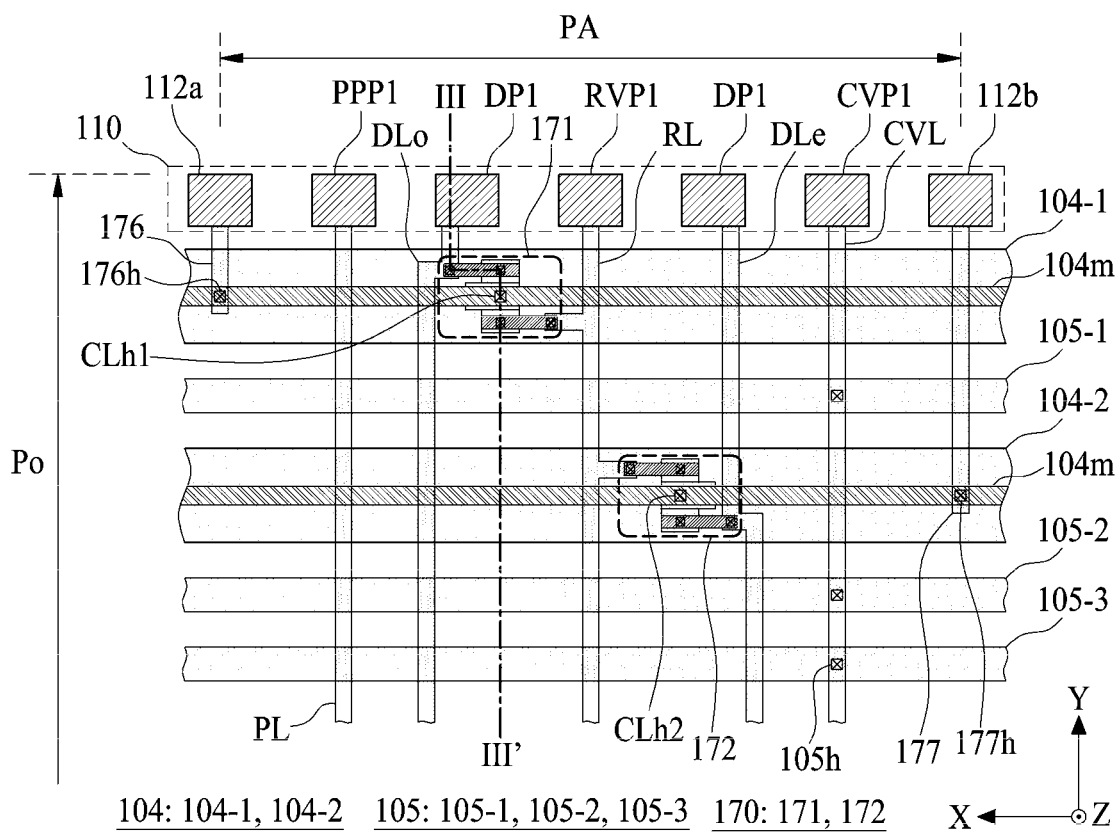
FIG. 17 is a diagram illustrating a plurality of switching circuit portions according to another embodiment of the present disclosure.
Figure 18:
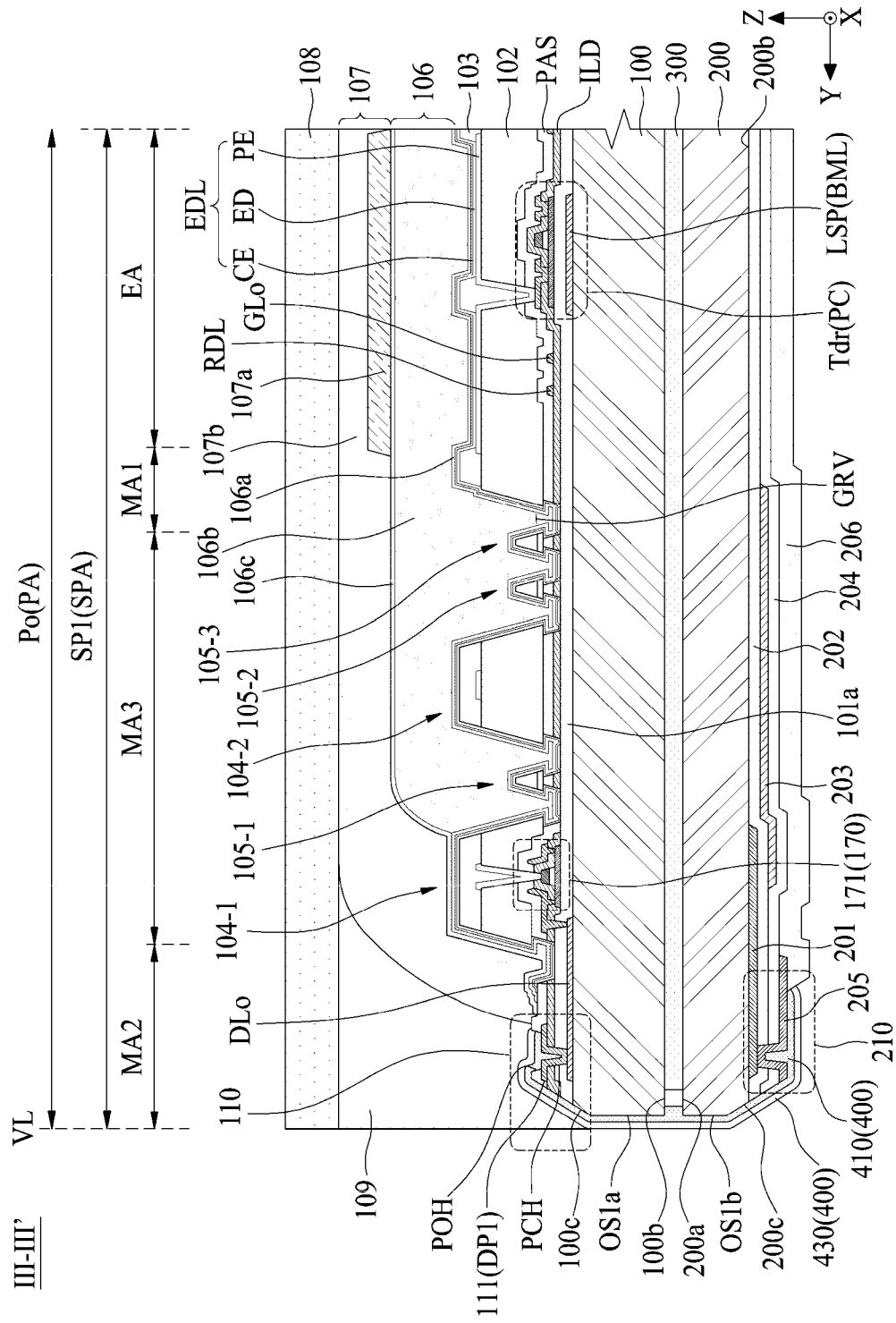
FIG. 18 is a cross-sectional view taken along line III-III' illustrated in FIG. 17.

FIG. 17 is a diagram illustrating a plurality of switching circuit portions according to another embodiment of the present disclosure, and FIG. 18 is a cross-sectional view taken along line III-III' illustrated in FIG. 17. FIGS. 17 and 18 illustrate an embodiment implemented by modifying the dam portion and the plurality of switching circuit portions in the light emitting display apparatus described above with reference to FIGS. 1 to 16. Therefore, in the following description, the other elements except a dam portion, a plurality of switching circuit portions, and relevant elements refer to like elements, and their repetitive descriptions are omitted or will be briefly given.

Referring to FIGS. 17 and 18, a dam portion 104 according to another embodiment of the present disclosure may include first and second dams 104-1 and 104-2.

Each of the first and second dams 104-1 and 104-2 may include a metal line 104m. The metal line 104m may be embedded or implemented in (or inside) the dam portion 104, and thus, may one-dimensionally have the same closed loop line shape (or a continuous line shape or a closed loop shape) as the dam portion 104. Except for that the dam portion 104 includes the first and second dams 104-1 and 104-2, the dam portion 104 may be configured to have substantially the same structure as the dam portion 104 described above with reference to FIGS. 1 to 12, and thus, the repetitive description thereof is omitted.

A separation portion 105 may include a first separation structure 105-1 disposed between the first and second dams 104-1 and 104-2 and second and third separation structures 105-2 and 105-3 disposed in an inner region of the second dam 104-2. Except for that the separation portion 105 further includes the third separation structure 105-3, the separation portion 105 may be configured to have substantially the same structure as that of the separation portion 105 described above with reference to FIGS. 1 to 13, and thus, the repetitive description thereof is omitted.

Additionally, a metal structure of each of the first to third separation structures 105-1 to 105-3 may be electrically connected to (or contact) a pixel common voltage line CVL through a via hole 105h.

The first pad portion 110 may include first and second front sensing control pads 112a and 112b and first and second pad connection lines 176 and 177. The first pad portion 110 may have a configuration where the third front sensing control pad 112c and the third pad connection line are omitted in the pad portion 110 described above with reference to FIGS. 1 to 13, and thus, the repetitive description thereof is omitted.

Each of the plurality of switching circuit portions 170 according to an embodiment of the present disclosure may include first and second switching circuits 171 and 172.

The first and second switching circuits 171 and 172 may be disposed to individually overlap the first and second dams 104-1 and 104-2. For example, the first switching circuit 171 may overlap the first dam 104-1, or may be disposed under the first dam 104-1. The second switching circuit 172 may overlap the second dam 104-2, or may be disposed under the second dam 104-2. Each of the first and second switching circuits 171 and 172 may be substantially the same as each of the first and second switching circuits 171 and 172 described above with reference to FIGS. 1 to 13, and thus, their repetitive descriptions are omitted.

Additionally, each of the front secondary pad portion 1110, the rear secondary pad portion 1210, the secondary routing portion, and the secondary link line portion 1250 described above with reference to FIGS. 14 and 15 may be applied to the embodiment illustrated in FIGS. 17 and 18.

As described above, according to another embodiment of the present disclosure, the same effect as in the light emitting display apparatus described above with reference to FIGS. 1 to 16 may be obtained, and comparing with the light emitting display apparatus described above with reference to FIGS. 1 to 16, because an area occupied by the dam portion 104 is reduced, it may be easy to design a pixel having a high resolution.

Figure 19:
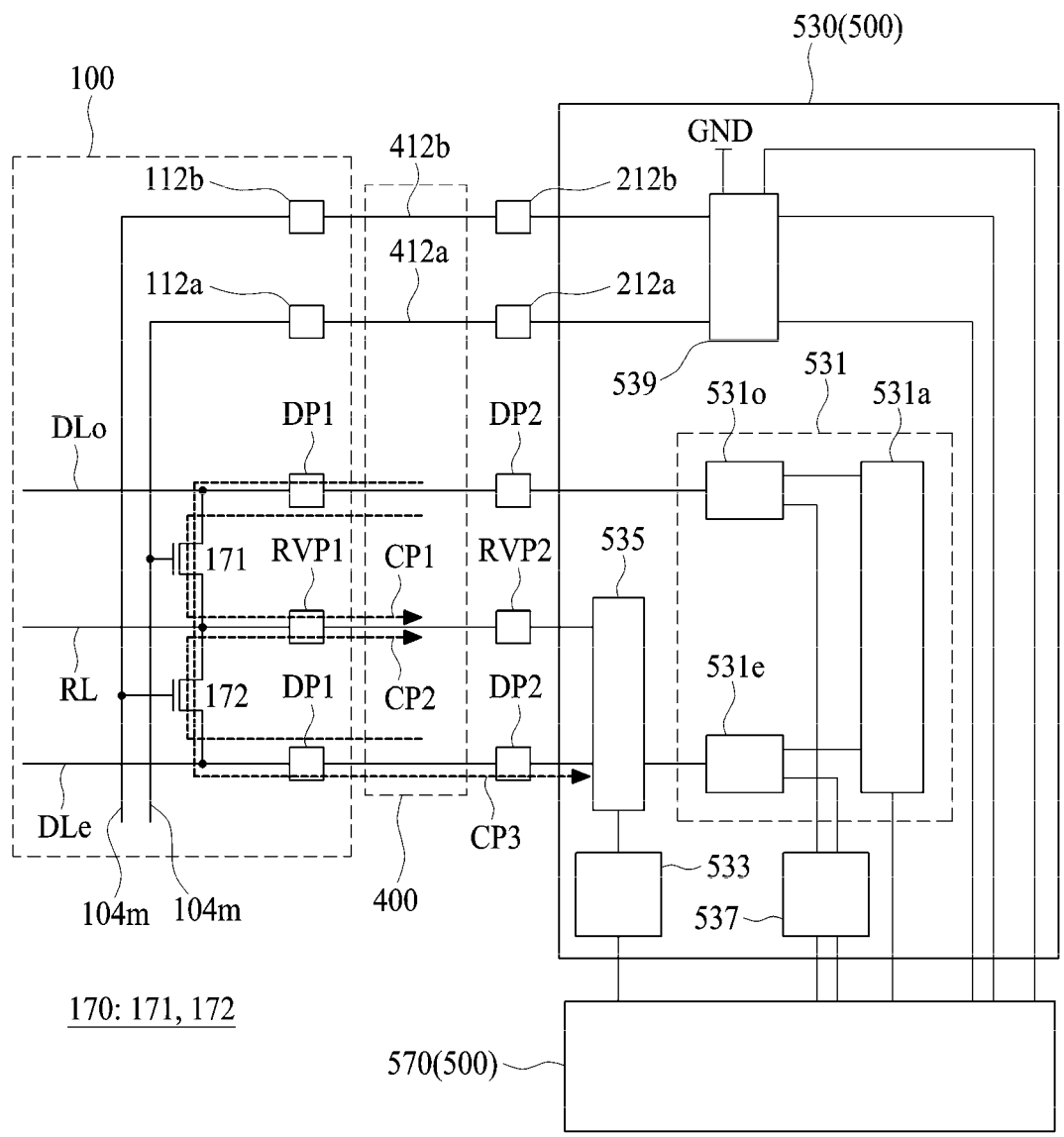
FIG. 19 is a diagram schematically illustrating a switching circuit portion, a driving IC, and a timing controller according to another embodiment of the present disclosure.

FIG. 19 is a diagram schematically illustrating a switching circuit portion, a driving IC, and a timing controller according to another embodiment of the present disclosure and is a diagram for describing sensing of a line resistance of a routing line or short circuit of the routing line through a switching circuit portion.

Referring to FIGS. 17 to 19, a driving IC 530 according to another embodiment of the present disclosure may include a data driver 531, a sensing unit 533, and a line selector 535. Except for that the driving IC 530 including such elements is configured to output first and second switching control signals supplied from the timing controller 570 in the test mode, the driving IC 530 may be substantially the same as the driving IC 530 described above with reference to FIG. 16, and thus, the repetitive description thereof is omitted.

The timing controller 570 may generate first and second switching control signals to control a switching operation of each of first and second switching circuits 171 and 172 in the test mode and may generate test data and a line selection signal to provide the generated test data and line selection signal to the data driver 531. Except for that the timing controller 570 controls a switching operation of each of first and second switching circuits 171 and 172 of a switching circuit portion 170 generating first and second switching control signals, the timing controller 570 may be substantially the same as the timing controller 570 described above with reference to FIG. 16, and thus, the repetitive description thereof is omitted.

Optionally, the timing controller 570 may not generate a bias voltage corresponding to the line-based resistance compensation value and may supply the line-based resistance compensation value to the driving IC 530. In this case, the driving IC 530 may further include a bias voltage generator 537. The bias voltage generator 537 may generate a line-based bias voltage corresponding to each line-based resistance compensation value supplied from the timing controller 570 and may supply the generated line-based bias voltage to bias terminals of corresponding signal output circuits 531o and 531e.

Additionally, the driving IC 530 or the driving circuit part 500 according to another embodiment of the present disclosure may further include a voltage selector 539.

The voltage selector 539 may select and output one of a ground voltage and a switching control signal supplied from the timing controller 570 based on a voltage selection signal of the timing controller 570.

In the test mode, the voltage selector 539 may output each of first and second switching control signals supplied from the timing controller 570 based on a voltage selection signal having a first logic level supplied from the timing controller 570, and thus, each of the first and second switching circuits 171 and 172 of the switching circuit portion 170 may be turned on based on a corresponding switching control signal supplied through each of the first and second front sensing control pads 112a and 112b from the voltage selector 539.

The voltage selector 539 may output a ground voltage GND supplied from the timing controller 570 based on a voltage selection signal having a second logic level supplied from the timing controller 570 in a non-test mode or a normal driving mode, and thus, each of the first and second switching circuits 171 and 172 of the switching circuit portion 170 may be maintained in an off state by the ground voltage GND supplied through the metal line 104m of the dam portion 104 and each of the first and second front sensing control pads 112a and 112b from the voltage selector 539, and the metal line 104m of the dam portion 104 may be maintained with the ground voltage GND and may be used as an anti-electrostatic line or a static electricity blocking line.

In the light emitting display apparatus according to another embodiment of the present disclosure, a driving method for testing short circuit of a routing line will be described below.

First, each of the first and second switching control signals having a first logic level may be output from the timing controller 570, and thus, each of the first and second switching circuits 171 and 172 of the switching circuit portion 170 may be turned off.

Subsequently, the test data signal may be supplied from the driving IC 530 to the data lines DLo and DLe, and thus, the sensing unit 533 of the driving IC 530 may sense a current input through the reference voltage line RL and the line selector 535 to output line sensing data.

Subsequently, the timing controller 570 may determine the short circuit or not of the routing line, based on line sensing data. For example, when short circuit between the reference voltage line RL and the data lines DLo and DLe disposed adjacent to each other occurs, a current flowing in the data lines DLo and DLe may flow in the reference voltage line RL through a short circuit portion, and thus, the sensing unit 533 may sense a current flowing in the reference voltage line RL to detect the occurrence or not of short circuit between lines. For example, when line sensing data is greater than or equal to a reference threshold voltage value, the timing controller 570 may determine the occurrence of short circuit between routing lines.

Therefore, according to an embodiment of the present disclosure, the first and second switching circuits 171 and 172 of each of the plurality of switching circuit portions 170 may be turned off and a current flowing in each of the plurality of reference voltage lines RL may be sensed while supplying a test signal to each of the plurality of data lines DLo and DLe, and thus, a short circuit defect between the plurality of routing lines may be detected.

In the light emitting display apparatus according to another embodiment of the present disclosure, a driving method for sensing a line resistance of a routing line will be described below.

First, in a first test period of a test mode, a line resistance value between an odd-numbered data routing line and a reference routing line may be sensed. According to an embodiment of the present disclosure, the first switching control signal having a second logic level and the second switching control signal having a first logic level may be output from the driving IC 530, and thus, the first switching circuit 171 of the switching circuit portion 170 may be turned on and the second switching circuit 172 of the switching circuit portion 170 may be turned off. Subsequently, the test data signal may be supplied from the driving IC 530 to the odd-numbered data line DLo, and thus, the sensing unit 533 of the driving IC 530 may sense a current input through the line selector 535 and a first current path CP1 including the odd-numbered data line DLo, the first switching circuit 171, and the reference voltage line RL to generate resistance sensing data. Subsequently, the timing controller 570 may generate a line resistance value of the odd-numbered data routing line and the reference routing line based on the resistance sensing data and may store the generated line resistance value in a storage circuit.

Subsequently, in a second test period of the test mode, a line resistance value between an even-numbered data routing line and the reference routing line may be sensed. According to an embodiment of the present disclosure, the second switching control signal having the second logic level and the first switching control signal having the first logic level may be output from the driving IC 530, and thus, the second switching circuit 172 of the switching circuit portion 170 may be turned on and the first switching circuit 171 of the switching circuit voltage 170 may be turned off. Subsequently, the test data signal may be supplied from the driving IC 530 to the even-numbered data line DLe, and thus, the sensing unit 533 of the driving IC 530 may sense a current input through the line selector 535 and a second current path CP2 including the even-numbered data line DLe, the second switching circuit 172, and the reference voltage line RL to generate resistance sensing data. Subsequently, the timing controller 570 may generate a line resistance value of the even-numbered data routing line and the reference routing line based on the resistance sensing data and may store the generated line resistance value in a storage circuit.

Subsequently, in a third test period of the test mode, a line resistance value between the odd-numbered data routing line and the even-numbered data routing line may be sensed. According to an embodiment of the present disclosure, the first and second switching control signals having the second logic level may be output from the driving IC 530, and thus, each of the first and second switching circuits 171 and 172 of the switching circuit portion 170 may be turned on. Subsequently, the test data signal may be supplied from the driving IC 530 to the odd-numbered data line DLo and the even-numbered data line DLe, and thus, the sensing unit 533 of the driving IC 530 may sense a current input through the line selector 535 and a third current path CP3 including the odd-numbered data line DLo, the first and second switching circuits 171 and 172, and even-numbered data line DLe to generate resistance sensing data. Subsequently, the timing controller 570 may generate a line resistance value of the odd-numbered data routing line and the even-numbered data routing line based on the resistance sensing data and may store the generated line resistance value in a storage circuit.

Subsequently, the timing controller 570 may generate a line resistance value of the odd-numbered data routing line and a line resistance value of the even-numbered data routing line through the above Equations 1 and 2 described above, based on the line resistance value generated in each of the first to third test periods and may additionally generate a line resistance value of the reference routing line.

Subsequently, the timing controller 570 may calculate a line-based resistance compensation value for compensating for a line-based resistance deviation based on a line-based resistance value and may store the line-based resistance compensation value in the storage circuit in a lookup table form. In an embodiment of the present disclosure, the timing controller 570 may modulate pixel data which is to be supplied to each of a plurality of data lines, based on a resistance compensation value of each of a plurality of data routing lines stored in the storage circuit and may supply the modulated pixel data to the driving IC 530. In another embodiment of the present disclosure, the timing controller 570 may set a current option value (or a bias voltage level) of each of the plurality of signal output circuits 531o and 531e respectively corresponding to a plurality of data lines based on a resistance compensation value of each of a plurality of data routing lines stored in the storage circuit, store the current option value in the storage circuit, and supply the current option value, stored in the storage circuit, to corresponding signal output circuits 531o and 531e. Accordingly, each of the plurality of signal output circuits 531o and 531e may output a data signal where a resistance value of a corresponding data routing line is compensated for based on a bias voltage level corresponding to a current option value supplied from the timing controller 570, and thus, a resistance deviation between line resistance values of a plurality of data routing lines may be compensated for.

Therefore, according to another embodiment of the present disclosure, the first and second switching circuits 171 and 172 of each of the plurality of switching circuit portions 170 may be selectively turned on and a current flowing in the reference voltage line RL may be sensed while supplying a test signal to each of the plurality of data lines DLo and DLe, and thus, a line resistance of each of the plurality of routing lines may be detected and a resistance deviation between line resistance values of a plurality of data routing lines may be compensated for.

Figure 20:
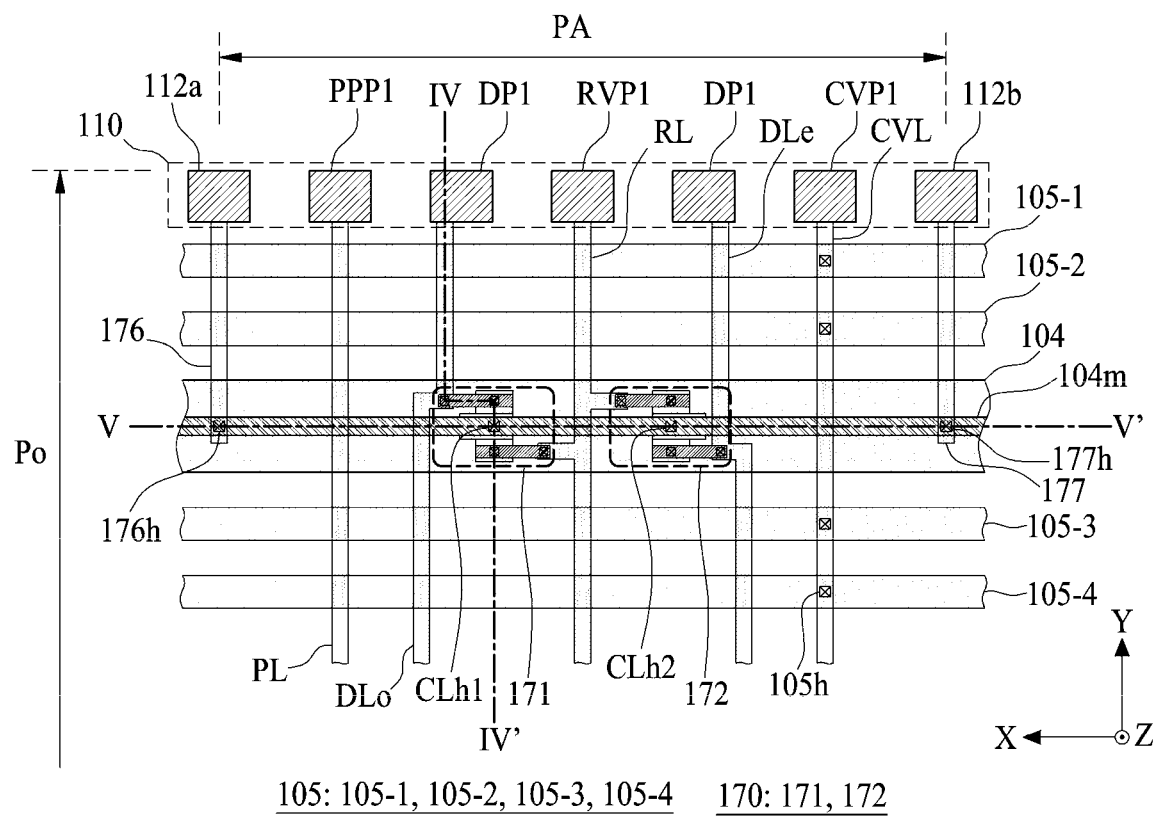
FIG. 20 is a diagram illustrating a plurality of switching circuit portions according to another embodiment of the present disclosure.
Figure 21:
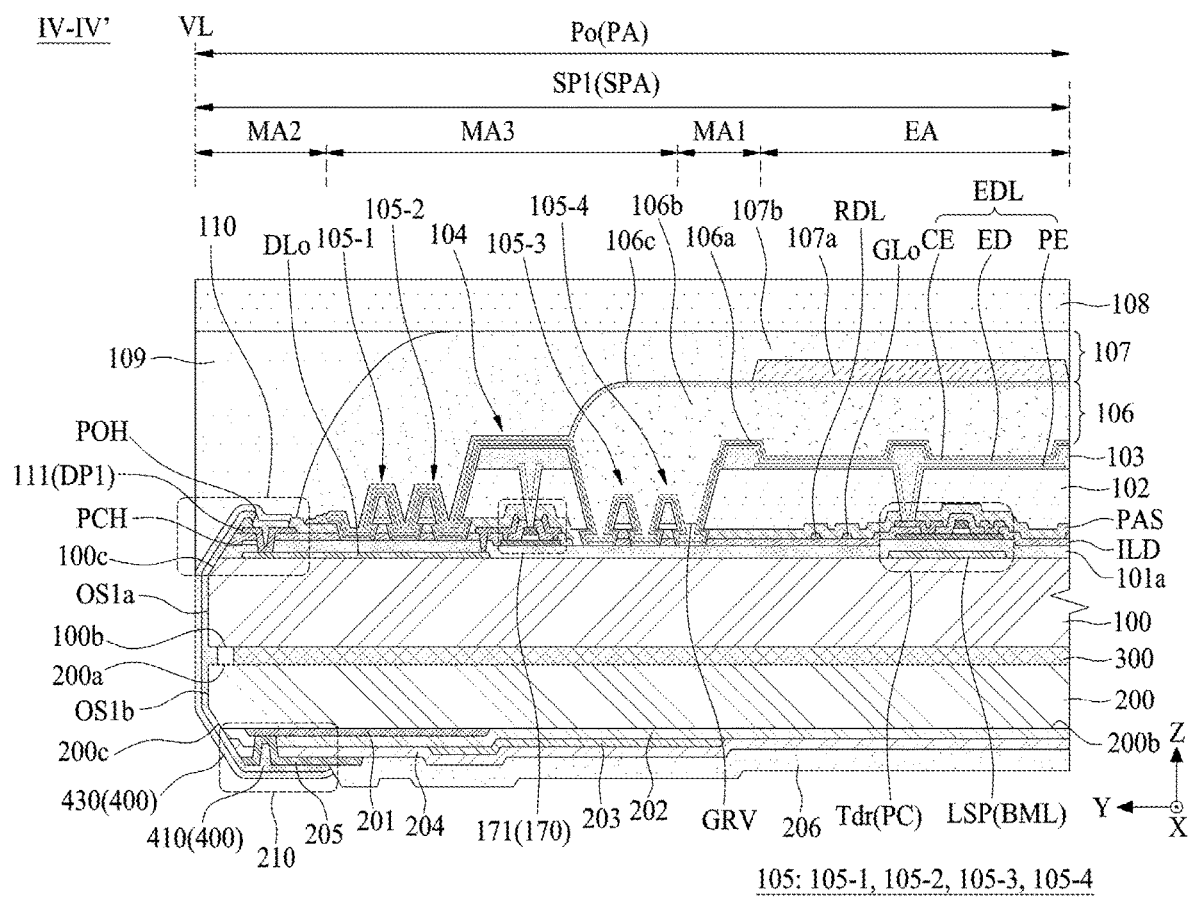
FIG. 21 is a cross-sectional view taken along line IV-IV' illustrated in FIG. 20.
Figure 22:
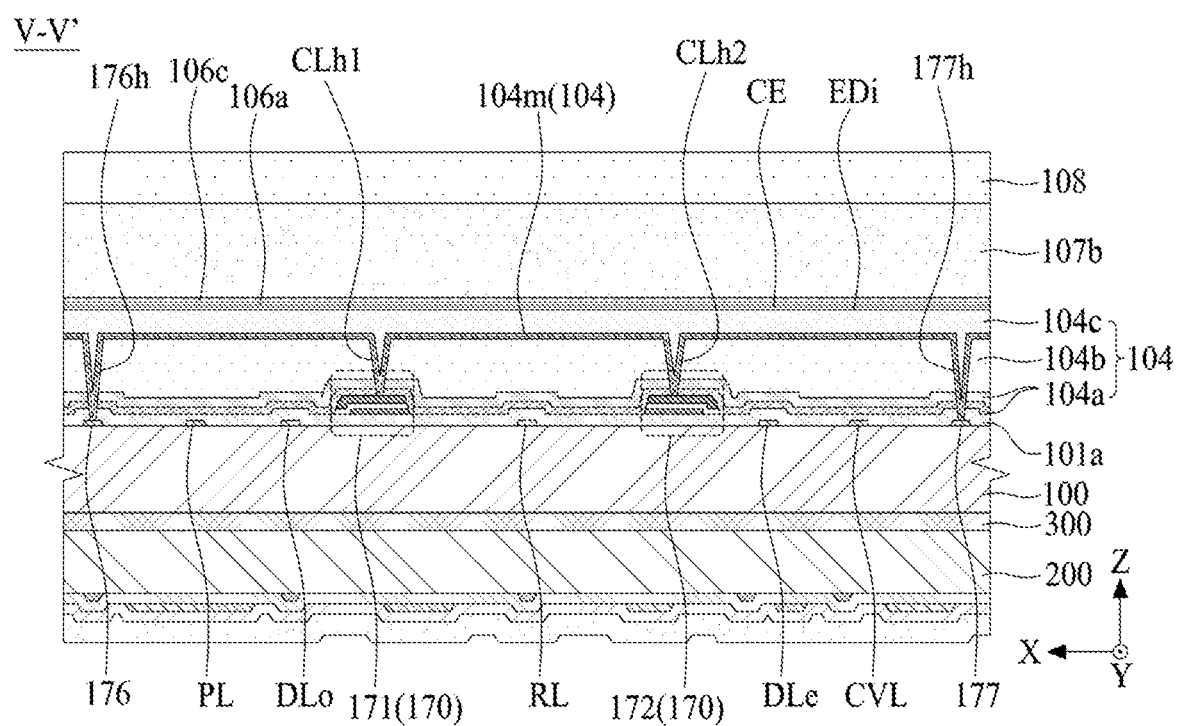
FIG. 22 is a cross-sectional view taken along line V-V' illustrated in FIG. 20.

FIG. 20 is a diagram illustrating a plurality of switching circuit portions according to another embodiment of the present disclosure, FIG. 21 is a cross-sectional view taken along line IV-IV' illustrated in FIG. 20, and FIG. 22 is a cross-sectional view taken along line V-V' illustrated in FIG. 20. FIGS. 20 to 22 illustrate an embodiment where a plurality of switching circuit portions are arranged to overlap one dam portion in the light emitting display apparatus described above with reference to FIGS. 17 and 18. Therefore, in the following description, the other elements except one dam portion, a plurality of switching circuit portions, and relevant elements refer to like elements, and their repetitive descriptions are omitted or will be briefly given.

Referring to FIGS. 20 to 22, a dam portion 104 according to another embodiment of the present disclosure may be configured to one-dimensionally have a closed loop line shape (or a continuous line shape or a closed loop shape) along a periphery portion of outermost pixels Po. Except for that a dam portion 104 is configured with a dam (or one dam) including a metal line 104m, the dam portion 104 may be configured to have substantially the same structure as that of the dam portion 104 described above with reference to FIGS. 1 to 14, and thus, the repetitive description thereof is omitted.

A separation portion 105 may include at least one outer separation structure (or first and second separation structure) 105-1 and 105-2 disposed in an outer region of the dam portion (or a dam) 104. The separation portion 105 may further include at least one inner separation structure (or third and fourth separation structure) 105-3 and 105-4 disposed in an inner region of the dam portion (or a dam) 104. The at least one outer separation structures 105-1 and 105-2 may be disposed to surround the dam portion 104. The at least one inner separation structures 105-3 and 105-4 may be disposed to be surrounded by the dam portion 104. Except for that the separation portion 105 further includes the at least one outer separation structures 105-1 and 105-2 and the at least one inner separation structures 105-3 and 105-4, the separation portion 105 may be configured to have substantially the same structure as that of the separation portion 105 described above with reference to FIGS. 1 to 13, and thus, the repetitive description thereof is omitted.

Additionally, a metal structure of each of the at least one outer separation structures 105-1 and 105-2 and the at least one inner separation structures 105-3 and 105-4 may be electrically connected to (or contact) a pixel common voltage line CVL through a via hole 105h.

The first pad portion 110 may include first and second front sensing control pads 112a and 112b and first and second pad connection lines 176 and 177. The first pad connection line 176 may be electrically connected to the metal line 104m of the dam portion 104 through a via hole 176h, and the second pad connection line 177 may be electrically connected to the metal line 104m of the dam portion 104 through a via hole 177h. Accordingly, the metal line 104m of the dam portion 104 may be commonly connected to the first and second pad connection lines 176 and 177. Additionally, the first pad portion 110 may be configured with only one front sensing control pad 112a and one pad connection line 176, but is not limited thereto and may include the plurality of first front sensing control pads 112a illustrated in FIG. 13.

Each of the plurality of switching circuit portions 170 according to another embodiment of the present disclosure may include first and second switching circuits 171 and 172. Except for that each of the first and second switching circuits 171 and 172 disposed in parallel with each other is commonly connected to the one metal line 104m, each of the first and second switching circuits 171 and 172 may be substantially the same as each of the first and second switching circuits 171 and 172 described above with reference to FIGS. 17 and 18, and thus, their repetitive descriptions are omitted.

Additionally, each of the front secondary pad portion 1110, the rear secondary pad portion 1210, the secondary routing portion, and the secondary link line portion 1250 described above with reference to FIGS. 14 and 15 may be applied to the embodiment illustrated in FIGS. 20 to 22.

As described above, according to another embodiment of the present disclosure, the same effect as in the light emitting display apparatus described above with reference to FIGS. 17 and 18 may be obtained, and comparing with the light emitting display apparatus described above with reference to FIGS. 17 and 18, because an area occupied by the dam portion 104 is further reduced, it may be further easy to design a pixel having a high resolution.

Figure 23:
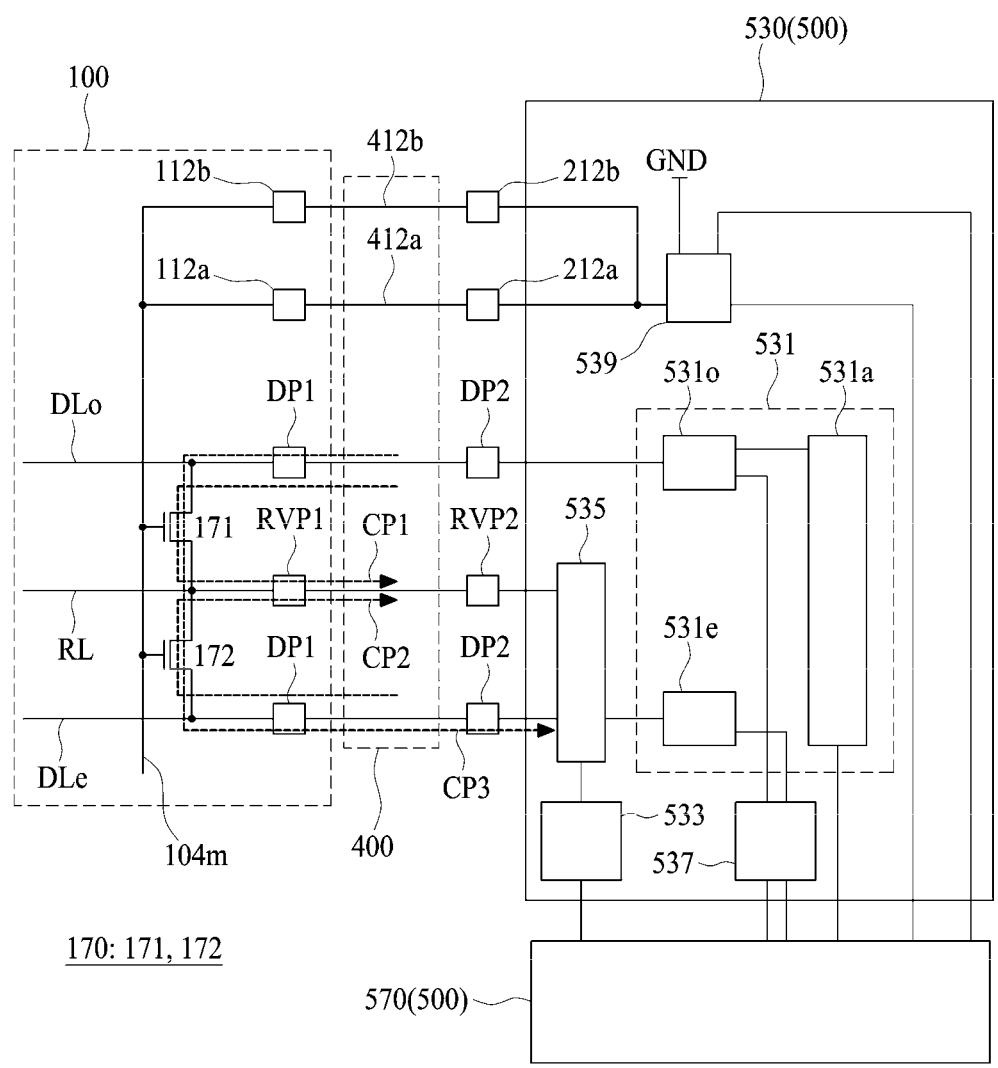
FIG. 23 is a diagram schematically illustrating a switching circuit portion, a driving IC, and a timing controller according to another embodiment of the present disclosure.

FIG. 23 is a diagram schematically illustrating a switching circuit portion, a driving IC, and a timing controller according to another embodiment of the present disclosure and is a diagram for describing sensing of a line resistance of a routing line or short circuit of the routing line through a switching circuit portion.

Referring to FIGS. 20 to 23, a driving IC 530 according to another embodiment of the present disclosure may include a data driver 531, a sensing unit 533, and a line selector 535. Except for that the driving IC 530 including such elements is configured to output a single switching control signal (or one switching control signal) supplied from the timing controller 570 in the test mode, the driving IC 530 may be substantially the same as the driving IC 530 described above with reference to FIG. 16, and thus, the repetitive description thereof is omitted.

The timing controller 570 may generate a single switching control signal to control a switching operation of each of first and second switching circuits 171 and 172 in the test mode and may generate test data and a line selection signal to provide the generated test data and line selection signal to the data driver 531. Except for that the timing controller 570 controls a switching operation of each of first and second switching circuits 171 and 172 of a switching circuit portion 170 generating the single switching control signal, the timing controller 570 may be substantially the same as the timing controller 570 described above with reference to FIG. 16, and thus, the repetitive description thereof is omitted.

Optionally, the timing controller 570 may not generate a bias voltage corresponding to the line-based resistance compensation value and may supply the line-based resistance compensation value to the driving IC 530. In this case, the driving IC 530 may further include a bias voltage generator 537. The bias voltage generator 537 may generate a line-based bias voltage corresponding to each line-based resistance compensation value supplied from the timing controller 570 and may supply the generated line-based bias voltage to bias terminals of corresponding signal output circuits 531o and 531e.

Additionally, the driving IC 530 or the driving circuit part 500 according to another embodiment of the present disclosure may further include a voltage selector 539.

The voltage selector 539 may select and output one of a ground voltage and a switching control signal supplied from the timing controller 570 based on a voltage selection signal of the timing controller 570.

In the test mode, the voltage selector 539 may output the switching control signal supplied from the timing controller 570 based on a voltage selection signal having a first logic level supplied from the timing controller 570, and thus, each of the first and second switching circuits 171 and 172 of the switching circuit portion 170 may be turned on based on the switching control signal supplied through each of the first and second front sensing control pads 112a and 112b from the voltage selector 539.

The voltage selector 539 may output a ground voltage GND supplied from the timing controller 570 based on a voltage selection signal having a second logic level supplied from the timing controller 570 in a non-test mode or a normal driving mode, and thus, each of the first and second switching circuits 171 and 172 of the switching circuit portion 170 may be maintained in an off state by the ground voltage GND supplied through the metal line 104m of the dam portion 104 and each of the first and second front sensing control pads 112a and 112b from the voltage selector 539, and the metal line 104m of the dam portion 104 may be maintained with the ground voltage GND and may be used as an anti-electrostatic line or a static electricity blocking line.

In the light emitting display apparatus according to an embodiment of the present disclosure, a driving method for testing short circuit of a routing line will be described below.

First, the switching control signal having a first logic level may be output from the timing controller 570, and thus, each of the first and second switching circuits 171 and 172 of the switching circuit portion 170 may be turned off.

Subsequently, the test data signal may be supplied from the driving IC 530 to the data lines DLo and DLe, and thus, the sensing unit 533 of the driving IC 530 may sense a current input through the reference voltage line RL and the line selector 535 to output line sensing data.

Subsequently, the timing controller 570 may determine the short circuit or not of the routing line, based on line sensing data. For example, when short circuit between the reference voltage line RL and the data lines DLo and DLe disposed adjacent to each other occurs, a current flowing in the data lines DLo and DLe may flow in the reference voltage line RL through a short circuit portion, and thus, the sensing unit 533 may sense a current flowing in the reference voltage line RL to detect the occurrence or not of short circuit between lines. For example, when line sensing data is greater than or equal to a reference threshold voltage value, the timing controller 570 may determine the occurrence of short circuit between routing lines.

Therefore, according to an embodiment of the present disclosure, the first and second switching circuits 171 and 172 of each of the plurality of switching circuit portions 170 may be turned off and a current flowing in each of the plurality of reference voltage lines RL may be sensed while supplying a test signal to each of the plurality of data lines DLo and DLe, and thus, a short circuit defect between the plurality of routing lines may be detected.

In the light emitting display apparatus according to another embodiment of the present disclosure, a driving method for sensing a line resistance of a routing line will be described below.

First, in a first test period of a test mode, an odd-numbered signal output circuit 531o of the driving IC 530 is enabled, an even-numbered signal output circuit 531e is disabled, and thus, a line resistance value between an odd-numbered data routing line and a reference routing line may be sensed. According to an embodiment of the present disclosure, the switching control signal having a second logic level may be output from the driving IC 530, and thus, the first and second switching circuits 171 and 172 of the switching circuit portion 170 may be simultaneously turned on. Subsequently, the test data signal may be supplied from the odd-numbered signal output circuit 531o of the driving IC 530 to the odd-numbered data line DLo, and thus, the sensing unit 533 of the driving IC 530 may sense a current input through the line selector 535 and a first current path CP1 including the odd-numbered data line DLo, the first switching circuit 171, and the reference voltage line RL to generate resistance sensing data. Subsequently, the timing controller 570 may generate a line resistance value of the odd-numbered data routing line and the reference routing line based on the resistance sensing data and may store the generated line resistance value in a storage circuit.

Subsequently, in a second test period of the test mode, the odd-numbered signal output circuit 531o of the driving IC 530 is disabled, the even-numbered signal output circuit 531e is enabled, and thus, a line resistance value between an even-numbered data routing line and the reference routing line may be sensed. According to an embodiment of the present disclosure, the switching control signal having the second logic level may be output from the driving IC 530, and thus, the first and second switching circuits 171 and 172 of the switching circuit portion 170 may be simultaneously turned on. Subsequently, the test data signal may be supplied from the even-numbered signal output circuit 531e of the driving IC 530 to the even-numbered data line DLe, and thus, the sensing unit 533 of the driving IC 530 may sense a current input through the line selector 535 and a second current path CP2 including the even-numbered data line DLe, the second switching circuit 172, and the reference voltage line RL to generate resistance sensing data. Subsequently, the timing controller 570 may generate a line resistance value of the odd-numbered data routing line and the reference routing line based on the resistance sensing data and may store the generated line resistance value in a storage circuit.

Subsequently, in a third test period of a test mode, an odd-numbered signal output circuit 531o of the driving IC 530 is enabled, an even-numbered signal output circuit 531e is disabled, and thus, a line resistance value between the odd-numbered data routing line and the even-numbered data routing line may be sensed. According to an embodiment of the present disclosure, the switching control signal having the second logic level may be output from the driving IC 530, and thus, the first and second switching circuits 171 and 172 of the switching circuit portion 170 may be simultaneously turned on. Subsequently, the test data signal may be supplied from the odd-numbered signal output circuit 531o of the driving IC 530 to the odd-numbered data line DLo, and thus, the sensing unit 533 of the driving IC 530 may sense a current input through the line selector 535 and a third current path CP3 including the odd-numbered data line DLo, the first and second switching circuits 171 and 172, and the even-numbered data line DLe to generate resistance sensing data. Subsequently, the timing controller 570 may generate a line resistance value of the odd-numbered data routing line and the even-numbered data routing line based on the resistance sensing data and may store the generated line resistance value in a storage circuit.

Subsequently, the timing controller 570 may generate a line resistance value of the odd-numbered data routing line and a line resistance value of the even-numbered data routing line through the following Equations 1 and 2 described above, based on the line resistance value generated in each of the first to third test periods and may additionally generate a line resistance value of the reference routing line.

Subsequently, the timing controller 570 may calculate a line-based resistance compensation value for compensating for a line-based resistance deviation based on a line-based resistance value and may store the line-based resistance compensation value in the storage circuit in a lookup table form. In an embodiment of the present disclosure, the timing controller 570 may modulate pixel data which is to be supplied to each of a plurality of data lines, based on a resistance compensation value of each of a plurality of data routing lines stored in the storage circuit and may supply the modulated pixel data to the driving IC 530. In another embodiment of the present disclosure, the timing controller 570 may set a current option value (or a bias voltage level) of each of the plurality of signal output circuits 531o and 531e respectively corresponding to a plurality of data lines based on a resistance compensation value of each of a plurality of data routing lines stored in the storage circuit, store the current option value in the storage circuit, and supply the current option value, stored in the storage circuit, to corresponding signal output circuits 531o and 531e. Accordingly, each of the plurality of signal output circuits 531o and 531e may output a data signal where a resistance value of a corresponding data routing line is compensated for based on a bias voltage level corresponding to a current option value supplied from the timing controller 570, and thus, a resistance deviation between line resistance values of a plurality of data routing lines may be compensated for.

Therefore, according to another embodiment of the present disclosure, the first and second switching circuits 171 and 172 of each of the plurality of switching circuit portions 170 may be simultaneously turned on and a current flowing in the reference voltage line RL may be sensed while supplying a test signal to each of the plurality of data lines DLo and DLe, and thus, a line resistance of each of the plurality of routing lines may be detected and a resistance deviation between line resistance values of a plurality of data routing lines may be compensated for.

Figure 24:
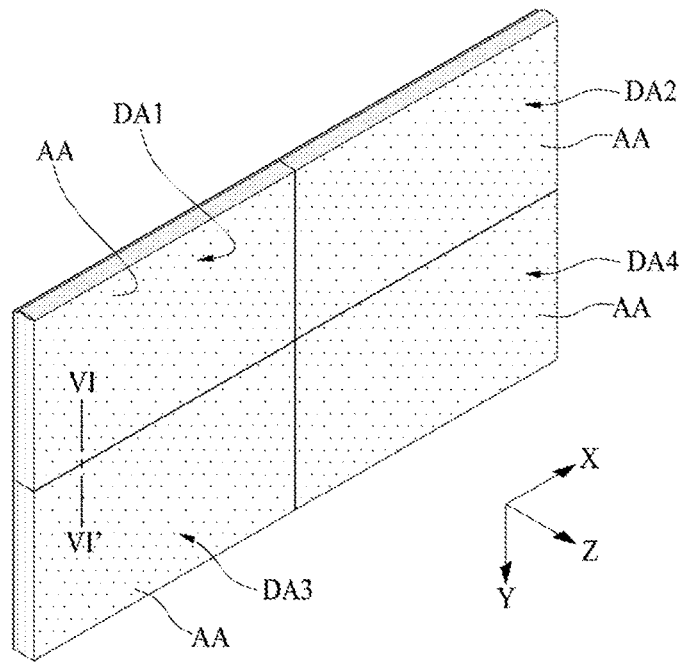
FIG. 24 is a diagram illustrating a multi-screen display apparatus according to an embodiment of the present disclosure.
Figure 25:
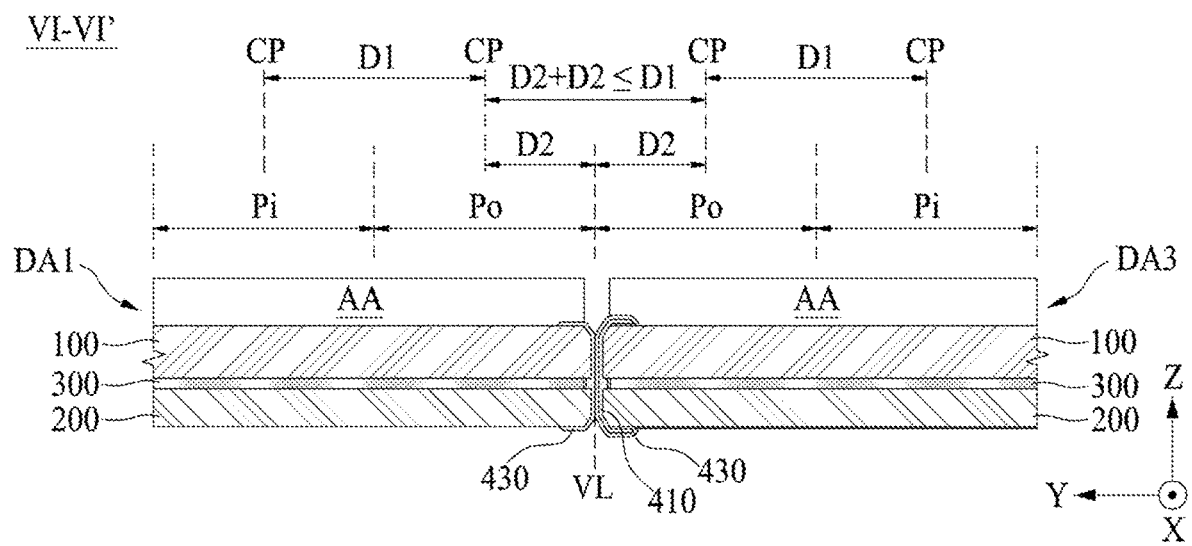
FIG. 25 is a cross-sectional view taken along line VI-VI' illustrated in FIG. 24.

FIG. 24 is a diagram illustrating a multi-screen display apparatus according to an embodiment of the present disclosure, and FIG. 25 is a cross-sectional view taken along line VI-VI' illustrated in FIG. 24. FIGS. 24 and 25 illustrate a multi-screen display apparatus implemented by tiling the light emitting display apparatus according to an embodiment of the present disclosure illustrated in FIGS. 1 to 23.

Referring to FIGS. 24 and 25, the multi-screen display apparatus (or multi-screen light emitting display apparatus or a tiling light emitting display apparatus) according to an embodiment of the present disclosure may include a plurality of display apparatuses DA1 to DA4.

The plurality of display apparatuses DA1 to DA4 may each display an individual image or may divisionally display one image. Each of the plurality of display apparatuses DA1 to DA4 may include the light emitting display apparatus according to an embodiment of the present disclosure illustrated in FIGS. 1 to 23, and thus, their repetitive descriptions may be omitted.

The plurality of display apparatuses DA1 to DA4 may be tiled on a separate tiling frame to contact each other in a lateral surface thereof (or in a side-to-side connection relationship). For example, the plurality of display apparatuses DA1 to DA4 may be tiled to have an N×M form, thereby implementing a multi-screen display apparatus having a large screen. For example, N is a positive integer of 1 or more and M is a positive integer of 2 or more. For example, N is a positive integer of 2 or more and M is a positive integer of 1 or more.

Each of the plurality of display apparatuses DA1 to DA4 may not include a bezel area (or a non-display portion) surrounding all of a display portion AA where an image is displayed, and may have an air-bezel structure where the display portion AA is surrounded by air. For example, in each of the plurality of display apparatuses DA1 to DA4, all of a first surface of a substrate 100 may be implemented as the display portion AA.

According to an embodiment, in each of the plurality of display apparatuses DA1 to DA4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display apparatuses DA1 to DA4 connected to (or contacting) each other at lateral surfaces thereof along the first direction X and the second direction Y based on a lateral coupling method, an interval "D2+D2" between two adjacent outermost pixels Po may be equal to or less than the first interval D1 between two adjacent pixels.

Referring to FIG. 24, in first and third display apparatuses DA1 and DA3 connected to (or contacting) each other at lateral surfaces thereof along the second direction Y, the interval "D2+D2" between a center portion CP of an outermost pixel Po of the first display apparatus DA1 and a center portion CP of an outermost pixel Po of the third display apparatus DA3 may be equal to or less than the first interval D1 (or a pixel pitch) between two adjacent pixels Po and Pi disposed at each of the first and third display apparatuses DA1 and DA3.

Therefore, the interval "D2+D2" between center portions CP of outermost pixels Po of two adjacent display apparatuses DA1 to DA4 connected to (or contacting) each other at lateral surfaces thereof along the first direction X and the second direction Y may be equal to or less than the first interval D1 between two adjacent pixels Po and Pi disposed at each of the display apparatuses DA1 to DA4, and thus, there may be no seam or boundary portion between two adjacent display apparatuses DA1 to DA4, whereby there may be no dark area caused by a boundary portion provided between the display apparatuses DA1 to DA4. As a result, the image displayed on the multi-screen display apparatus in which each of the plurality of display apparatuses DA1 to DA4 is tiled in an N×M form may be displayed continuously without a sense of disconnection (or discontinuity) at boundary portion between the plurality of display apparatuses DA1 to DA4.

In FIGS. 24 and 25, it is illustrated that the plurality of display apparatuses DA1 to DA4 are tiled in a 2×2 form, but embodiments of the present disclosure are not limited thereto, and the plurality of display apparatuses DA1 to DA4 may be tiled in an x×1 form, a 1×y form, or an x×y form. For example, x and y may be two or more natural numbers equal to or different from each other. For example, x may be two or more natural numbers or equal to y. y may be two or more natural numbers or greater or less than x.

As described above, when display portion AA of each of the plurality of display apparatuses DA1 to DA4 is one screen and displays one image, a multi-screen display apparatus according to an embodiment of the present disclosure may display an image which is not disconnected and is continuous at a boundary portion between the plurality of display apparatuses DA1 to DA4, and thus, the immersion of a viewer watching an image displayed by the multi-screen display apparatus may be enhanced.

A light emitting display apparatus and multi-screen display apparatus including the same according to an embodiment of the present disclosure will be described below.

A light emitting display apparatus according to an embodiment of the present disclosure may comprise a substrate, a display portion including a plurality of pixel driving lines disposed over the substrate and a plurality of pixels selectively connected to the plurality of pixel driving lines, a light emitting device layer including a self-emitting device disposed at the display portion, a dam portion disposed along a periphery portion of the substrate, the dam portion including at least one dam including a metal line; an encapsulation layer disposed to cover the light emitting device layer, the encapsulation layer including an organic encapsulation layer surrounded by the dam portion, a plurality of switching circuit portions disposed to overlap the at least one dam and selectively connected to the plurality of pixel driving lines, and a front pad portion including a plurality of front pads disposed at one periphery portion of the substrate and electrically coupled to the plurality of pixel driving lines and the metal line of the at least one dam, each of the plurality of switching circuit portions may comprise first and second switching circuits each including a gate electrode electrically coupled to the metal line of the at least one dam.

According to some embodiments of the present disclosure, each of the plurality of switching circuit portions may be disposed between the substrate and the at least one dam.

According to some embodiments of the present disclosure, each of the plurality of switching circuit portions may be disposed in a respective one of a plurality of outermost pixels disposed at a first periphery portion of the substrate among the plurality of pixels.

According to some embodiments of the present disclosure, the metal line of the at least one dam may be electrically connected to at least one of the plurality of front pads.

According to some embodiments of the present disclosure, the dam portion may comprise first to third dams disposed in parallel to surround the display portion, each of the first to third dams including the metal line, each of the plurality of switching circuit portions may further comprise a third switching circuit, the first switching circuit may be disposed to overlap the first dam and comprises the gate electrode connected to the metal line of the first dam, the second switching circuit may be disposed to overlap the second dam and comprises the gate electrode connected to the metal line of the second dam, and the third switching circuit may be disposed to overlap the third dam and comprises a gate electrode connected to the metal line of the third dam.

According to some embodiments of the present disclosure, each of the plurality of switching circuit portions may be selectively connected to an odd-numbered data line, a reference voltage line, and an even-numbered data line disposed adjacent to one another among the plurality of pixel driving lines, the first switching circuit may further comprise a first electrode electrically coupled to the odd-numbered data line and a second electrode electrically coupled to the reference voltage line, the second switching circuit may further comprise a first electrode electrically coupled to the even-numbered data line and a second electrode electrically coupled to the reference voltage line, and the third switching circuit may further comprise a first electrode electrically coupled to the odd-numbered data line and a second electrode electrically coupled to the even-numbered data line.

According to some embodiments of the present disclosure, the dam portion may comprise first and second dams disposed in parallel to surround the display portion, each of the first and second dams including the metal line, the first switching circuit may be disposed to overlap the first dam and comprises the gate electrode connected to the metal line of the first dam, the second switching circuit may be disposed to overlap the second dam and comprises the gate electrode connected to the metal line of the second dam.

According to some embodiments of the present disclosure, each of the plurality of switching circuit portions may be selectively connected to an odd-numbered data line, a reference voltage line, and an even-numbered data line disposed adjacent to one another among the plurality of pixel driving lines, the first switching circuit may further comprise a first electrode electrically coupled to the odd-numbered data line and a second electrode electrically coupled to the reference voltage line, and the second switching circuit may further comprise a first electrode electrically coupled to the even-numbered data line and a second electrode electrically coupled to the reference voltage line.

According to some embodiments of the present disclosure, the dam portion may comprise a dam disposed to surround the display portion, the dam including the metal line, the first switching circuit may be disposed to overlap the dam and comprises the gate electrode connected to the metal line of the dam, and the second switching circuit may be disposed in parallel with the first switching circuit to overlap the dam and comprises the gate electrode connected to the metal line of the dam.

According to some embodiments of the present disclosure, each of the plurality of switching circuit portions may be selectively connected to an odd-numbered data line, a reference voltage line, and an even-numbered data line disposed adjacent to one another among the plurality of pixel driving lines, the first switching circuit may further comprise a first electrode electrically coupled to the odd-numbered data line and a second electrode electrically coupled to the reference voltage line, and the second switching circuit may further comprise a first electrode electrically coupled to the even-numbered data line and a second electrode electrically coupled to the reference voltage line.

According to some embodiments of the present disclosure, the light emitting display apparatus may further comprise a driving circuit part supplying a ground voltage to the metal line.

According to some embodiments of the present disclosure, the light emitting display apparatus may further comprise a rear pad portion including a plurality of rear pads respectively overlapping the plurality of front pads, a link line portion including a plurality of link lines electrically coupled to the plurality of rear pads, an input pad portion including a plurality of input pads electrically coupled to the plurality of link lines, a driving circuit part connected to the input pad portion; and a routing portion including a plurality of routing lines respectively and electrically coupled to the plurality of front pads and the plurality of rear pads to surround an outer surface of the substrate.

According to some embodiments of the present disclosure, each of the plurality of switching circuit portions may be selectively connected to an odd-numbered data line, a reference voltage line, and an even-numbered data line arranged adjacent to one another among the plurality of pixel driving lines, and the driving circuit part may comprise a driving integrated circuit including a data driver including a plurality of signal output circuits outputting a test signal to the odd-numbered data line or the even-numbered data line, and a sensing unit sensing a current flowing in the reference voltage line through at least one of the first and second switching circuits based on the test signal; and a timing controller providing test data to the driving integrated circuit and setting a bias voltage level input to a bias terminal of each of the plurality of signal output circuits based on sensing data provided from the sensing unit.

According to some embodiments of the present disclosure, the timing controller may determine the occurrence or not of a short circuit between the plurality of routing lines based on the sensing data, or may generate a line resistance value of a data routing line connected to a data line among the plurality of routing lines based on the sensing data and sets the bias voltage level based on the generated line resistance value.

According to some embodiments of the present disclosure, the light emitting display apparatus may further comprise a front secondary pad portion including at least one front secondary pad disposed at a second periphery portion of the substrate and electrically coupled to the metal line of the at least one dam, a rear secondary pad portion including at least one rear secondary pad overlapping the at least one front secondary pad, and a secondary link line portion including at least one secondary link line electrically coupled to the at least one front secondary pad and the at least one rear secondary pad, the at least one secondary link line may be electrically coupled to at least one of the plurality of input pads.

According to some embodiments of the present disclosure, the at least one dam may comprise a first dam pattern over the substrate, a second dam pattern over the first dam pattern, and a third dam pattern over the second dam pattern, and the metal line may be between the second dam pattern and the third dam pattern.

According to some embodiments of the present disclosure, the at least one dam may further comprise an undercut region implemented between a lateral surface of the first dam pattern and the second dam pattern, and the self-emitting device over the dam portion may be isolated in the undercut region.

According to some embodiments of the present disclosure, the light emitting display apparatus may further comprise a separation portion including a plurality of separation structures disposed near the at least one dam, each of the plurality of separation structures may comprise a lower structure, an upper structure disposed over the lower structure to have an eaves structure with respect to the lower structure, and the self-emitting device disposed over the separation portion may be isolated by the eaves structure.

According to some embodiments of the present disclosure, the light emitting display apparatus may further comprise a separation portion including a plurality of separation structures disposed near the at least one dam, each of the plurality of separation structures may comprise a lower structure, an upper structure disposed over the lower structure to have an eaves structure with respect to the lower structure, at least one of the plurality of separation structures may further comprise a metal structure disposed between the lower structure and the upper structure, the metal structure may be disposed over the lower structure to have another eaves structure with respect to the lower structure, and the self-emitting device disposed over the separation portion may be isolated by the metal structure.

According to some embodiments of the present disclosure, each of the plurality of separation structures may overlap the plurality of pixel driving lines, and the metal structure may be electrically coupled to at least one pixel common voltage line of the plurality of pixel driving lines.

According to some embodiments of the present disclosure, the light emitting display apparatus may further comprise a planarization layer between the substrate and the light emitting device layer, a passivation layer between the substrate and the planarization layer, a groove line disposed at an inner region of the dam portion and implemented by removing all of the planarization layer and the passivation layer, and an undercut region implemented between a lateral surface of the passivation layer adjacent to the groove line and a lateral surface of the planarization layer adjacent to the groove line, the self-emitting device disposed over the groove line and the lateral surface of the planarization layer may be isolated in the undercut region.

A multi-screen display apparatus according to an embodiment of the present disclosure may comprise a plurality of display apparatuses disposed along at least one direction of a first direction and a second direction crossing the first direction, each of the plurality of display apparatuses may include a light emitting display apparatus, the light emitting display apparatus comprises a substrate; a display portion including a plurality of pixel driving lines disposed over the substrate and a plurality of pixels selectively connected to the plurality of pixel driving lines; a light emitting device layer including a self-emitting device disposed at the display portion; a dam portion disposed along a periphery portion of the substrate, the dam portion including at least one dam including a metal line; an encapsulation layer disposed to cover the light emitting device layer, the encapsulation layer including an organic encapsulation layer surrounded by the dam portion; a plurality of switching circuit portions disposed to overlap the at least one dam and selectively connected to the plurality of pixel driving lines; and a front pad portion including a plurality of front pads disposed at one periphery portion of the substrate and electrically coupled to the plurality of pixel driving lines and the metal line of the at least one dam, each of the plurality of switching circuit portions comprises first and second switching circuits each including a gate electrode electrically coupled to the metal line of the at least one dam. The light emitting display apparatus of each of the plurality of display apparatuses may further be configured in accordance with one or more embodiments described herein.

According to some embodiments of the present disclosure, in the light emitting display apparatus of each of the plurality of display apparatuses, the plurality of pixels may be arranged over the substrate along the first direction and the second direction, in a first display apparatus and a second display apparatus adjacent along at least one of the first direction and the second direction, a distance between a center portion of an outermost pixel of the first display apparatus and a center portion of an outermost pixel of the second display apparatus may be less than or equal to a pixel pitch, and the pixel pitch may be a distance between center portions of two adjacent pixels to each other.

A light emitting display apparatus according to an embodiment of the present disclosure may include a substrate comprising a display portion, in which a plurality of pixels are disposed, the plurality of pixels comprising outermost pixels disposed at a periphery portion of the substrate; a dam portion disposed in the outermost pixels and comprising one or more metal lines; one or more switching circuit portions disposed in the outermost pixels so as to overlap the dam portion; and a driving circuit part electrically coupled to the one or more metal lines and configured to provide one or more switching control signals to the one or more switching circuit portions through the one or more metal lines.

In some embodiments of the present disclosure, the light emitting display apparatus further comprises a plurality of routing lines coupled to the one or more switching circuit portions, wherein the light emitting display apparatus is configured to detect an electrical short circuit between one or more of the routing lines and/or to sense a line resistance of one or more of the routing lines by controlling the switching operation of the one or more switching circuit portions through the one or more metal lines.

In some embodiments of the present disclosure, each of the one or more switching circuit portions comprises one or more switching circuits, wherein each switching circuit is configured as a thin film transistor comprising a first source/drain electrode, a second source/drain electrode and a gate electrode, wherein the first source drain/electrode is electrically connected to a respective one of the plurality of routing lines, the second source/electrode is connected to a respective other one of the plurality of routing lines, and the gate electrode is connected to a respective one of the one or more metal lines.

In some embodiments of the present disclosure, the display portion is disposed at a front surface of the light emitting display apparatus and the driving circuit part is disposed at a rear surface of the light emitting display apparatus, and wherein the light emitting display apparatus further comprises: a first pad portion comprising a plurality of first pads disposed at the front surface of the light emitting display apparatus; a second pad portion comprising a plurality of second pads disposed at the rear surface of the light emitting display apparatus; and a routing portion disposed at an outer surface of the substrate and comprising the plurality of routing lines connecting the plurality of first pads to the plurality of second pads; wherein, preferably, the light emitting display apparatus further comprises: a line substrate; and a coupling member interposed between the substrate and the line substrate, wherein the driving circuit part and the second pad portion are disposed at a rear surface of the line substrate.

In some embodiments of the present disclosure, the first pad portion further comprises one or more front sensing control pads and one or more pad connection lines connected to the one or more front sensing control pads, wherein each of the one or more front sensing control pads is connected to a respective one of the one or more metal lines through a respective one of the one or more pad connection lines, and wherein, in a test mode of the light emitting display apparatus, the driving circuit part is configured to provide a corresponding switching control signal to each of the one or more metal lines through a respective one of the one or more front sensing control pads and a respective one of the one or more pad connection lines.

In some embodiments of the present disclosure, the second pad portion further comprises one or more rear sensing control pads; wherein the routing portion further comprises one or more sensing control routing lines; wherein the light emitting display apparatus further comprises a link line portion disposed at the rear surface of the light emitting display apparatus and comprising a sensing control link line; wherein the one or more sensing control routing lines are connected in a one-to-one relationship to the one or more front sensing control pads and the one or more rear sensing control pads; and wherein the one or more rear sensing control pads are connected to the sensing control link line in common.

In some embodiments of the present disclosure, the dam portion comprises a first dam and a second dam, wherein each of the one or more switching circuit portions comprises a first switching circuit and a second switching circuit, wherein the first switching circuit is disposed under the first dam and the second switching circuit is disposed under the second dam, wherein the one or more metal lines comprise a first metal line embedded in the first dam and coupled to the first switching circuit, and a second metal line embedded in the second dam and coupled to the second switching circuit.

In some embodiments of the present disclosure, each of the first and second switching circuits is configured as a thin film transistor comprising a first source/drain electrode, a second source/drain electrode, and a gate electrode, wherein the first source/drain electrode of the first switching circuit is electrically connected to a first data line, the second source/drain electrode of the first switching circuit is electrically connected to a reference voltage line, and the gate electrode of the first switching circuit is electrically connected to the metal line embedded in the first dam, wherein the first source/drain electrode of the second switching circuit is electrically connected to the reference voltage line, the second source/drain electrode of the second switching circuit is electrically connected to a second data line, and the gate electrode of the second switching circuit is electrically connected to the metal line embedded in the second dam.

In some embodiments of the present disclosure, in a test mode of the light emitting display apparatus, the first switching circuit is configured to sense a line resistance of a first data routing line connected to the first data line and a line resistance of a reference routing line connected to the reference voltage line, and/or the second switching circuit is configured to sense a line resistance of a second data routing line connected to the second data line and the line resistance of the reference routing line connected to the reference voltage line.

In some embodiments of the present disclosure, in a test mode of the light emitting display apparatus, the driving circuit part is configured to turn off the first and second switching circuits and to sense a current flowing in the reference voltage line while supplying a test signal to each of the first and second data lines, so as to detect a short circuit defect between one or more of the routing lines connected to the first and second switching circuits.

In some embodiments of the present disclosure, in a test mode of the light emitting display apparatus, the driving circuit part is configured to selectively turn on the first and second switching circuits and to sense a current flowing in the reference voltage line while supplying a test signal to each of the first and second data lines, so as to detect a line resistance of each of data routing lines connected to the first and second data lines, and to compensate a resistance deviation between line resistance values of the data routing lines.

In some embodiments of the present disclosure, the light emitting display apparatus further comprises a separation portion comprising a first separation structure disposed between the first dam and the second dam, wherein, preferably, the separation structure is implemented in parallel to the first and second dams to one-dimensionally have a closed loop line shape, wherein, further preferably, the separation structure comprises a metal structure that is electrically coupled to a pixel common voltage line of the light emitting display apparatus, wherein, still further preferably, the separation portion further comprises one or more additional separation structures disposed in an inner region of the second dam.

In some embodiments of the present disclosure, the dam portion further comprises a third dam, wherein each of the one or more switching circuit portions further comprises a third switching circuit, wherein the third switching circuit is disposed under the third dam, and wherein the one or more metal lines further comprise a third metal line embedded in the third dam and coupled to the third switching circuit, wherein, preferably: each of the first to third dams is implemented in parallel to one-dimensionally have a closed loop line shape, the first dam is disposed to surround the second dam, and the second dam is disposed to surround the third dam.

In some embodiments of the present disclosure, each of the first to third switching circuits is configured as a thin film transistor comprising a first source/drain electrode, a second source/drain electrode, and a gate electrode, wherein the first source/drain electrode of the first switching circuit is electrically connected to a first data line, the second source/drain electrode of the first switching circuit is electrically connected to a reference voltage line, and the gate electrode of the first switching circuit is electrically connected to the metal line embedded in the first dam, wherein the first source/drain electrode of the second switching circuit is electrically connected to the reference voltage line, the second source/drain electrode of the second switching circuit is electrically connected to a second data line, and the gate electrode of the second switching circuit is electrically connected to the metal line embedded in the second dam, and wherein the first source/drain electrode of the third switching circuit is electrically connected to the first data line, the second source/drain electrode of the third switching circuit is electrically connected to the second data line, and the gate electrode of the third switching circuit is electrically connected to the metal line embedded in the third dam.

In some embodiments of the present disclosure, in a test mode of the light emitting display apparatus, the first switching circuit is configured to sense a line resistance of a first data routing line connected to the first data line and a line resistance of a reference routing line connected to the reference voltage line, and/or the second switching circuit is configured to sense a line resistance of a second data routing line connected to the second data line and the line resistance of the reference routing line connected to the reference voltage line, and/or the third switching circuit is configured to sense the line resistance of the first data routing line connected to the first data line and the line resistance of the second data routing line connected to the second data line.

In some embodiments of the present disclosure, in a test mode of the light emitting display apparatus, the driving circuit part is configured to turn off the first to third switching circuits and to sense a current flowing in the reference voltage line while supplying a test signal to each of the first and second data lines, so as to detect a short circuit defect between one or more of the routing lines connected to the first to third switching circuits.

In some embodiments of the present disclosure, in a test mode of the light emitting display apparatus, the driving circuit part is configured to selectively turn on the first to third switching circuits and to sense a current flowing in the reference voltage line while supplying a test signal to each of the first and second data lines, so as to detect a line resistance of each of data routing lines connected to the first and second data lines, and to compensate a resistance deviation between line resistance values of the data routing lines.

In some embodiments of the present disclosure, the light emitting display apparatus further comprises a separation portion comprising first and second separation structures, wherein the first separation structure is disposed between the first dam and the second dam and the second separation structure is disposed between the second dam and the third dam, wherein, preferably, each of the first and second separation structures is implemented in parallel to the first to third dams to one-dimensionally have a closed loop line shape, wherein, further preferably, at least one of the first and second separation structures comprises a metal structure that is electrically coupled to a pixel common voltage line of the light emitting display apparatus.

In some embodiments of the present disclosure, the dam portion comprises one dam, wherein each of the one or more switching circuit portions comprises a first switching circuit and a second switching circuit disposed under the one dam, wherein the one or more metal lines comprise a metal line embedded in the one dam and coupled to the first switching circuit and the second switching circuit in common, wherein, preferably, the first switching circuit and the second switching circuit are controlled by the same switching control signal, wherein, further preferably, the one dam is implemented to one-dimensionally have a closed loop line shape.

In some embodiments of the present disclosure, each of the first and second switching circuits is configured as a thin film transistor comprising a first source/drain electrode, a second source/drain electrode, and a gate electrode, wherein the first source/drain electrode of the first switching circuit is electrically connected to a first data line, the second source/drain electrode of the first switching circuit is electrically connected to a reference voltage line, and the gate electrode of the first switching circuit is electrically connected to the metal line embedded in the one dam, wherein the first source/drain electrode of the second switching circuit is electrically connected to the reference voltage line, the second source/drain electrode of the second switching circuit is electrically connected to a second data line, and the gate electrode of the second switching circuit is electrically connected to the metal line embedded in the one dam.

In some embodiments of the present disclosure, in a test mode of the light emitting display apparatus, the driving circuit part is configured to turn off the first and second switching circuits and to sense a current flowing in the reference voltage line while supplying a test signal to each of the first and second data lines, so as to detect a short circuit defect between one or more of the routing lines connected to the first and second switching circuits.

In some embodiments of the present disclosure, in a test mode of the light emitting display apparatus, the driving circuit part is configured to turn on the first and second switching circuits and to sense a current flowing in the reference voltage line while supplying a test signal to each of the first and second data lines, so as to detect a line resistance of each of data routing lines connected to the first and second data lines, and to compensate a resistance deviation between line resistance values of the data routing lines.

In some embodiments of the present disclosure, the light emitting display apparatus further comprises a separation portion comprising at least one outer separation structure disposed in an outer region of the dam portion and/or at least one inner separation structure disposed in an inner region of the dam portion, wherein, preferably, the at least one outer separation structure and/or the at least one inner separation structure are/is implemented in parallel to the one dam to one-dimensionally have a closed loop line shape.

In some embodiments of the present disclosure, each dam comprises a first dam pattern, a second dam pattern, and a third dam pattern, wherein a portion of the first dam pattern is disposed over the respective switching circuit, the second dam pattern is disposed over the first dam pattern, the metal line embedded in the respective dam is disposed over the second dam pattern, and the third dam pattern is disposed over the metal line to surround the metal line.

In some embodiments of the present disclosure, the dam portion is disposed in a periphery portion of the outermost pixels of the plurality of pixels, wherein, preferably, the dam portion is disposed so as to have a closed loop line shape along the periphery portion of the outermost pixels.

In some embodiments of the present disclosure, each of the one or more switching circuit portions is disposed in a respective one of the outermost pixels.

In some embodiments of the present disclosure, the driving circuit part is further configured to apply, in an image display mode of the light emitting display apparatus, an anti-electrostatic power to the one or more metal lines, wherein, preferably, the anti-electrostatic power is a ground voltage or a pixel common voltage.

In some embodiments of the present disclosure, the light emitting display apparatus has a non-bezel structure, in which the whole front surface of the light emitting display apparatus implements the display portion.

In some embodiments of the present disclosure, the one or more metal lines have a closed loop line shape which is one-dimensionally continued on the substrate without being disconnected.

In some embodiments of the present disclosure, the light emitting display apparatus further comprises: a third pad portion disposed at the rear surface of the light emitting display apparatus and comprising a plurality of third pads; a link line portion disposed at the rear surface of the light emitting display apparatus and comprising a plurality of link lines disposed between the second pad portion and the third pad portion, wherein the plurality of link lines connect the plurality of second pads to the plurality of third pads.

In some embodiments of the present disclosure, the light emitting display apparatus further comprises a front secondary pad portion, a rear secondary pad portion, a secondary routing portion, and a secondary link line portion, wherein the front secondary pad portion comprises a plurality of front secondary pads electrically connected to a metal line of a dam portion disposed at a second periphery portion of the substrate, which is parallel to the periphery portion of the substrate; wherein the rear secondary pad portion is disposed at the rear surface of the light emitting display apparatus to overlap the front secondary pad portion and comprises a plurality of rear secondary pads overlapping the plurality of front secondary pads; wherein the secondary routing portion is disposed to surround a second outer surface of the substrate and includes a plurality of secondary routing lines that are in a one-to-one relationship coupled to each of the plurality of front secondary pads and each of the plurality of rear secondary pads; wherein the secondary link line portion is disposed between the rear secondary pad portion and the third pad portion and comprises a secondary link line electrically coupled to the plurality of rear secondary pads in common and connected to a switching control signal pad disposed at the third pad portion.

A multi-screen display apparatus according to an embodiment of the present disclosure comprises: a plurality of display apparatuses disposed along at least one direction of a first direction and a second direction that is different from the first direction, wherein each of the plurality of display apparatuses comprises the light emitting display apparatus of one or more embodiments described herein.

In some embodiments of the present disclosure, in a first display apparatus and a second display apparatus adjacent along the first direction or/and the second direction, an interval between a center portion of an outermost pixel of the first display apparatus and a center portion of an outermost pixel of the second display apparatus is less than or equal to a pixel pitch, and wherein the pixel pitch is a distance between center portions of pixels adjacent along the first direction or the second direction.

The light emitting display apparatus according to an embodiment of the present disclosure may be applied to all electronic devices including a light emitting display panel. For example, the display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, or the like.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A light emitting display apparatus comprising:
a substrate;
a display portion including a plurality of pixel driving lines disposed over the substrate and a plurality of pixels including a pixel circuit connected to the plurality of pixel driving lines, the pixel circuit being including at least one transistor;
a light emitting device layer including a self-emitting device disposed at the display portion;
a dam portion including at least one dam disposed along a periphery portion of the substrate;
a metal line disposed within the at least one dam;
an encapsulation layer disposed to cover the light emitting device layer, the encapsulation layer including an organic encapsulation layer surrounded on at least four sides by the dam portion;
a plurality of switching circuit portions disposed to overlap the at least one dam and connected to the plurality of pixel driving lines;
a front pad portion including a plurality of front pads disposed at the periphery portion of the substrate and electrically coupled to the plurality of pixel driving lines and the metal line of the at least one dam,
wherein each of the plurality of switching circuit portions includes first and second switching circuits each including a gate electrode,
wherein the gate electrode of each of the first switching circuit and the second switching circuit is electrically and directly coupled to corresponding metal line inside the at least one dam, and
wherein the metal line is configured to receive a switching control signal through the front pad portion in a test mode and a ground voltage through the front pad portion in a normal driving mode.

2. The light emitting display apparatus of claim 1, wherein each of the plurality of switching circuit portions is disposed between the substrate and the at least one dam.

3. The light emitting display apparatus of claim 1, wherein each of the plurality of switching circuit portions is disposed in each of a plurality of outermost pixels disposed at a first periphery portion of the substrate among the plurality of pixels.

4. The light emitting display apparatus of claim 1, wherein the metal line of the at least one dam is electrically connected to at least one of the plurality of front pads.

5. The light emitting display apparatus of claim 1, wherein:
the dam portion comprises first, second and third dams disposed in parallel to surround the display portion, each of the first, second and third dams including a respective metal line,
each of the plurality of switching circuit portions further comprises a third switching circuit, the first switching circuit is disposed to overlap the first dam and the gate electrode thereof is connected to the metal line inside the first dam, the second switching circuit is disposed to overlap the second dam and the gate electrode thereof is connected to the metal line of inside the second dam, and the third switching circuit is disposed to overlap the third dam and comprises a gate electrode connected to the metal line inside the third dam.

6. The light emitting display apparatus of claim 5, wherein:

each of the plurality of switching circuit portions is connected to two of an odd-numbered data line, a reference voltage line, and an even-numbered data line disposed adjacent to one another among the plurality of pixel driving lines, the first switching circuit further comprises a first electrode electrically coupled to the odd-numbered data line and a second electrode electrically coupled to the reference voltage line, the second switching circuit further comprises a first electrode electrically coupled to the even-numbered data line and a second electrode electrically coupled to the reference voltage line, and the third switching circuit further comprises a first electrode electrically coupled to the odd-numbered data line and a second electrode electrically coupled to the even-numbered data line.

7. The light emitting display apparatus of claim 1, wherein:

the dam portion comprises first and second dams disposed in parallel to surround the display portion on at least four sides, each of the first and second dams including a respective metal line, the first switching circuit is disposed to overlap the first dam and the gate electrode thereof is connected to the metal line inside the first dam, the second switching circuit is disposed to overlap the second dam and the gate electrode thereof is connected to the metal line inside the second dam.

8. The light emitting display apparatus of claim 7, wherein:

each of the plurality of switching circuit portions is connected to two of an odd-numbered data line, a reference voltage line, and an even-numbered data line disposed adjacent to one another among the plurality of pixel driving lines, the first switching circuit further comprises a first electrode electrically coupled to the odd-numbered data line and a second electrode electrically coupled to the reference voltage line, and the second switching circuit further comprises a first electrode electrically coupled to the even-numbered data line and a second electrode electrically coupled to the reference voltage line.

9. The light emitting display apparatus of claim 1, wherein:

the dam portion comprises a dam disposed to surround the display portion, the dam including the metal line, the first switching circuit is disposed to overlap the dam and the gate electrode thereof is connected to the metal line inside the dam, and the second switching circuit is disposed in parallel with the first switching circuit to overlap the dam and the gate electrode thereof is connected to the metal line inside the dam.

10. The light emitting display apparatus of claim 9, wherein:

each of the plurality of switching circuit portions is connected to two of an odd-numbered data line, a reference voltage line, and an even-numbered data line disposed adjacent to one another among the plurality of pixel driving lines, the first switching circuit further comprises a first electrode electrically coupled to the odd-numbered data line and a second electrode electrically coupled to the reference voltage line, and the second switching circuit further comprises a first electrode electrically coupled to the even-numbered data line and a second electrode electrically coupled to the reference voltage line.

11. The light emitting display apparatus of claim 1, further comprising a driving circuit part that supplies the ground voltage or the switching control signal to the metal line.

12. The light emitting display apparatus of claim 1, further comprising:

a rear pad portion including a plurality of rear pads respectively overlapping the plurality of front pads;

a link line portion including a plurality of link lines electrically coupled to the plurality of rear pads;

an input pad portion including a plurality of input pads electrically coupled to the plurality of link lines;

a driving circuit part connected to the input pad portion; and a routing portion including a plurality of routing lines respectively and electrically coupled to the plurality of front pads and the plurality of rear pads, the routing portion being adjacent an outer surface of the substrate.

13. The light emitting display apparatus of claim 12, wherein:

each of the plurality of switching circuit portions is selectively connected to an odd-numbered data line, a reference voltage line, and an even-numbered data line arranged adjacent to one another among the plurality of pixel driving lines, and the driving circuit part comprises:

a driving integrated circuit including a data driver including a plurality of signal output circuits outputting a test signal to the odd-numbered data line or the even-numbered data line, and a sensing circuit sensing a current flowing in the reference voltage line through at least one of the first and second switching circuits based on the test signal; and a timing controller providing test data to the driving integrated circuit and setting a bias voltage level input to a bias terminal of each of the plurality of signal output circuits based on sensing data provided from the sensing circuit.

14. The light emitting display apparatus of claim 13, wherein the timing controller:

determines the occurrence or not of a short circuit between two or more of the plurality of routing lines based on the sensing data, or generates a line resistance value of a data routing line connected to a data line among the plurality of routing lines based on the sensing data and sets the bias voltage level based on the generated line resistance value.

15. The light emitting display apparatus of claim 12, further comprising:

a front secondary pad portion including at least one front secondary pad disposed at another periphery portion of the substrate and electrically coupled to the metal line of the at least one dam;

a rear secondary pad portion including at least one rear secondary pad overlapping the at least one front secondary pad; and a secondary link line portion including at least one secondary link line electrically coupled to the at least one front secondary pad and the at least one rear secondary pad, wherein the at least one secondary link line is electrically coupled to at least one of the plurality of input pads.

16. The light emitting display apparatus of claim 1, wherein the at least one dam comprises:

a first dam pattern over the substrate;

a second dam pattern over the first dam pattern; and a third dam pattern over the second dam pattern, and wherein the metal line is between the second dam pattern and the third dam pattern.

17. The light emitting display apparatus of claim 16, wherein the at least one dam further comprises an undercut region disposed between a lateral surface of the first dam pattern and the second dam pattern, and the self-emitting device is disconnected by the undercut region.

18. The light emitting display apparatus of claim 1, further comprising a separation portion including a plurality of separation structures disposed near the at least one dam, wherein each of the plurality of separation structures includes:

a lower structure; and an upper structure disposed over the lower structure to have an eaves structure with respect to the lower structure; and wherein the self-emitting device is disconnected by the eaves structure.

19. The light emitting display apparatus of claim 1, further comprising a separation portion including a plurality of separation structures disposed near the at least one dam, wherein each of the plurality of separation structures includes:

a lower structure;

an upper structure disposed over the lower structure to have an eaves structure with respect to the lower structure;

wherein at least one of the plurality of separation structures further includes a metal structure disposed between the lower structure and the upper structure, wherein the metal structure is disposed over the lower structure to have another eaves structure with respect to the lower structure, and wherein the self-emitting device is disconnected by the metal structure.

20. The light emitting display apparatus of claim 19, wherein:

each of the plurality of separation structures overlaps the plurality of pixel driving lines, and the metal structure is electrically coupled to at least one pixel common voltage line of the plurality of pixel driving lines.

21. The light emitting display apparatus of claim 1, further comprising:

a planarization layer between the substrate and the light emitting device layer;

a passivation layer between the substrate and the planarization layer;

a groove line disposed at an inner region of the dam portion and extending completely through the planarization layer and the passivation layer at the inner region of the dam portion; and an undercut region disposed between a lateral surface of the passivation layer adjacent to the groove line and a lateral surface of the planarization layer adjacent to the groove line, wherein portions of the self-emitting device disposed over the groove line and the lateral surface of the planarization layer are isolated from each other by the undercut region.

22. A multi-screen display apparatus comprising:

a plurality of display apparatuses disposed along at least one direction of a first direction and a second direction crossing the first direction, wherein each of the plurality of display apparatuses includes a light emitting display apparatus having:

a substrate;

a display portion including a plurality of pixel driving lines disposed over the substrate and a plurality of pixels including a pixel circuit connected to the plurality of pixel driving lines, the pixel circuit being including at least one transistor;

a light emitting device layer including a self-emitting device disposed at the display portion;

a dam portion including at least one dam disposed along a periphery portion of the substrate;

a metal line disposed within the at least one dam;

an encapsulation layer disposed to cover the light emitting device layer, the encapsulation layer including an organic encapsulation layer surrounded on at least four sides by the dam portion;

a plurality of switching circuit portions disposed to overlap the at least one dam and connected to the plurality of pixel driving lines; and a front pad portion including a plurality of front pads disposed at the periphery portion of the substrate and electrically coupled to the plurality of pixel driving lines and corresponding metal line inside the at least one dam, wherein each of the plurality of switching circuit portions includes first and second switching circuits each including a gate electrode electrically and directly coupled to the metal line inside the at least one dam, and wherein the metal line is configured to receive a switching control signal through the front pad portion in a test mode and a ground voltage through the front pad portion in a normal driving mode.

23. The multi-screen display apparatus of claim 22, wherein in the light emitting display apparatus of each of the plurality of display apparatuses, the plurality of pixels are arranged over the substrate along the first direction and the second direction, wherein in a first display apparatus and a second display apparatus adjacent along at least one of the first direction and the second direction of the plurality of display apparatuses, a distance between a center portion of an outermost pixel of the first display apparatus and a center portion of an outermost pixel of the second display apparatus is less than or equal to a pixel pitch, and wherein the pixel pitch is a distance between center portions of two pixels that are adjacent to each other.

24. A display apparatus, comprising:

a substrate;

a first pixel driving line disposed over the substrate;

a second pixel driving line disposed adjacent the first pixel driving line;

a plurality of pixels including a pixel circuit connected to the first and second pixel driving lines, the plurality of pixels being in a display portion of the substrate, and the pixel circuit being including at least one transistor;
a dam portion disposed along a periphery portion of the substrate;
a metal line disposed within the dam portion;
a switching circuit overlapping the dam portion and electrically and directly coupled to the metal line, the first pixel driving line and the second pixel driving line;
a plurality of front pads in a pad portion of the substrate, the dam portion being between the plurality of front pads and the plurality of pixels, the plurality of front pads including:
a first front pad electrically coupled to the first pixel driving line; and
a second front pad electrically coupled to the metal line; and
a driving circuit part that, in operation:
  outputs a test signal to the first pixel driving line;
  generates sensing data by sensing a current flowing in the second pixel driving line through the switching circuit based on the test signal; and
  determines the presence of a short circuit between the first and second pixel driving lines based on the sensing data,
wherein a gate electrode of the switching circuit is electrically and directly coupled to the metal line inside the dam portion, and
wherein the metal line is configured to receive a switching control signal through the second pad portion in a test mode and a ground voltage through the second pad portion in a normal driving mode.

25. The display apparatus of claim 24, further comprising:
a first routing line connected to the first front pad; and
a second routing line connected to a third front pad, the third front pad being connected to the second pixel driving line;
wherein the first and second routing lines are in a routing portion of the substrate;
wherein the short circuit is physically located in at least one of the display portion, the pad portion or the routing portion.

* * * * *

UNITED STATES PATENT AND TRADEMARK OFFICE
CERTIFICATE OF CORRECTION

PATENT NO. : 12,289,973 B2  
APPLICATION NO. : 18/052833  
DATED : April 29, 2025  
INVENTOR(S) : Subin Kim et al.

Page 1 of 1

It is certified that error appears in the above-identified patent and that said Letters Patent is hereby corrected as shown below:

In the Claims

Column 83, Claim 5, Line 6:
"metal line of inside the second dam, and"
Should read:
-- metal line inside the second dam, and --.

Signed and Sealed this
First Day of July, 2025

Coke Morgan Stewart
*Acting Director of the United States Patent and Trademark Office*